(12) United States Patent
Yoshida et al.

(10) Patent No.: US 9,866,194 B2
(45) Date of Patent: Jan. 9, 2018

(54) ELECTRIC POWER TRANSMISSION DEVICE AND ELECTRIC POWER TRANSMISSION METHOD

(71) Applicant: NEC Corporation, Tokyo (JP)

(72) Inventors: Shuhei Yoshida, Tokyo (JP); Masahiro Tanomura, Tokyo (JP)

(73) Assignee: NEC Corporation, Tokyo (JP)

( * ) Notice: Subject to any disclaimer, the term of this patent is extended or adjusted under 35 U.S.C. 154(b) by 248 days.

(21) Appl. No.: 14/441,296

(22) PCT Filed: Nov. 7, 2013

(86) PCT No.: PCT/JP2013/006556
§ 371 (c)(1),
(2) Date: May 7, 2015

(87) PCT Pub. No.: WO2014/073207
PCT Pub. Date: May 15, 2014

(65) Prior Publication Data
US 2015/0311880 A1  Oct. 29, 2015

(30) Foreign Application Priority Data
Nov. 8, 2012  (JP) ................................. 2012-245907

(51) Int. Cl.
*H01F 27/42*    (2006.01)
*H03H 7/38*    (2006.01)
(Continued)

(52) U.S. Cl.
CPC ............... *H03H 7/38* (2013.01); *H01F 38/14* (2013.01); *H02J 5/005* (2013.01); *H02J 7/0042* (2013.01);
(Continued)

(58) Field of Classification Search
CPC .............. G01R 33/3415; G01R 33/288; G01R 33/3628; A61B 5/0035; A61B 5/0037
See application file for complete search history.

(56) References Cited

U.S. PATENT DOCUMENTS 5,301,096 A   4/1994  Klontz et al.
5,341,280 A   8/1994  Divan et al.
(Continued)

FOREIGN PATENT DOCUMENTS

EP    2328253 A2   6/2011
EP    2392553 A1   12/2011
(Continued)

OTHER PUBLICATIONS

International Search Report, Corresponding to PCT/JP2013/006556, dated Dec. 3, 2013, 2 pages.
(Continued)

*Primary Examiner* — Sibin Chen
(74) *Attorney, Agent, or Firm* — Wilmer Cutler Pickering Hale and Dorr LLP

(57) ABSTRACT

An electric power transmission device characterized in that the electric power transmission device includes a power transmitting unit which wirelessly transmits an electric power and a power receiving unit which receives the electric power, the power transmitting unit and the power receiving unit include a coil for electric power transmission and an inclusion unit made of a dielectric material covering the coil for electric power transmission, at least one of the power transmitting unit and the power receiving unit includes an impedance adjustment unit which varies the impedance thereof, and the electric power is transmitted at a resonance frequency determined by an impedance of the power transmitting unit, an impedance of the power receiving unit, and an impedance of the conducting medium.

8 Claims, 45 Drawing Sheets

(51) Int. Cl.
*H01F 38/14* (2006.01)
*H02J 5/00* (2016.01)
*H02J 7/02* (2016.01)
*H02J 50/12* (2016.01)
*H02J 7/00* (2006.01)
*H02J 50/50* (2016.01)

(52) U.S. Cl.
CPC .............. *H02J 7/025* (2013.01); *H02J 50/12* (2016.02); *H02J 50/50* (2016.02)

(56) References Cited

U.S. PATENT DOCUMENTS

| | | | |
|---|---|---|---|
| 6,020,653 A * | 2/2000 | Woodbridge | F03B 13/1865 290/42 |
| 2010/0007214 A1 | 1/2010 | Howard et al. | |
| 2010/0109445 A1 | 5/2010 | Kurs et al. | |
| 2011/0127951 A1 | 6/2011 | Walley et al. | |
| 2011/0278940 A1 | 11/2011 | Krishna et al. | |
| 2012/0187767 A1 | 7/2012 | Kanno et al. | |
| 2013/0260676 A1 * | 10/2013 | Singh | H04B 5/0037 455/41.1 |

FOREIGN PATENT DOCUMENTS

| | | |
|---|---|---|
| JP | H8-505277 A | 6/1996 |
| JP | H8-214473 A | 8/1996 |
| JP | 2002-305121 A | 10/2002 |
| JP | 2011-022640 A | 2/2011 |
| JP | 4772744 B2 | 9/2011 |
| JP | 2012-504387 A | 2/2012 |
| JP | 2012-050321 A | 3/2012 |
| JP | 2012-518382 A | 8/2012 |
| WO | WO-94/09558 A1 | 4/1994 |
| WO | WO-2010-036980 A1 | 4/2010 |
| WO | WO-2012/098881 A1 | 7/2012 |
| WO | WO-2012/113757 A1 | 8/2012 |

OTHER PUBLICATIONS

Japanese Office Action issued by the Japan Patent Office for Japanese Application No. 2014-545576 dated May 23, 2017 (6 pages).

Extended European Search Report issued by the European Patent Office for Application No. 13854130.5 dated Jul. 27, 2016 (5 pages).

* cited by examiner

CAPACITANCE BETWEEN POWER TRANSMITTING UNIT
AND POWER RECEIVING UNIT X DISTANCE BETWEEN POWER
TRANSMITTING UNIT AND POWER RECEIVING UNIT /
(TOTAL CAPACITANCE OF POWER TRANSMITTING UNIT
AND POWER RECEIVING UNIT)

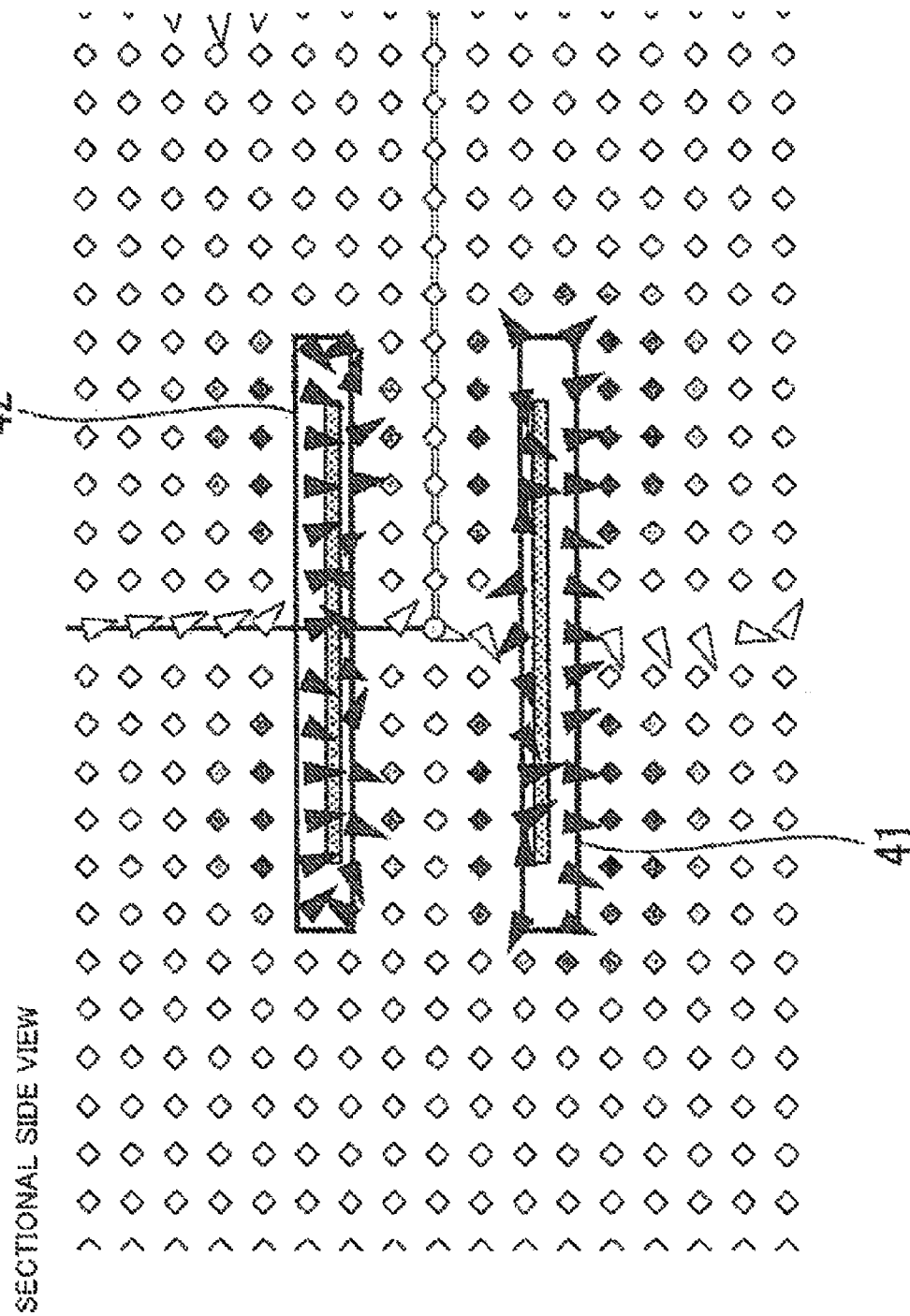

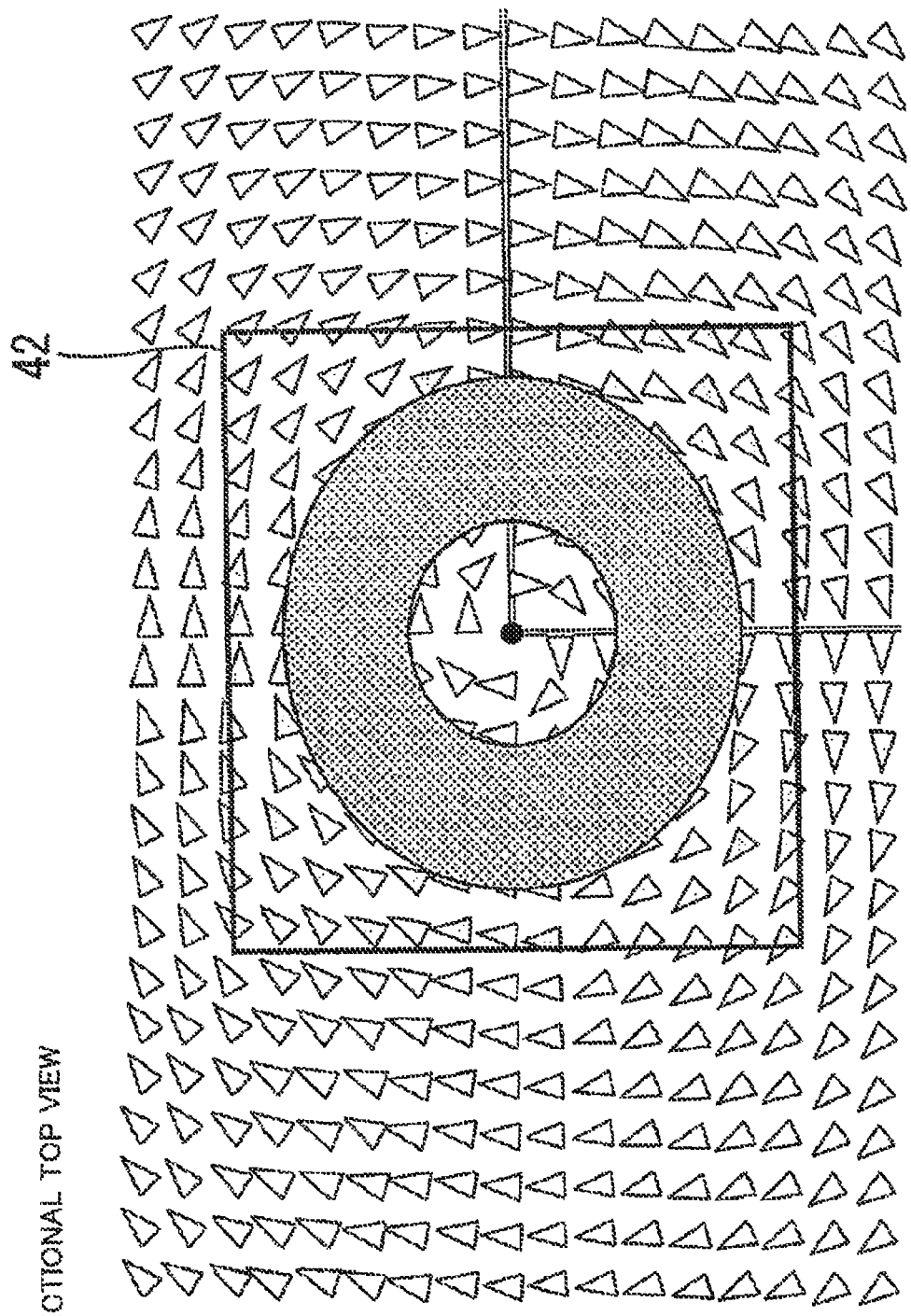

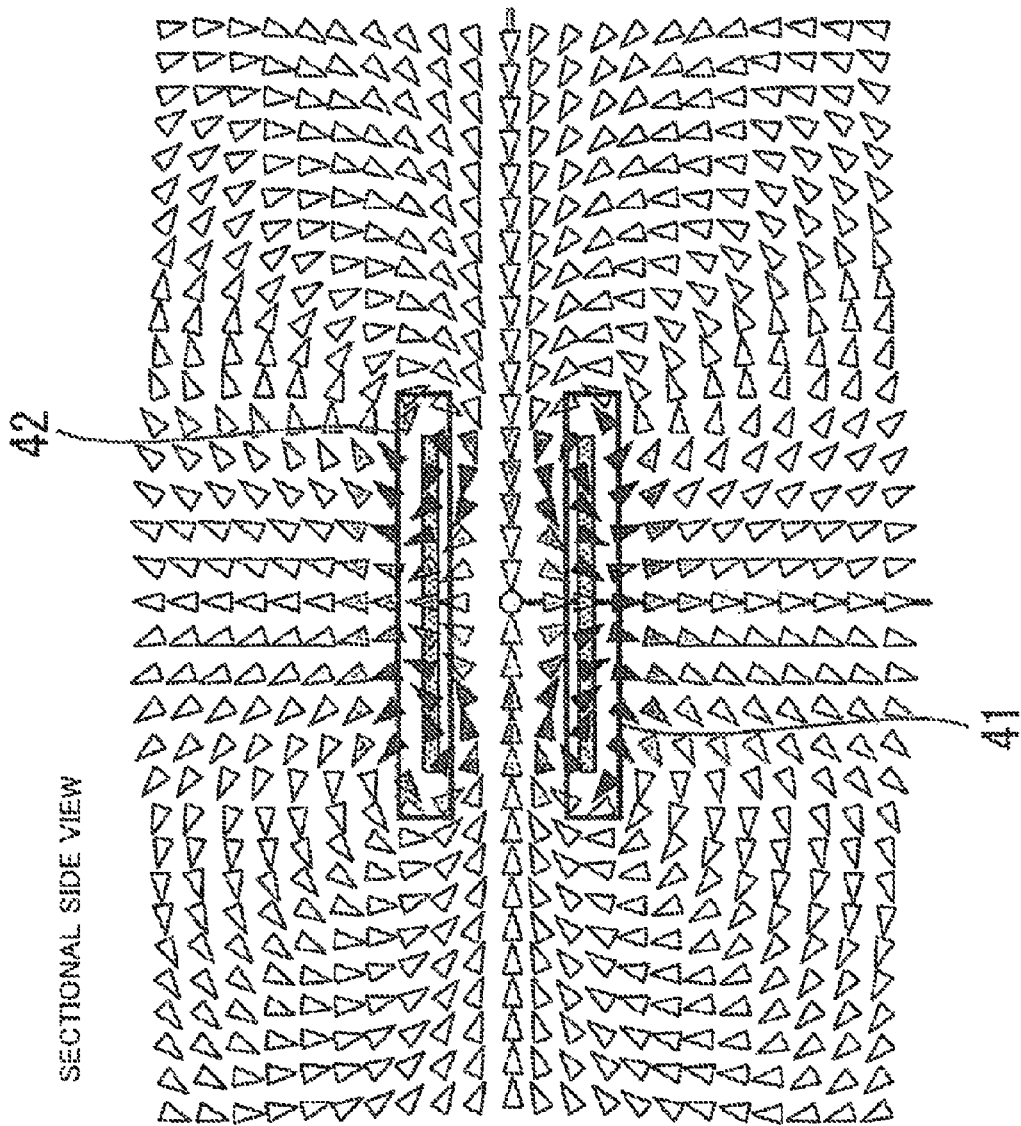

SECTIONAL TOP VIEW

SECTIONAL TOP VIEW

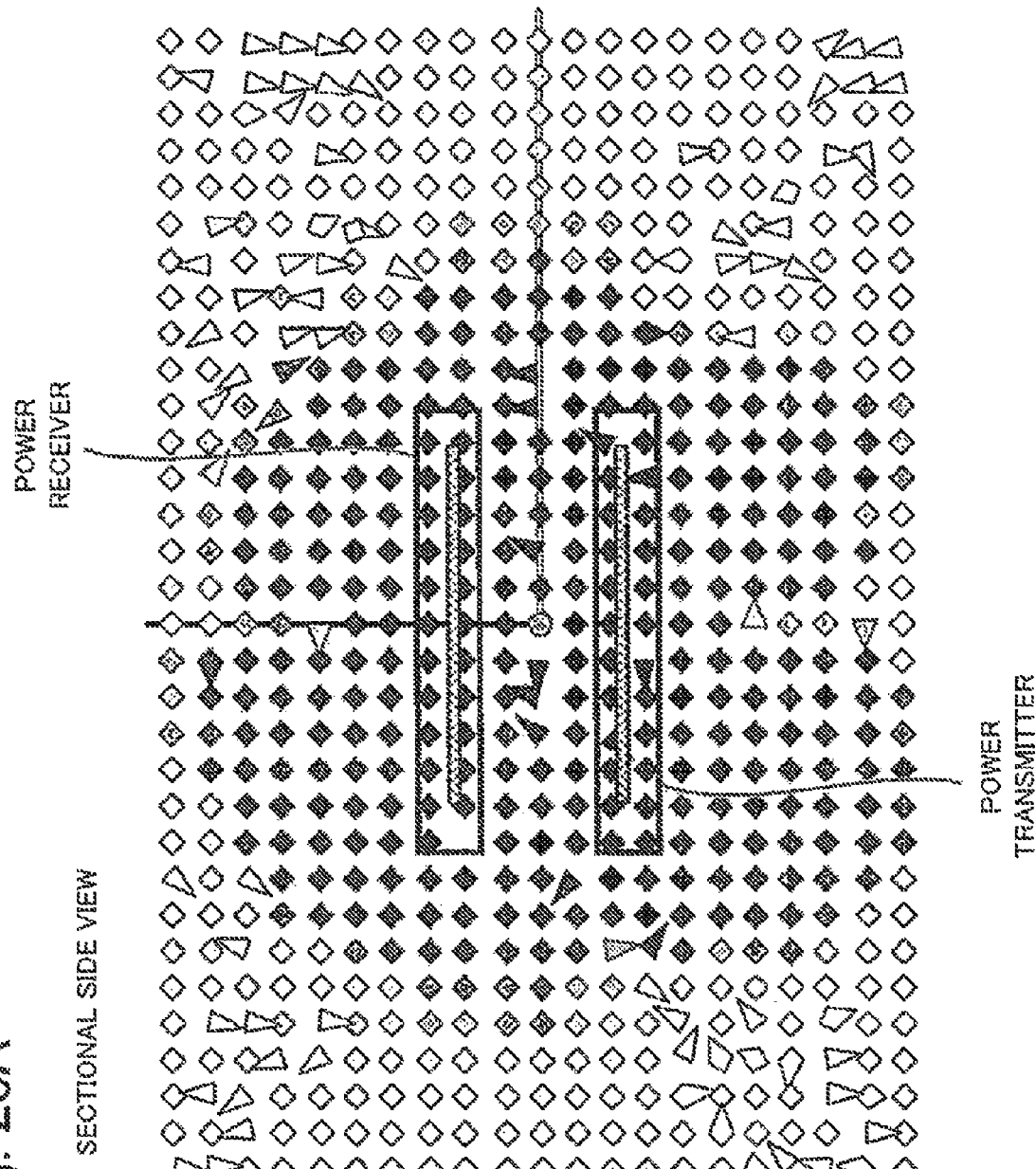

SECTIONAL TOP VIEW
POWER RECEIVER

POWER FEEDING PORT

Fig. 27

|  | ELECTRICAL CONDUCTIVITY (S/m) | RELATIVE PERMITTIVITY |
|---|---|---|
| SEAWATER | APPROX 4 | APPROX 81 |
| RIVER | APPROX $10^{-2} \sim 10^{-1}$ | APPROX 81 |
| FRESH WATER, TAP WATER | APPROX $10^{-3} \sim 10^{-2}$ | APPROX 81 |
| SOIL (WET) | APPROX $10^{-2} \sim 10^{-1}$ | APPROX $3 \sim 6$ |
| CONCRETE | APPROX $10^{-3} \sim 10^{-2}$ | APPROX $5 \sim 10$ |
| SOIL (DRY) | APPROX $10^{-4} \sim 10^{-3}$ | APPROX $3 \sim 6$ |
|  |  |  |
| * AIR | 0 | APPROX 1 |

ELECTRIC POWER TRANSMISSION DEVICE AND ELECTRIC POWER TRANSMISSION METHOD

CROSS-REFERENCE TO RELATED APPLICATIONS

The present application is a national stage application of International Application No. PCT/JP2013/006556 entitled "Electric Power Transmission Device and Electric Power Transmission Method" filed on Nov. 7, 2013, which claims the benefit of priority from Japanese Patent Application No. JP2012-245907, filed on Nov. 8, 2012, the disclosures of which are incorporated herein in their entirety by reference thereto.

TECHNICAL FIELD

The present invention relates to an electric power transmission device in a conducting medium such as seawater or the like and an electric power transmission method.

BACKGROUND ART

In recent years, a device for sea resources exploration and an ocean-bottom earthquake sensor network for early detection of earthquake are widely used and the needs for power supply means for supplying an electric power to these devices increase. These devises operate in seawater. Therefore, if an electric power can be transmitted wirelessly, it is desirable to use the power supplying means using a wireless electric power transmission technology. That is because when a metal plug for electric power supply is used in seawater having an electrical conductivity of approx. 4 S/m, there is a possibility that a short circuit may occur in the metal plug for electric power supply. When the electric power is supplied to the device for sea resources exploration or the ocean-bottom earthquake sensor network mentioned above, at least one of a transmission-side electric power transceiver and a reception-side electric power transceiver is not fixed and floats in seawater or on seawater. Therefore, a distance between the power transceivers has to be approx. 10 cm or more to avoid collision or contact even when accuracy of attitude control of the transmission side device or the reception side device is taken into account. Therefore, it is necessary to keep a distance of approx. 10 cm or more between the transmission side device and the reception side device.

With respect to a technology for wirelessly transmitting and receiving electric power or a system for wirelessly transmitting and receiving electric power, in patent literature 1, a system using an electromagnetic induction phenomenon is described and in patent literature 2, a device using a microwave is disclosed.

However, in recent years, a wireless electric power transmission system using a resonance phenomenon (magnetic field resonance) of a magnetic field energy described in patent literature 3 is proposed. This magnetic field resonance method is a technology in which a coil with high Q value is used, a mutual inductance between a power transmitting unit and a power receiving unit is improved by resonating the coils at the same frequency (resonance frequency), and a transmission distance can be made long. Therefore, the magnetic field resonance method has a feature in which both a long electric power transmission distance and a high electric power transmission efficiency can be realized simultaneously. Further, when a method using a microwave is used, the electric power transmission distance can be made long but the electric power transmission efficiency is remarkably low compared with the resonance method. By an electromagnetic induction method, the electric power transmission efficiency that is approximately equal to that of the resonance method can be realized. However, the electric power transmission distance is remarkable small compared with the resonance method. Therefore, it is expected that the magnetic field resonance method is applied to a mobile object such as an electric vehicle or the like requiring a large electric power or a mobile device as a new charge technology.

CITATION LIST

Patent Literature

[Patent literature 1] Japanese Patent Application Laid-Open No. 2011-022640

[Patent literature 2] Japanese Patent Publication No. 4772744

[Patent literature 3] Japanese Unexamined Patent Application (Translation of PCT Application) Laid-Open No. 2012-504387

[Patent literature 4] Japanese Patent Application Laid-Open No. 2002-305121

SUMMARY OF INVENTION

Technical Problem

However, even when the above-mentioned magnetic field resonance technology is applied, only a low electric power transmission efficiency can be obtained in seawater. This is because the electrical conductivity and the dielectric constant of air are remarkably different from those of seawater. Further, the electrical conductivity of air is 0 S/m and the relative permittivity of air is approx. 1. On the other hand, the electrical conductivity of seawater is approx. 4 S/m and the relative permittivity of seawater is approx. 81.

When an energy is transmitted in air, an energy loss in the atmosphere that is a medium is very small. Therefore, main factors decreasing an electric power supply efficiency are a conductor loss of the coil, a matching loss between the power transmitter and the power receiver, a reflection loss such as a leakage flux or the like, and a radiation loss.

On the other hand, when an energy is transmitted in seawater, because the seawater that is the medium has a higher electrical conductivity than that of the air, the loss occurs when the energy propagates through the medium. This energy loss is caused by the electrical conductivity of seawater and the electric field that occurs in seawater. Namely, an electric potential gradient proportional to a product of the electrical conductivity and the electric field is generated in seawater and whereby, the loss occurs. This loss that occurs in seawater also occurs in the wireless electric power transmission system using the microwave method other than the magnetic field resonance method or the electromagnetic induction method. Accordingly, when the wireless electric power transmission using the microwave method or the electromagnetic induction method is performed in seawater, a higher electric power transmission efficiency and a longer electric power transmission distance than those of the wireless electric power transmission using the magnetic field resonance method cannot be realized like the wireless electric power transmission in the air.

In the wireless electric power transmission using the magnetic field resonance technology, in the atmosphere, the energy transmission can be efficiently performed by only performing a setting so that the resonance frequency of the coil of the power transmitting unit is made equal to that of the coil of the power receiving unit. However, in seawater, because seawater has the relative permittivity of 81 that is a relatively large value, the impedance between the power transmitting unit and the power receiving unit has a large influence and it is difficult to achieve the energy transmission by using only the simple resonance phenomenon of the power transmitting unit and the power receiving unit.

When the electric power is supplied to the device for sea resources exploration, the ocean-bottom earthquake sensor, or the like, at least one of the transmission-side device and the reception-side device is not fixed and floats in seawater or on seawater. Therefore, it is difficult to keep a relative position relation between the power transmitting unit and the power receiving unit in a predetermined state because of the influence of tidal current, buoyancy, or the like. Therefore, the distance between the power transmitting unit and the power receiving unit varies. By this variation, a capacity formed between the power transmitting unit and the power receiving unit in seawater having a relative permittivity of 81 varies and whereby, the resonance frequency is changed and the deviation of impedance matching occurs. This resonance frequency change or the deviation of impedance matching causes a large reduction in the electric power transmission efficiency.

As described above, when an electric power is wirelessly transmitted in seawater, the electric power transmission efficiency is decreased because seawater has an electrical conductivity and a dielectric constant that are higher than those of the air. Specifically, because the electrical conductivity of seawater is high, the energy is lost in seawater. Further, because the dielectric constant of seawater is high, when the relative position between the power transmitting unit and the power receiving unit is changed, the transmission efficiency is decreased. Therefore, it is indispensable to solve these problems in order to put the wireless electric power transmission system used in seawater to practical use. However, a technology to solve these problems is not known. In patent literature 4, a technology with which an electric power can be wirelessly supplied in seawater is disclosed. However, the above-mentioned problem cannot be solved by this technology. Therefore, the sufficient electric power transmission efficiency can be obtained only when the distance is less than 2 cm. Namely, a distance of more than 10 cm that is required for practical use cannot be obtained.

Further, various media shown in a table of FIG. 27 also have a relatively high electrical conductivity and a relatively high relative permittivity. Accordingly, when the wireless electric power transmission is performed through each of such media other than seawater, the similar problem occurs.

The present invention is made in view of the above problem. An object of the present invention is to provide an electric power transmission device by which even when the power transmitting unit is located relatively far from the power receiving unit, an electric power loss due to the diffusion of electromagnetic energy in a conducting medium or the deviation of the resonance frequency and the deviation of impedance matching caused by the relative position deviation between the power transmitting unit and the power receiving unit is suppressed and whereby, the wireless electric power transmission can be performed over a long distance and with a high efficiency in a medium such as seawater or the like that is conductive and high-dielectric.

Solution to Problem

An electric power transmission device of the present invention is characterized in that the electric power transmission device which wirelessly transmits an electric power in a conducting medium includes a power transmitting unit which wirelessly transmits an electric power and a power receiving unit which receives the electric power transmitted from the power transmitting unit, the power transmitting unit and the power receiving unit include an inclusion unit which includes a coil for electric power transmission and a dielectric material covering the coil for electric power transmission, at least one of the power transmitting unit and the power receiving unit includes an impedance adjustment unit which varies the impedance thereof, and the electric power is transmitted at a resonance frequency determined by an impedance of the power transmitting unit, an impedance of the power receiving unit, and an impedance of the conducting medium.

An electric power transmission method of the present invention is characterized in that in the electric power transmission method in which an electric power is wirelessly transmitted in a conducting medium by a power transmitting unit and a power receiving unit, each of which includes a coil for electric power transmission covered by a dielectric material, the power transmitting unit wirelessly transmits the electric power, the power receiving unit receives the transmitted electric power, an impedance of at least one of the power transmitting unit and the power receiving unit is compensated, and the electric power is transmitted at a resonance frequency determined by an impedance of the power transmitting unit, an impedance of the power receiving unit, and an impedance of the conducting medium.

Advantageous Effects of Invention

By using the present invention, even when the power transmitting unit is located relatively far from the power receiving unit, an electric power loss due to the diffusion of electromagnetic energy in the conducting medium or the deviation of the resonance frequency and the deviation of impedance matching caused by the relative position deviation between the power transmitting unit and the power receiving unit is suppressed and whereby, the wireless electric power transmission can be performed over a long distance and with a high efficiency in a medium such as seawater or the like that is conductive and high-dielectric.

BRIEF DESCRIPTION OF DRAWINGS

FIG. 17A is a figure showing an electric field vector in a neighborhood of a power transmitting unit and a power receiving unit in a first example of a third exemplary embodiment of the present invention.

FIG. 17B is a figure showing an electric field vector in a neighborhood of a power transmitting unit and a power receiving unit in a first example of a third exemplary embodiment of the present invention.

FIG. 18A is a figure showing a magnetic field vector in a neighborhood of a power transmitting unit and a power receiving unit in a first example of a third exemplary embodiment of the present invention.

FIG. 20A is a figure showing the Poynting vector in the atmosphere in a first example of a third exemplary embodiment of the present invention.

FIG. 27 is a table in which electrical conductivity and relative permittivity of various media are listed.

DESCRIPTION OF EMBODIMENTS

An exemplary embodiment of the present invention will be described in detail below with reference to the drawings. Although in the exemplary embodiment described below, various preferable technical limitations to carry out the present invention are added, a scope of the invention is not limited to the embodiment or illustrated examples.

First Exemplary Embodiment

Figure 1:
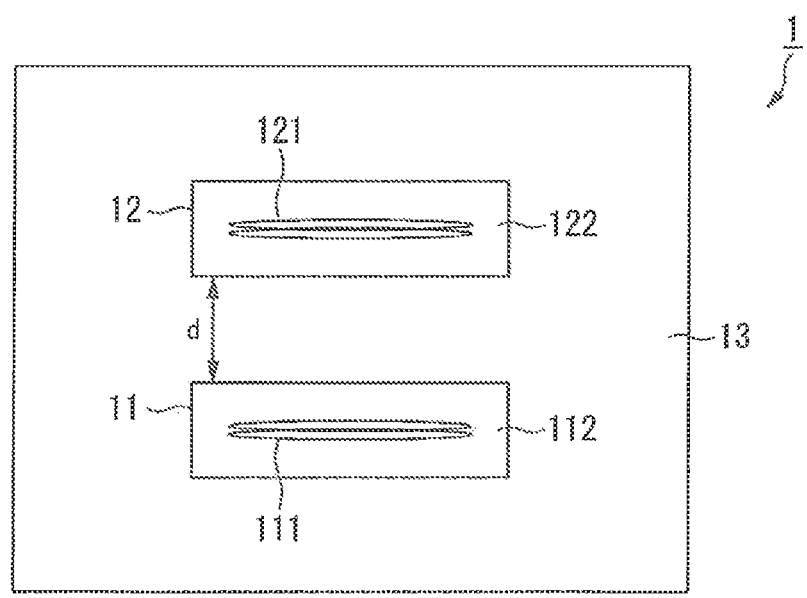
FIG. 1 is a figure showing a configuration of an electric power transmission device according to a first exemplary embodiment of the present invention.

An electric power transmission device according to a first exemplary embodiment of the present invention will be described below with reference to the drawings. FIG. 1 is a figure showing a configuration of the electric power transmission device according to this exemplary embodiment.

In FIG. 1, an electric power transmission device 1 includes a power transmitting unit 11 and a power receiving unit 12. The power transmitting unit 11 and the power receiving unit 12 are covered with a conducting medium 13. The power transmitting unit 11 is equipped with a power transmission coil 111 and a power transmitting side inclusion unit 112 formed of a dielectric material covering the power transmission coil 111. The power receiving unit 12 is equipped with a power reception coil 121 and a power receiving side inclusion unit 122 like the power transmitting unit 11. The power transmission coil 111 and the power reception coil 121 are formed by winding a plurality of turns of a conductor such as a copper wire or the like. Generally, a helical coil, a spiral coil, or the like is used for the power transmission coil 111 and the power reception coil 121. However, the power transmission coil 111 and the power reception coil 121 are not limited to these coils in the exemplary embodiment.

Further, in this specification, the power transmitting unit and the power receiving unit in the electric power transmission device are collectively called an electric power transmission unit. The power transmission coil and the power reception coil are collectively called a coil for electric power transmission. Here, the power transmitting unit may have a function of the power receiving unit and the power receiving unit may have a function of the power transmitting unit. The power transmitting unit and the power receiving unit may have a same structure as each other.

The power transmitting side inclusion unit 112 and the power receiving side inclusion unit 122 are formed of a dielectric material whose relative permittivity is approx. 2 to 10 and whose dielectric loss tangent is equal to or less than 0.01, such as polyethylene, polyimide, polyamide, fluoroplastic, acrylic, or the like.

In this specification, although it is assumed in the explanation that the conducting medium described in each exemplary embodiment is seawater, in the present invention, the conducting medium is not limited to seawater. As an example, the conducting medium may be a material whose electrical conductivity is equal to or greater than $1 \times 10^{-4}$ S/m and whose relative permittivity is greater than 1, such as a river, fresh water, tap water, soil, or concrete shown in a table of FIG. 27.

Figure 2:
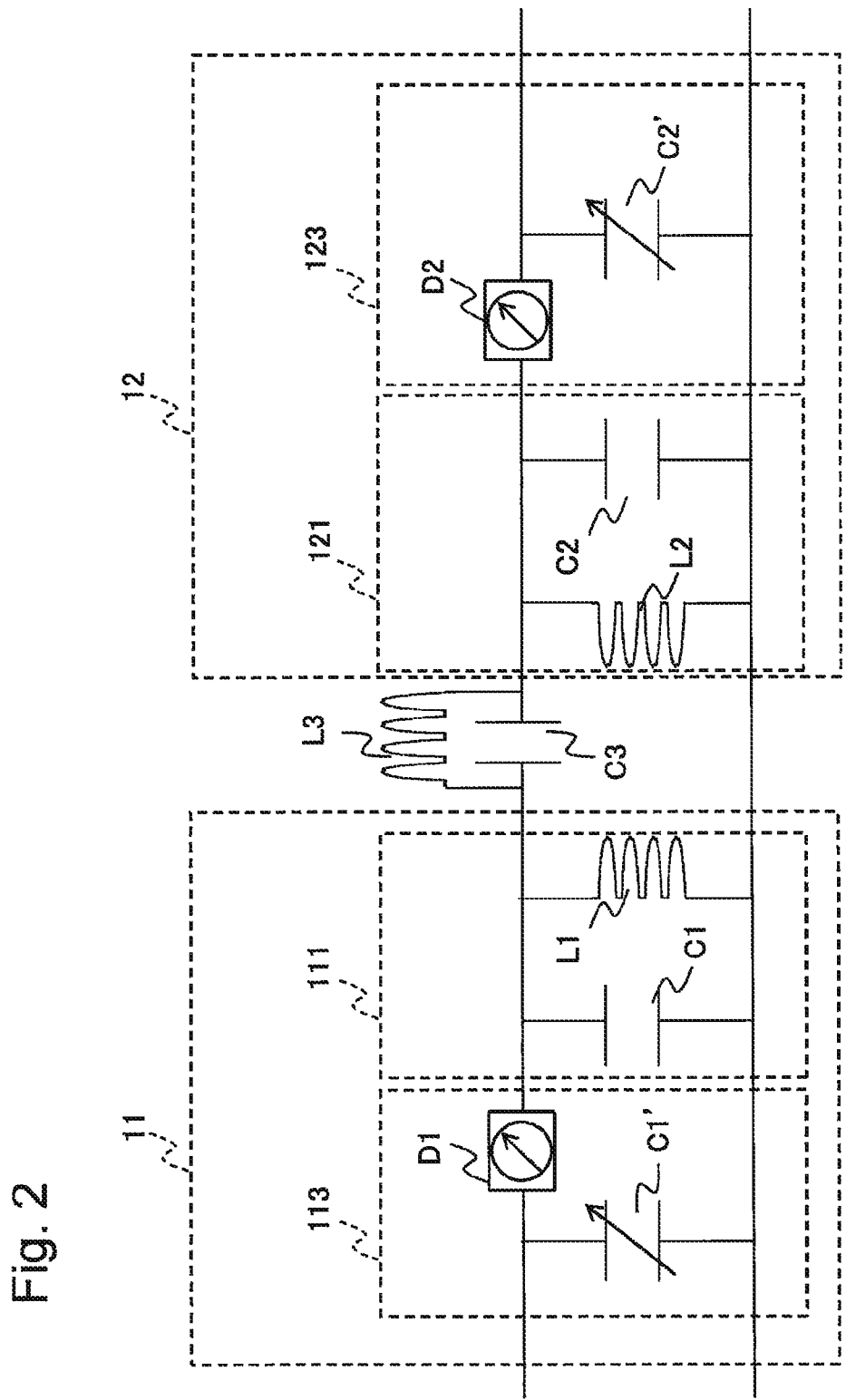
FIG. 2 is an equivalent circuit diagram of a wireless electric power transmission system in which the wireless electric power is transmitted from a power transmitting unit to a power receiving unit by an electric power transmission device according to a first exemplary embodiment of the present invention.

Here, an equivalent circuit showing a circuit through which a wireless electric power transmitted from the power transmitting unit 11 propagates to the power receiving unit 12 is shown in FIG. 2. FIG. 2 is an equivalent circuit diagram of a wireless electric power transmission system in which the wireless electric power is transmitted from the power transmitting unit 11 to the power receiving unit 12.

The power transmitting unit 11 and the power receiving unit 12 further include a power transmitting side impedance adjustment unit 113 which adjusts the impedance of the power transmission coil 111 and a power receiving side impedance adjustment unit 123 which adjusts the impedance of the power reception coil 121, respectively. Here, the impedance of the power transmission coil 111 in the power transmitting unit 11 has an inductive component (inductance component) L1 and a capacitive component (capacitive component) C1 mainly and these components are uniquely determined by the shape of the coil, the coil turns, the diameter of the copper wire, and the dielectric constant, the size, and the like of the dielectric material forming the power transmitting side inclusion unit 112. Similarly, the impedance of the power reception coil 121 in the power receiving unit 12 has an inductive component L2 and a capacitive component C2.

Further, in this specification, the power transmitting side impedance adjustment unit and the power receiving side impedance adjustment unit are collectively called an impedance adjustment unit.

An alternating current power supplied to the power transmitting unit 11 propagates to the power receiving unit 12 through the equivalent circuit composed of L1, L2, C1, C2, L3, and C3 mentioned above. Here, L3 is a mutual inductance component of the power transmission coil 111 and the power reception coil 121 and C3 is a capacitive component formed by the power transmitting unit 11, the power receiving unit 12, and the conducting medium 13.

In order to obtain a high transmission efficiency, the impedance has to be matched (resonated) in the propagation path at the frequency of the alternating current power that propagates. Accordingly, as shown in FIG. 2, a capacitive component Cr that is a variable capacitor and a phase shifter D1 are added as the power transmitting side impedance adjustment unit 113 and a capacitive component C2' that is a variable capacitor and a phase shifter D2 are added as the power receiving side impedance adjustment unit 123 and by adjusting Cr, C2', D1, and D2, the impedance matching can be obtained at an arbitrary frequency. Because such configuration is used, even when the relative position relation between the power transmitting unit 11 and the power receiving unit 12 changes during the electric power transmission and whereby, the value of C3 varies, the electric power can be stably supplied by appropriately adjusting Cr, C2', D1, and D2 so as to compensate the change and maintain a resonance state.

A varactor diode (a variable-capacitance diode) can be used as means for varying a capacitance and further, a combination of a plurality of capacitors and switch transistors can be used for the same means. The phase shifters D1 and D2 can be configured with an operational amplifier, a transistor, a diode, a transmission line, a variable capacitor, a variable inductor, or a combination of these components.

Hereinafter, in an explanation, a combined capacitive component composed of the capacitive component of the power transmission coil 111 itself and the capacitive component of the variable capacitor when a phase rotation amount of the phase shifter D1 is 0 degree is newly called as a capacitive component C1. Namely, in the explanation, the capacitive component of the impedance of the power transmitting unit 11 is called the capacitive component C1. Similarly, a combined capacitive component composed of the capacitive component of the power transmission coil 121 itself and the capacitive component of the variable capacitor when a phase rotation amount of the phase shifter D2 is 0 degree is newly called as a capacitive component C2. In the explanation, the capacitive component of the impedance of the power receiving unit 12 is called the capacitive component C2.

In the electric power transmission device 1 according to this exemplary embodiment, when a predetermined condition is satisfied by the values: the value of the capacitive component C1 of the impedance of the power transmitting unit 11, the value of the capacitive component C2 of the impedance of the power receiving unit 12, the value of the capacitive component C3 formed by the power transmitting unit 11, the power receiving unit 12, and the conducting medium 13 which exists between these units, and the value of the distance d between the power transmitting unit and the power receiving unit, the very high electric power transmission efficiency can be obtained.

Figure 3:
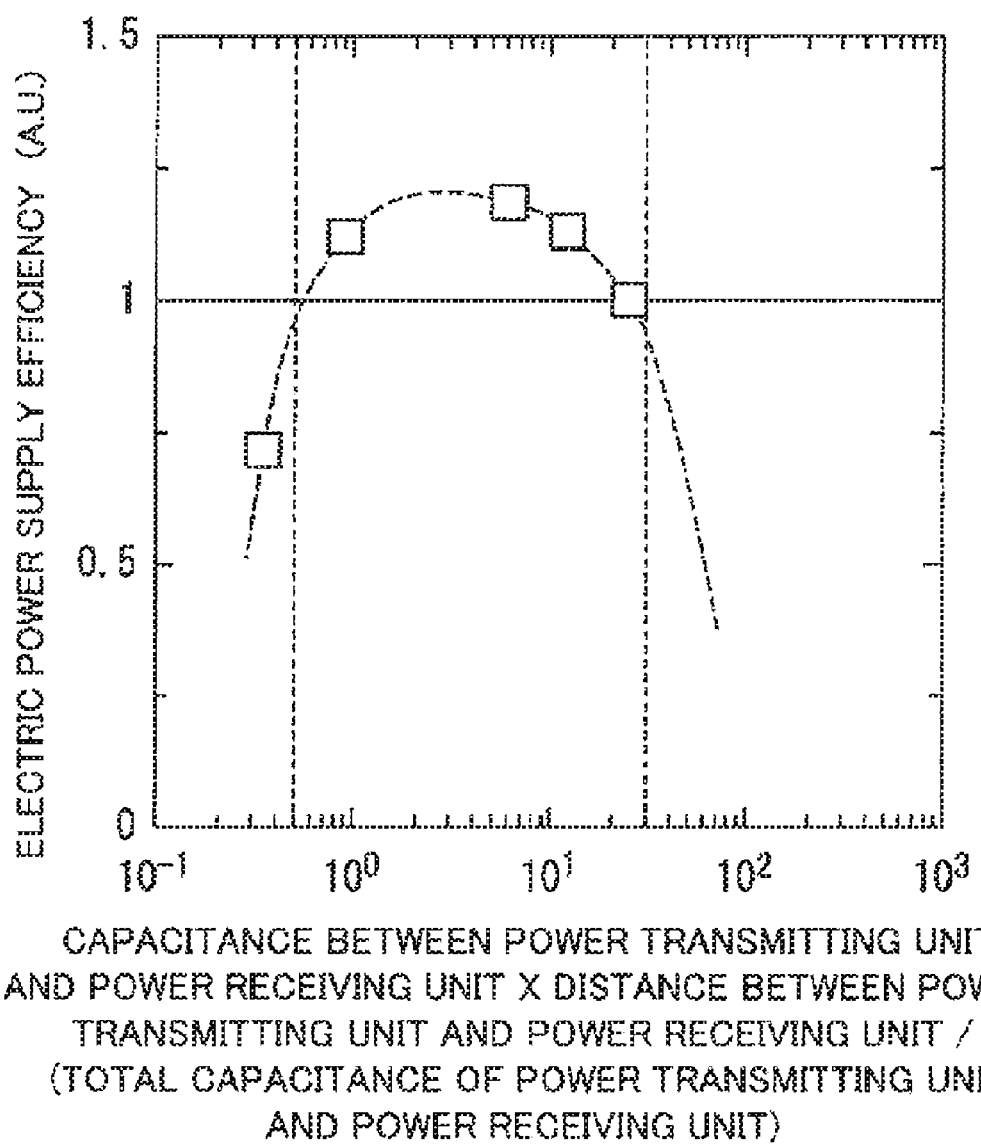
FIG. 3 is a figure showing an influence on an electric power transmission efficiency by capacitive components of the power transmitting unit and the power receiving unit according to a first exemplary embodiment of the present invention and a capacitive component generated between the power transmitting unit and the power receiving unit.

FIG. 3 is a figure showing an influence on the electric power transmission efficiency by the capacitive component of the power transmitting unit 11, the capacitive component of the power receiving unit 12, and the capacitive component formed between the power transmitting unit and the power receiving unit. According to the figure shown in FIG. 3, the very high electric power transmission efficiency can be obtained when the following condition can be satisfied by the values of C1 [pF], C2 [pF], C3 [pF], and d [cm] described above.

$$30 > C3 \times d/(C1+C2) > 0.5 \quad \text{equation (1)}$$

Further, from a result of a three-dimensional electromagnetic field simulation, in this exemplary embodiment, when the areas of the power transmission coil 111 and the power reception coil 121 are approx. 10 cm$^2$ to 30 cm$^2$ and the distance d between the power transmitting unit 11 and the power receiving unit 12 is approx. 5 cm to 30 cm, equation (1) can be satisfied.

Further, in this exemplary embodiment, when a ratio of the size of the power transmission coil 111 to the size of the power transmitting side inclusion unit 112 and a ratio of the size of the power reception coil 121 to the size of the power receiving side inclusion unit 122 satisfy the predetermined condition, the very high electric power transmission efficiency can be obtained.

Figure 4A:
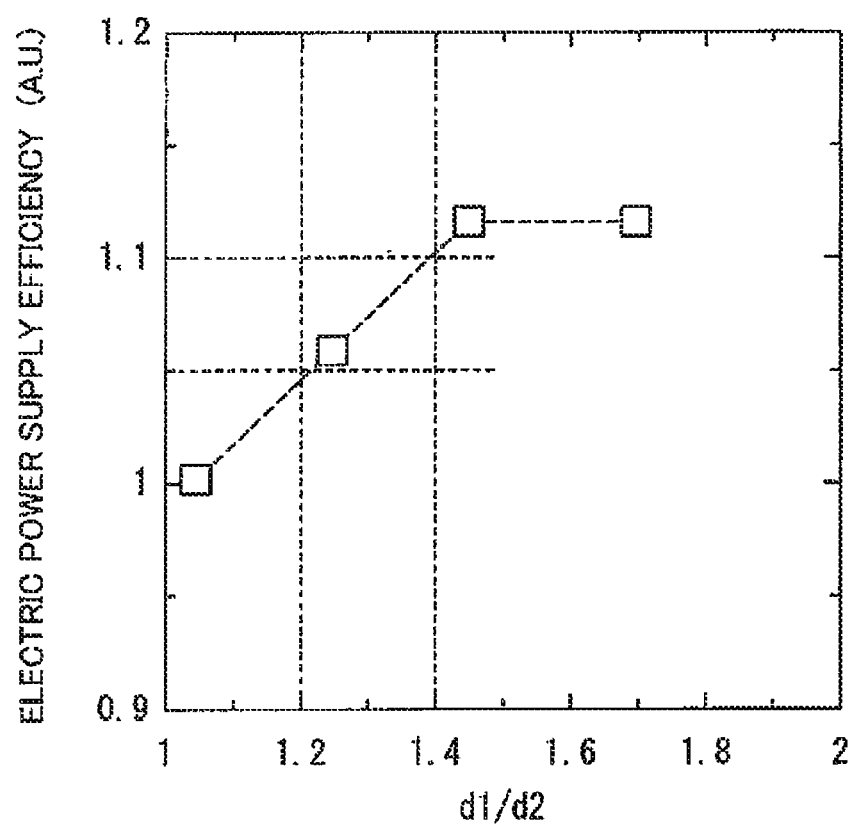
FIG. 4A is a figure showing an influence on an electric power transmission efficiency by a ratio of a diameter of a power transmission coil to a size of a power transmitting side inclusion unit according to a first exemplary embodiment of the present invention.
Figure 4B:
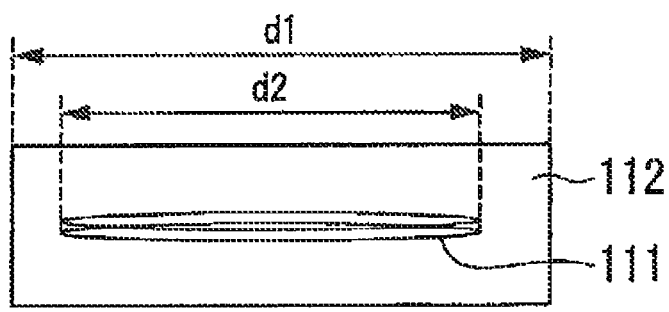
FIG. 4B is a figure showing a ratio of a diameter of a power transmission coil to a size of a power transmitting side inclusion unit according to a first exemplary embodiment of the present invention.

FIG. 4A is a figure showing an influence on the electric power transmission efficiency by a ratio of an outer diameter of the power transmission coil 111 to the size of the power transmitting side inclusion unit 112. According to FIG. 4A, when a ratio d1/d2 is made equal to or greater than 1.2, wherein d1 is the size of the power transmitting side inclusion unit 112 in a direction along a coil surface and d2 is the outer diameter of the power transmission coil 111 (FIG. 4B), the high electric power transmission efficiency that is five or more percentages greater than the efficiency obtained when the ratio d1/d2 is equal to 1 that is a minimum ratio at which the power transmission coil 111 and the power transmitting side inclusion unit 112 can be produced. Further, when the high electric power transmission efficiency of ten or more percentages is required, it is desirable that the size d1 of the power transmitting side inclusion unit 112 and the outer diameter d2 of the power transmission coil 111 are determined so that the value of ratio d1/d2 is equal to or greater than 1.4.

Further, a similar effect can be obtained when the ratio of the outer diameter of the power reception coil 121 to the size of the power receiving side inclusion unit 122 is determined as described above. Further, when both the power transmitting unit 11 and the power receiving unit 12 can satisfy the above-mentioned condition, the higher effect can be obtained.

Next, operation of the electric power transmission device 1 according to this exemplary embodiment will be specifically described in turn below. First, in the power transmitting unit 11, an alternating current power supply (not shown) outputs the alternating current electric power having a predetermined frequency. Next, the outputted alternating current electric power is supplied to the power transmission coil 111 and the power transmission coil 111 transmits the alternating current electric power to the outside (the conducting medium 13) as an electromagnetic energy. Next, the power receiving unit 12 feeds the transmitted electromagnetic energy in the power reception coil 121. Here, the power transmitting side impedance adjustment unit 113 and the power receiving side impedance adjustment unit 123 are adjusted so that a synthetic impedance of an impedance of the power transmitting unit 11, an impedance of the power receiving unit 12, and an impedance of the conducting medium 13 resonates at the frequency of the transmitted electric power. The electric power fed in the power reception coil 121 is supplied to a load (for example, such as a battery or the like) that is an object and the electric power transmission ends.

In the electric power transmission device 1 according to this exemplary embodiment, the synthetic impedance of the impedance of the power transmitting unit 11, the impedance of the power receiving unit 12, and the impedance of the conducting medium 13 resonates at the frequency of the transmitted electric power and whereby, the electric power fed in the power reception coil 121 can be made maximum. Further, the power transmitting side inclusion unit 112 and the power receiving side inclusion unit 122 suppress the expansion of the electric field in the conducting medium 13 and whereby, these units have an effect to suppress the electromagnetic energy which spreads and disappears in the conducting medium 13.

Figure 5:
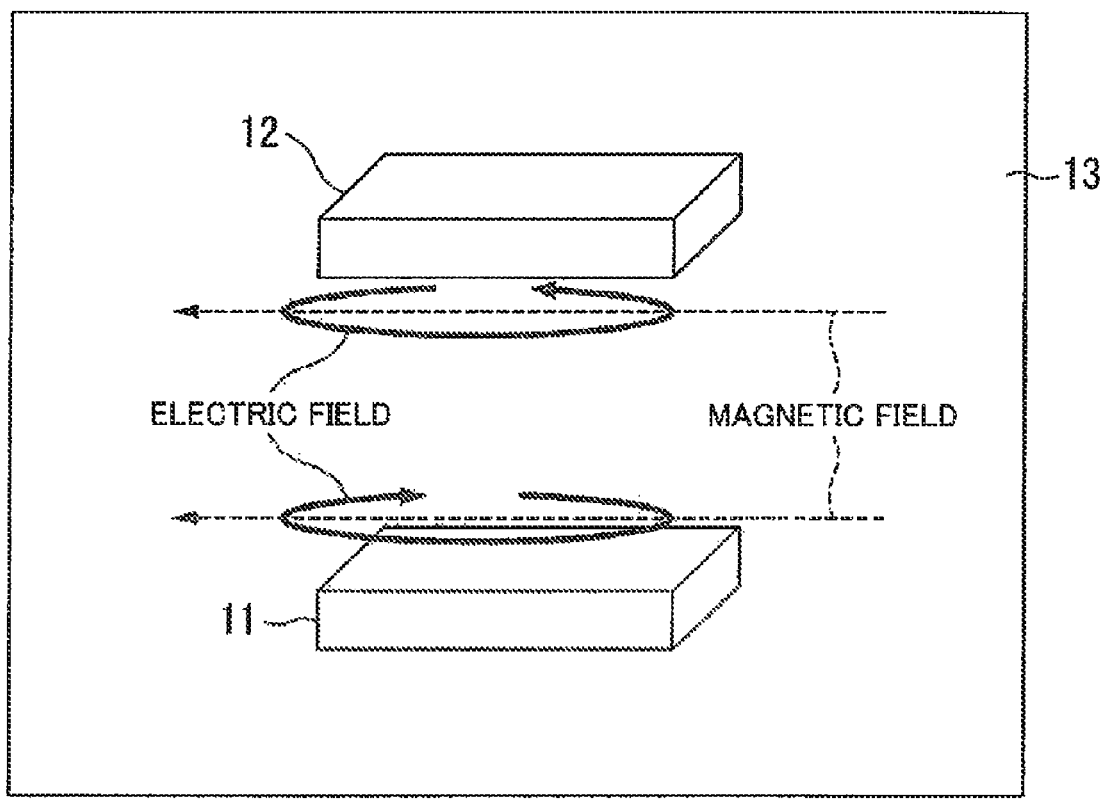
FIG. 5 is a figure showing an electric field vector and a magnetic field vector in an electric power transmission device according to a first exemplary embodiment.
Figure 6:
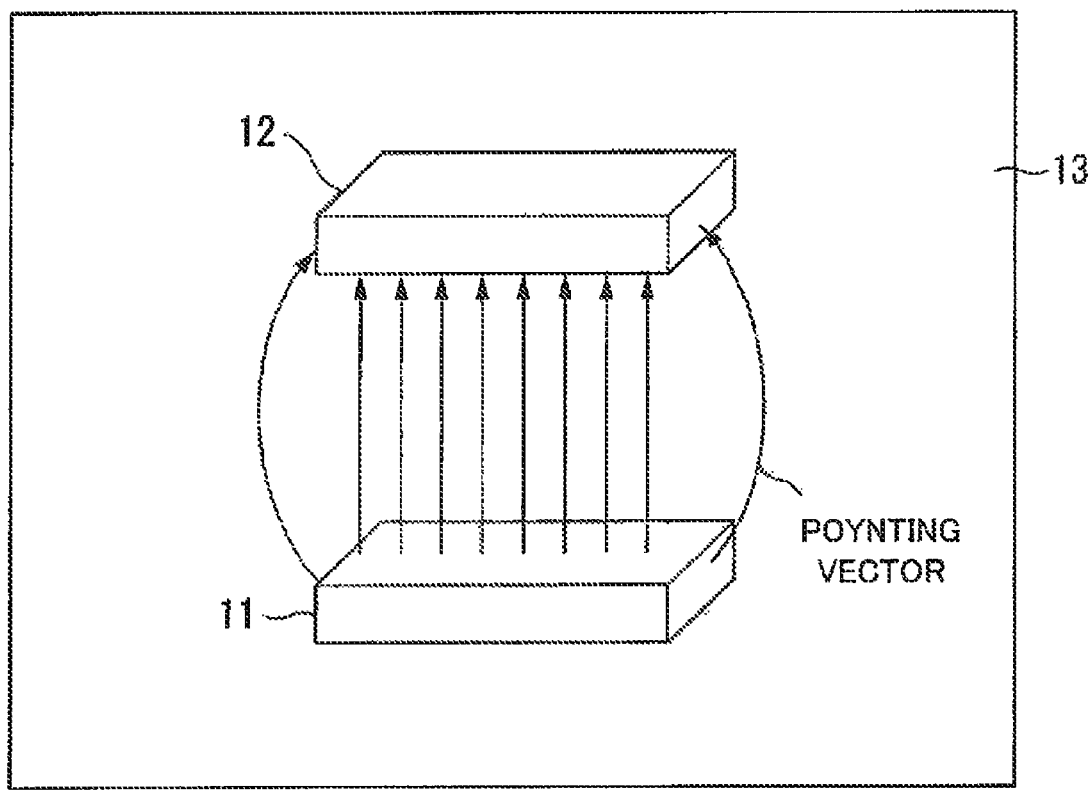
FIG. 6 is a figure showing the Poynting vector (a flow of energy) generated on the basis of an electric field vector and a magnetic field vector in an electric power transmission device according to a first exemplary embodiment.

FIG. 5 is a figure showing the electric field vector and the magnetic field vector in the electric power transmission device 1 according to this exemplary embodiment and FIG. 6 is a figure showing the Poynting vector (a flow of energy) generated on the basis of the electric field vector and the magnetic field vector. Here, FIG. 5 and FIG. 6 schematically show a result obtained by simulating the electric field and the magnetic field generated between the power transmitting unit 11 and the power receiving unit 12 when the electric power is transmitted. As shown in FIG. 5, in the electric power transmission device 1 according to this exemplary embodiment, the electric field and the magnetic field can be generated approximately parallel to the coil surface. As a result, as shown in FIG. 6, the direction of the Poynting vector (the flow of the electromagnetic energy) from the power transmitting unit 11 to the power receiving unit 12 can be made approximately perpendicular to the coil surface.

As described above, the electric power transmission device 1 according to this exemplary embodiment can suppress the electromagnetic energy which spreads and disappears in the conducting medium even when the power transmitting unit 11 is located relatively far from the power receiving unit 12 and can compensate the deviation of the resonance frequency and the deviation of the impedance matching caused by the relative position deviation between the power transceivers in seawater having a high dielectric constant. As a result, the wireless electric power transmission can be performed over a long distance and with a high efficiency in a medium such as seawater or the like that is high-dielectric and conductive.

Second Exemplary Embodiment

Figure 7:
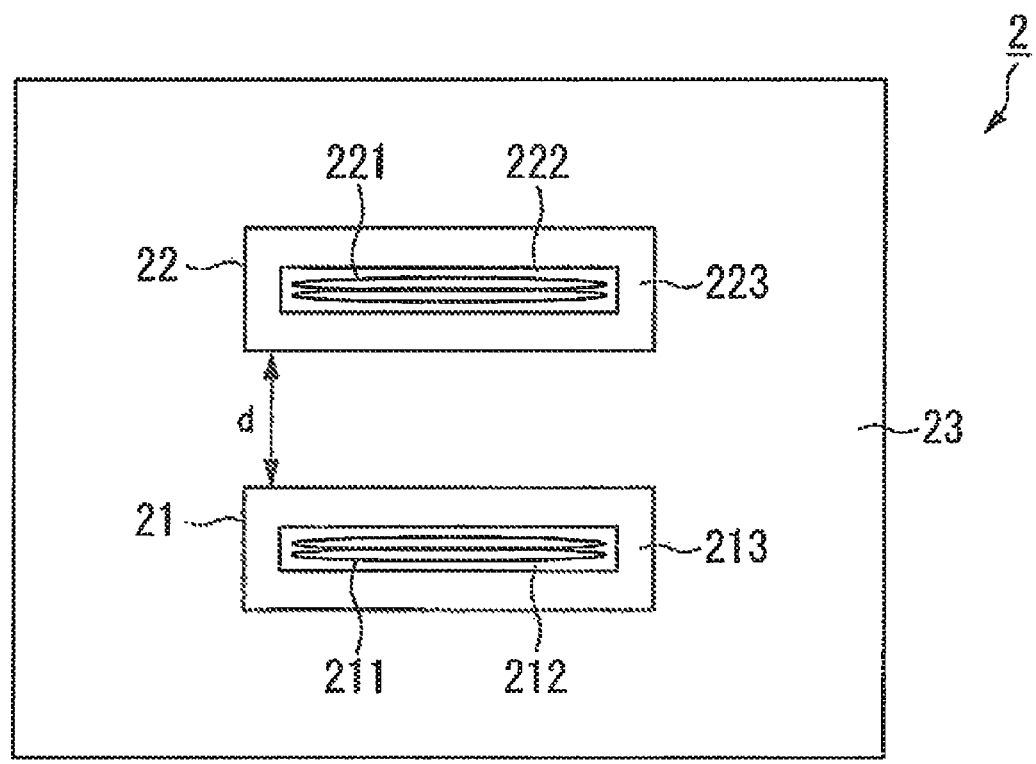
FIG. 7 is a figure showing a configuration of an electric power transmission device according to a second exemplary embodiment of the present invention.

FIG. 7 is a figure showing a configuration of an electric power transmission device according to a second exemplary embodiment of the present invention. Next, the electric power transmission device according to the exemplary embodiment will be described with reference to the drawing.

In FIG. 7, an electric power transmission device 2 includes a power transmitting unit 21 and a power receiving unit 22. Further, the power transmitting unit 21 and the power receiving unit 22 are covered with a conducting medium 23. The power transmitting unit 21 is equipped with a power transmission coil 211, a first power transmitting side inclusion unit 212 formed of a first dielectric material covering the power transmission coil 211, and a second power transmitting side inclusion unit 213 formed of a second dielectric material covering the first power transmitting side inclusion unit 212. Further, the power receiving unit 22 is equipped with a power reception coil 221, a first power receiving side inclusion unit 222, and a second power receiving side inclusion unit 223 like the power transmitting unit 21. Further, in this specification, the first power transmitting side inclusion unit and the first power receiving side inclusion unit are collectively called a first inclusion unit and the second power transmitting side inclusion unit and the second power receiving side inclusion unit are collectively called a second inclusion unit.

The first power transmitting side inclusion unit 212, the second power transmitting side inclusion unit 213, the first power receiving side inclusion unit 222, and the second power receiving side inclusion unit 223 are formed of a dielectric material whose relative permittivity is approx. 2 to 10 and whose dielectric loss tangent is equal to or less than 0.01, such as polyethylene, polyimide, polyamide, fluoroplastic, acrylic, or the like.

Further, in the electric power transmission device 2 according to this exemplary embodiment, the relative permittivity of the first dielectric material forming the first power transmitting side inclusion unit 212 and the relative permittivity of the second dielectric material forming the second power transmitting side inclusion unit 213 may be different from each other or equal to each other. Further, dielectric loss tangent of the first dielectric material forming the first power transmitting side inclusion unit 212 and dielectric loss tangent of the second dielectric material forming the second power transmitting side inclusion unit 213 may be different from each other or equal to each other. The same condition is applied to the first dielectric material forming the first power receiving side inclusion unit 222 and the second dielectric material forming the second power receiving side inclusion unit 223.

In FIG. 7 showing the configuration of the electric power transmission device 2, each of the power transmitting unit 21 and the power receiving unit 22 includes the first inclusion unit and the second inclusion unit. However, in this exemplary embodiment, one of the power transmitting unit 21 and the power receiving unit 22 may include the first inclusion unit and the second inclusion unit.

Further, the electric power transmission device 2 according to this exemplary embodiment includes the impedance adjustment unit described in the first exemplary embodiment.

Here, in the electric power transmission device 2 according to this exemplary embodiment, when the dielectric loss tangent of each of the dielectric materials forming the first power transmitting side inclusion unit 212 and the second power transmitting side inclusion unit 213 satisfies a predetermined condition, the higher electric power transmission efficiency can be obtained.

Figure 8:
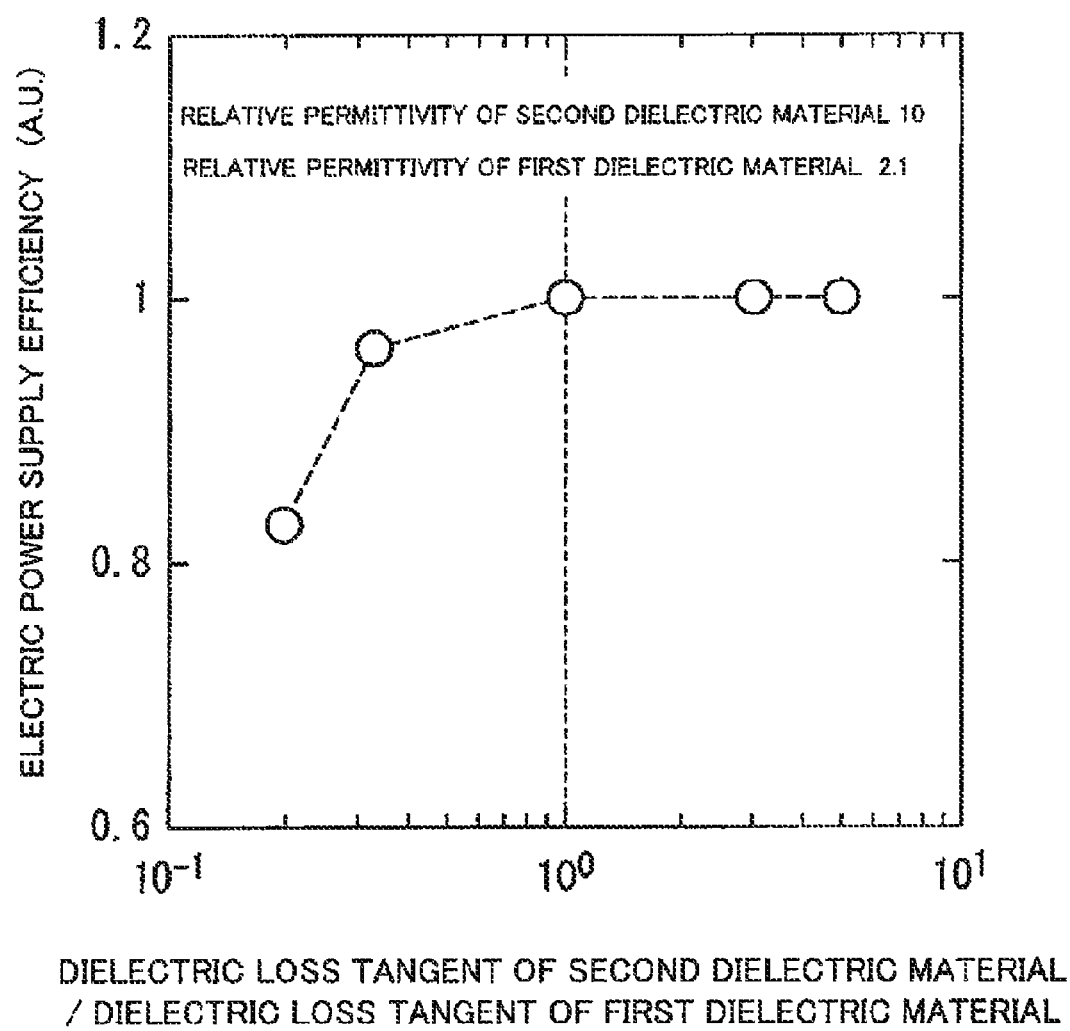
FIG. 8 is a graph showing an influence on an electric power transmission efficiency by a ratio of dielectric loss tangent of a first dielectric material to dielectric loss tangent of a second dielectric material of an electric power transmission device of a second exemplary embodiment of the present invention.

FIG. 8 is a figure showing an influence on the electric power transmission efficiency by a ratio of the dielectric loss tangent of the first dielectric material to the dielectric loss tangent of the second dielectric material. From FIG. 8, it is apparent that when the dielectric loss tangent of the second dielectric material is greater than the dielectric loss tangent of the first dielectric material, the higher electric power transmission efficiency can be obtained. This is because the expansion of the electric field in the conducting medium 23 can be suppressed by the second dielectric material forming the second power transmitting side inclusion unit 213 (the second power receiving side inclusion unit 223) and a dielectric loss in a neighborhood of the power transmission coil 211 (the power reception coil 221) can be reduced by using the first dielectric material having small dielectric loss tangent of which the first power transmitting side inclusion unit 212 (the first power receiving side inclusion unit 222) is composed.

In the electric power transmission device 2 of this exemplary embodiment, when the dielectric constant of each of the dielectric materials forming the first power transmitting side inclusion unit 212 and the second power transmitting side inclusion unit 213 satisfies a predetermined condition, the higher electric power transmission efficiency can be obtained.

Figure 9:
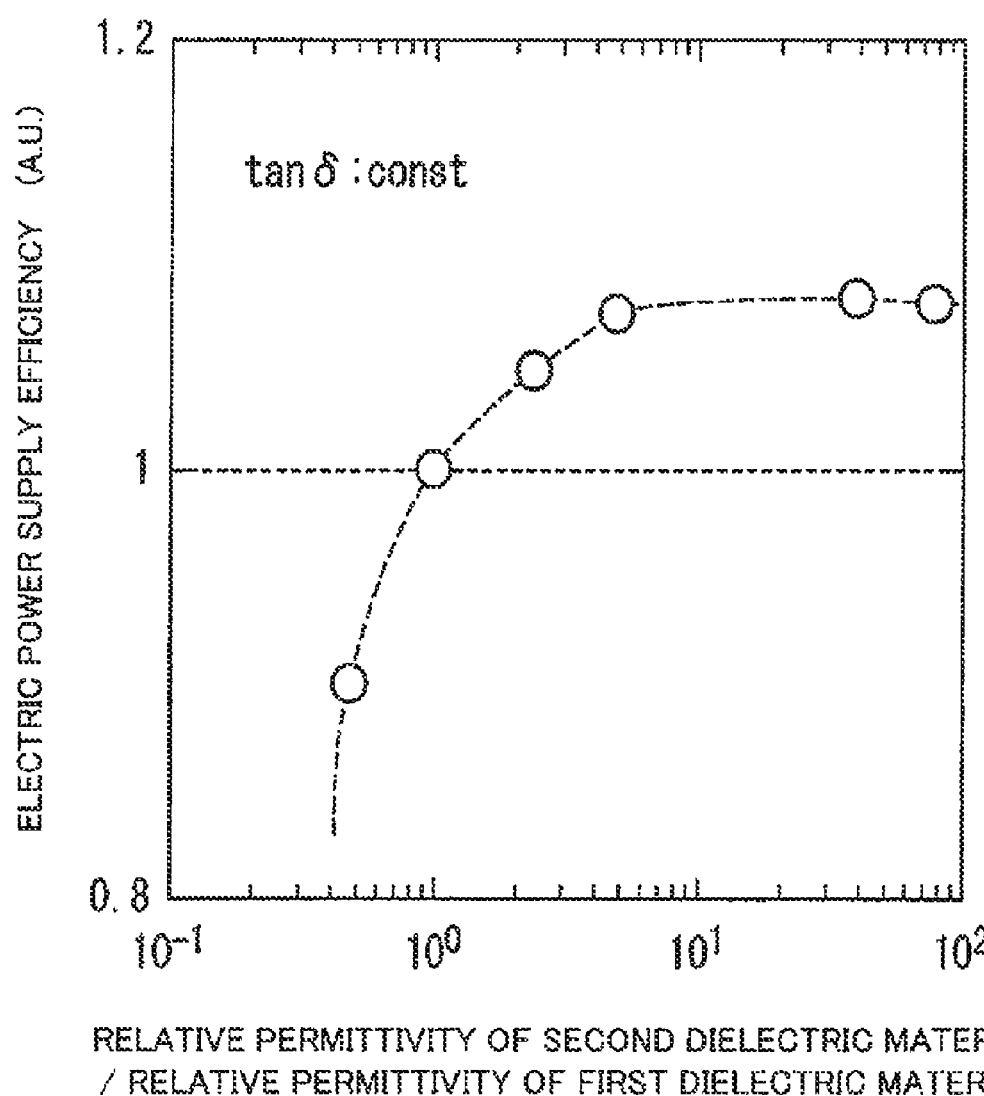
FIG. 9 is a figure showing an influence on an electric power transmission efficiency by a ratio of relative permittivity of a first dielectric material to relative permittivity of a second dielectric material of an electric power transmission device of a second exemplary embodiment of the present invention.

FIG. 9 is a figure showing an influence on the electric power transmission efficiency by the relative permittivity of the first dielectric material and the relative permittivity of the second dielectric material. From FIG. 9, it is apparent that when the relative permittivity of the second dielectric material is greater than the relative permittivity of the first dielectric material, the higher electric power transmission efficiency can be obtained.

Next, operation of the electric power transmission device 2 according to this exemplary embodiment will be specifically described in turn below. First, in the power transmitting unit 21, an alternating current power supply (not shown) outputs the alternating current electric power having a predetermined frequency. Next, the outputted alternating current electric power is supplied to the power transmission coil 211 and the power transmission coil 211 transmits the alternating current electric power to the outside (the conducting medium 23) as an electromagnetic energy. Next, the power receiving unit 22 feeds the transmitted electromagnetic energy in the power reception coil 221. Here, the impedance is adjusted so that the synthetic impedance of the impedance of the power transmitting unit 21, the impedance of the power receiving unit 22, and the impedance of the conducting medium 23 resonates at the frequency of the transmitted electric power and the deviation of the impedance matching is compensated. The electric power fed in the power reception coil 221 is supplied to a load (for example, such as a battery or the like) that is an object and the electric power transmission ends.

In the electric power transmission device 2 according to this exemplary embodiment, when the synthetic impedance of the impedance of the power transmitting unit 21, the impedance of the power receiving unit 22, and the impedance of the conducting medium 23 resonates, the maximum electric power can be fed in the power reception coil 221. Further, the second power transmitting side inclusion unit 213 and the second power receiving side inclusion unit 223 suppress the expansion of the electric field in the conducting medium 23 and whereby, the electromagnetic energy which spreads and disappears in the conducting medium 13 can be suppressed. The first power transmitting side inclusion unit 212 and the first power receiving side inclusion unit 222 can reduce a dielectric loss in a neighborhood of the power transmission coil 211 and the power reception coil 221. The impedance adjustment unit compensates the deviation of the resonance frequency and the deviation of the impedance matching caused by the relative position deviation between the power transceivers in seawater having a high dielectric constant.

As described above, the electric power transmission device 2 according to this exemplary embodiment can obtain the electric power transmission efficiency that is higher than that of the electric power transmission device 1 according to the first exemplary embodiment.

Third Exemplary Embodiment

Figure 10:
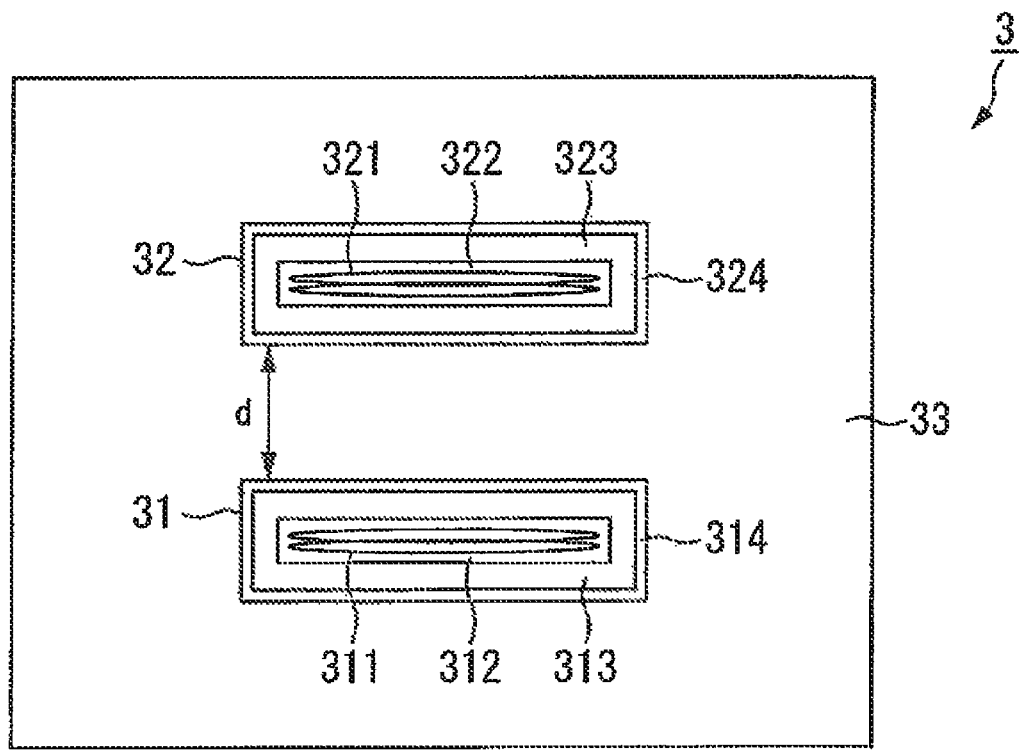
FIG. 10 is a figure showing a configuration of an electric power transmission device according to a third exemplary embodiment of the present invention.

FIG. 10 is a figure showing a configuration of an electric power transmission device according to a third exemplary embodiment of the present invention. Next, the electric power transmission device according to the exemplary embodiment will be described with reference to the drawing.

In FIG. 10, an electric power transmission device 3 includes a power transmitting unit 31 and a power receiving unit 32. Further, the power transmitting unit 31 and the power receiving unit 32 are covered with a conducting medium 33. The power transmitting unit 31 is equipped with a power transmission coil 311, a first power transmitting side inclusion units 312 formed of a first dielectric material covering the power transmission coil 311, a second power transmitting side inclusion unit 313 formed of a second dielectric material covering the first power transmitting side inclusion unit 312, and a third power transmitting side inclusion unit 314 formed of a third dielectric material covering the second power transmitting side inclusion unit 313. Further, the power receiving unit 32 is equipped with a power reception coil 321, a first power receiving side inclusion unit 322, a second power receiving side inclusion unit 323, and a third power receiving side inclusion unit 324 like the power transmitting unit 31. Further, in this specification, the third power transmitting side inclusion unit and the third power receiving side inclusion unit are collectively called a covering unit.

The first power transmitting side inclusion unit 312, the third power transmitting side inclusion unit 314, the first power receiving side inclusion unit 322, and the third power receiving side inclusion unit 324 are formed of a dielectric material whose relative permittivity is approx. 2 to 10 and whose dielectric loss tangent is equal to or less than 0.01, such as polyethylene, polyimide, polyamide, fluoroplastic, acrylic, or the like.

Further, the second power transmitting side inclusion unit 313 and the second power receiving side inclusion unit 323 are formed of a liquid whose specific gravity is equal to that of the conducting medium 33 (seawater) and whose electrical conductivity is low (for example, deionized water or distilled water). Because the second power transmitting side inclusion unit 313 and the second power receiving side inclusion unit 323 are formed as described above, the second power transmitting side inclusion unit 313 and the second power receiving side inclusion unit 323 can achieve neutral buoyancy which allows them to float in the conducting medium 33 (seawater). When the second power transmitting side inclusion unit 313 or the second power receiving side inclusion unit 323 can achieve neutral buoyancy, for example, it is not necessary to provide a special mechanism for adjusting the specific gravity in order to sink or float the electric power transmission device 3 in seawater. Therefore, the cost can be reduced. The third power transmitting side inclusion unit 314 and the third power receiving side inclusion unit 324 formed of the third dielectric material physically confine the second power transmitting side inclusion unit 313 and the second power receiving side inclusion unit 323 that are liquid, respectively.

In the electric power transmission device 3 according to this exemplary embodiment, the relative permittivity of the first dielectric material forming the first power transmitting side inclusion unit 312, the relative permittivity of the second dielectric material forming the second power transmitting side inclusion unit 313, and the relative permittivity of the third dielectric material forming the third power transmitting side inclusion unit 314 may be different from each other or equal to each other. Further, the dielectric loss tangent of the first dielectric material forming the first power transmitting side inclusion unit 312, the dielectric loss tangent of the second dielectric material forming the second power transmitting side inclusion unit 313, and the dielectric loss tangent of the third dielectric material forming the third power transmitting side inclusion unit 314 may be different from each other or equal to each other. The same condition can be applied to the first dielectric material forming the first power receiving side inclusion unit 322, the second dielectric material forming the second power receiving side inclusion unit 323, and the third dielectric material forming the third power receiving side inclusion unit 324.

In FIG. 10 showing the configuration of the electric power transmission device 3, each of the power transmitting unit 31 and the power receiving unit 32 includes the first inclusion unit, the second inclusion unit, and the third inclusion unit. However, in this exemplary embodiment, either the power transmitting unit 31 or the power receiving unit 32 may include the first inclusion unit, the second inclusion unit, and the third inclusion unit.

Further, the electric power transmission device 3 according to this exemplary embodiment includes the impedance adjustment unit described in the first exemplary embodiment.

Next, operation of the electric power transmission device 3 according to this exemplary embodiment will be specifically described in turn. First, in the power transmitting unit 31, the alternating current power supply (not shown) outputs the alternating current electric power having a predetermined frequency. Next, the outputted alternating current electric power is supplied to the power transmission coil 311 and the power transmission coil 311 transmits the alternating current electric power to the outside (the conducting medium 33) as an electromagnetic energy. Next, the power receiving unit 32 feeds the transmitted electromagnetic energy in the power reception coil 321. Here, the synthetic impedance of the impedance of the power transmitting unit 31, the impedance of the power receiving unit 32, and the impedance of the conducting medium 33 is adjusted so as to resonate at the frequency of the transmitted electric power. The deviation of the resonance frequency and the deviation of the impedance matching caused by a relative position deviation between the power transceivers in seawater having a high dielectric constant are compensated by the impedance adjustment unit.

In the electric power transmission device 3 according to this exemplary embodiment, when the synthetic impedance of the impedance of the power transmitting unit 31, the impedance of the power receiving unit 32, and the impedance of the conducting medium 33 resonates, the maximum electric power can be fed in the power reception coil 321. Further, the second power transmitting side inclusion unit 313 and the second power receiving side inclusion unit 323 suppress the expansion of the electric field in the conducting medium 33 and whereby, the electromagnetic energy which spreads and disappears in the conducting medium 33 can be suppressed to minimum. The first power transmitting side inclusion unit 312 and the first power receiving side inclusion unit 322 can reduce a dielectric loss in a neighborhood of the power transmission coil 311 and the power reception coil 321. Further, the first power transmitting side inclusion unit 312 and the first power receiving side inclusion unit 322 can suppress reduction in electric power transmission efficiency due to the deviation of the resonance frequency and the deviation of the impedance matching caused by a relative position deviation between the power transceivers in seawater having a high dielectric constant.

Further, because the electric power transmission device 3 according to this exemplary embodiment includes the third power transmitting side inclusion unit 314 and the third power receiving side inclusion unit 324, a liquid (for example, deionized water or distilled water) whose specific gravity is equal to that of the conducting medium 33 (seawater) and whose electrical conductivity is low can be used for the second power transmitting side inclusion unit 313 and the second power receiving side inclusion unit 323. Accordingly, in the power transmitting unit 31 and the power receiving unit 32, the second power transmitting side inclusion unit 313 and the second power receiving side inclusion unit 323 can achieve neutral buoyancy.

As described above, because it is not necessary to provide a special mechanism for adjusting neutral buoyancy in the electric power transmission device 3 according to this exemplary embodiment, the cost of the electric power transmission device 3 is smaller than that of the electric power transmission device 1 according to the first exemplary embodiment or the electric power transmission device 2 according to the second exemplary embodiment.

Example 1

Figure 11:
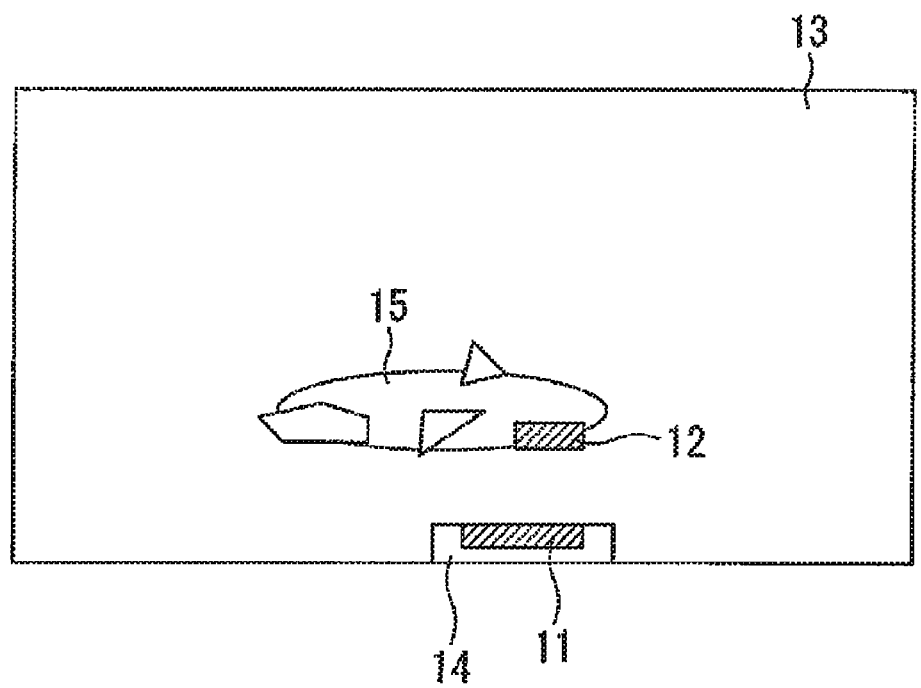
FIG. 11 is a figure showing a first example of a first exemplary embodiment of the present invention.

Next, FIG. 11 shows a first example of the first exemplary embodiment. In FIG. 11, the power transmitting unit 11 of the electric power transmission device 1 is provided in an electric power supply source 14 and the power receiving unit 12 is provided in a submersible vessel 15. By using the present invention, even when the relative position relation between the electric power supply source 14 and the submersible vessel 15 varies by influence of tidal current, an electric power can be stably supplied.

Example 2

Figure 12:
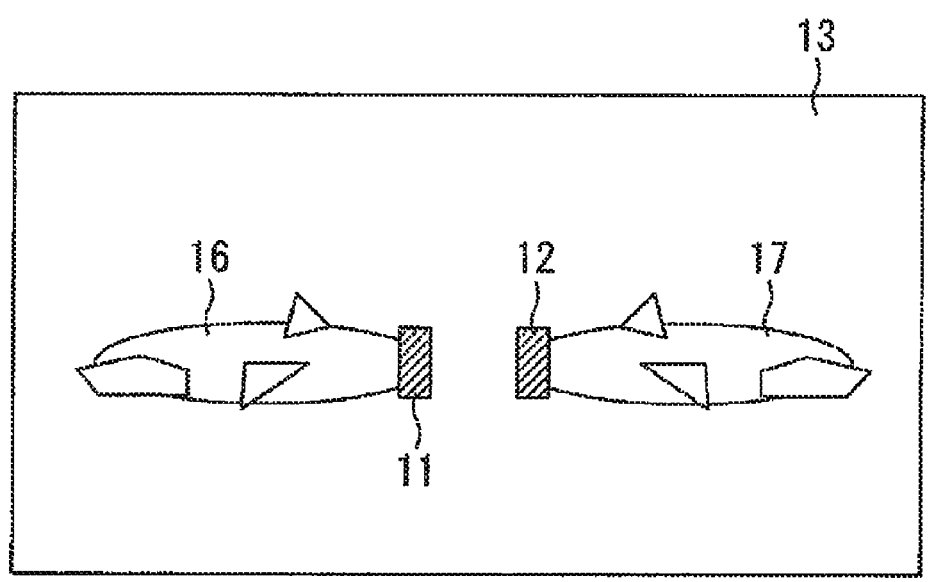
FIG. 12 is a figure showing a second example of a first exemplary embodiment of the present invention.

FIG. 12 shows a second example of the first exemplary embodiment. In FIG. 12, the power transmitting unit 11 of the electric power transmission device 1 is provided in a submersible vessel 16 and the power receiving unit 12 is provided in a submersible vessel 17. By using the present invention, even when the relative position relation between the submersible vessel 16 and the submersible vessel 17 varies by influence of tidal current, an electric power can be stably supplied.

Further, when the submersible vessel 16 uses the power transmitting unit 11 as the power receiving unit and the submersible vessel 17 uses the power receiving unit 12 as the power transmitting unit, the electric power can be transmitted in both directions. Alternatively, the submersible vessel 16 and the submersible vessel 17 may include both the power transmitting unit 11 and the power receiving unit 12. Further, the submersible vessel 17 equipped with the power receiving unit 12 may be a marine vessel, a sensor device laid on a sea bottom, or the like.

Example 3

Figure 13:
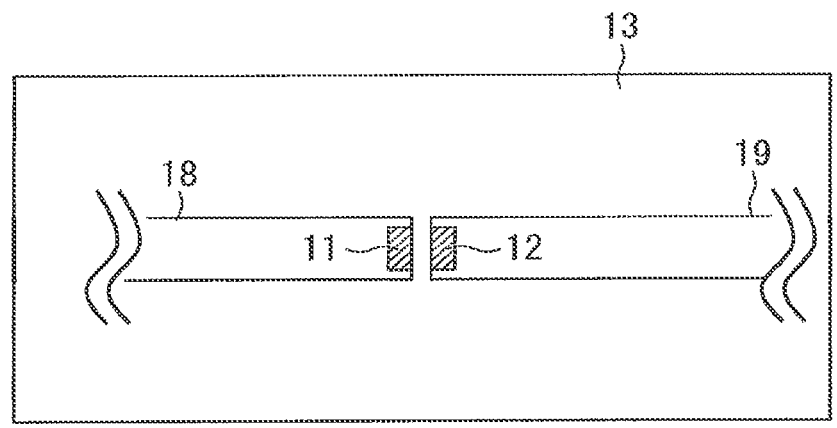
FIG. 13 is a figure showing a third example of a first exemplary embodiment of the present invention.

Next, FIG. 13 shows a third example of the first exemplary embodiment. The power transmitting unit 11 is provided in a connection section of a power supply cable 18 and the power receiving unit 12 is provided in a connection section of a power supply cable 19. By using the present invention, the non-contact electric power transmission in which the electric power is supplied wirelessly without directly connecting two cables in seawater can be performed. When this method is used, the power supply cable can be easily replaced and reliability thereof is improved because it does not wear.

Further, when the power transmitting unit 11 is used as the power receiving unit and the power receiving unit 12 is used as the power transmitting unit, the electric power can be transmitted in both directions by using the power supply cable 18 and the power supply cable 19. Alternatively, the power supply cable 18 and the power supply cable 19 may include both the power transmitting unit 11 and the power receiving unit 12.

The power transmitting unit 11 and the power receiving unit 12 may have a function to wirelessly transmit information. If the power transmitting unit 11 is used as a transmitter and the power receiving unit 12 is used as a receiver, it is not necessary to additionally provide a mechanism for wireless communication. Therefore, a system can be made small and low-cost.

Example 4

Figure 14:
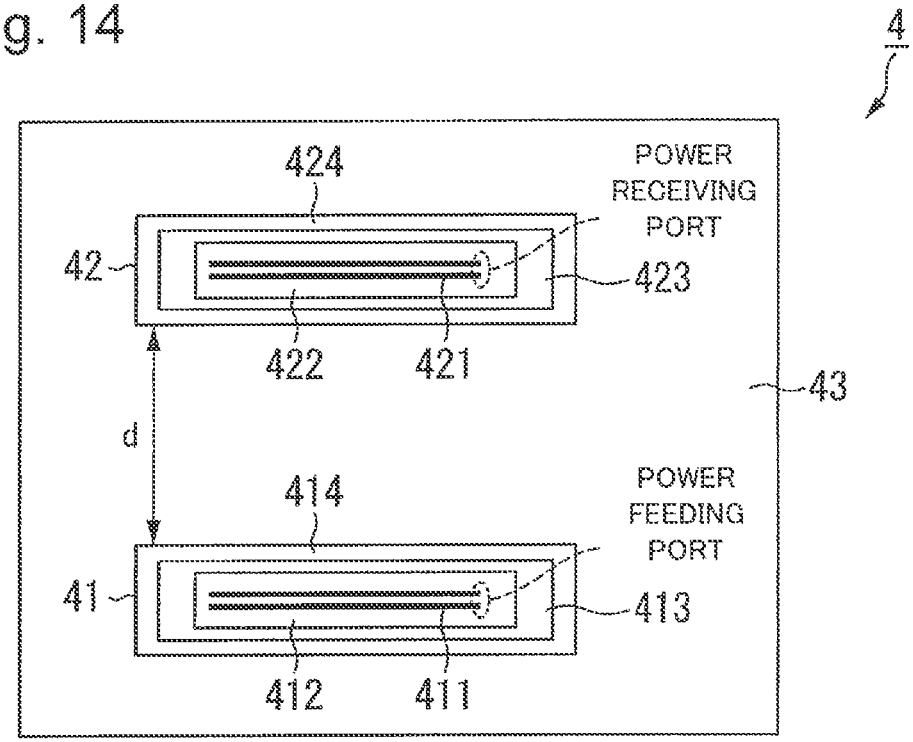
FIG. 14 is a figure showing a simulation model for verifying an effect of an electric power transmission device as a first example of a third exemplary embodiment of the present invention.

FIG. 14 is a figure showing a simulation model for verifying an effect of an electric power transmission device 4 according to the third exemplary embodiment. Next, as a first example of the third exemplary embodiment of the present invention, a specific simulation model for verifying the effect will be described with reference to FIG. 14. In FIG. 14, the electric power transmission device 4 includes a power transmitting unit 41 and a power receiving unit 42. Further, the power transmitting unit 41 and the power receiving unit 42 are covered with seawater 43 that is a conducting medium. The power transmitting unit 41 is equipped with a helical coil (power transmission coil) 411, an inner dielectric material (first power transmitting side inclusion unit) 412, an outer dielectric material (second power transmitting side inclusion unit) 413, and a covering dielectric material (third power transmitting side inclusion unit) 414. The power receiving unit 42 is equipped with a helical coil (power reception coil) 421, an inner dielectric material (first power receiving side inclusion unit) 422, an outer dielectric material (second power receiving side inclusion unit) 423, and a covering dielectric material (third power receiving side inclusion unit) 424.

Figure 15:
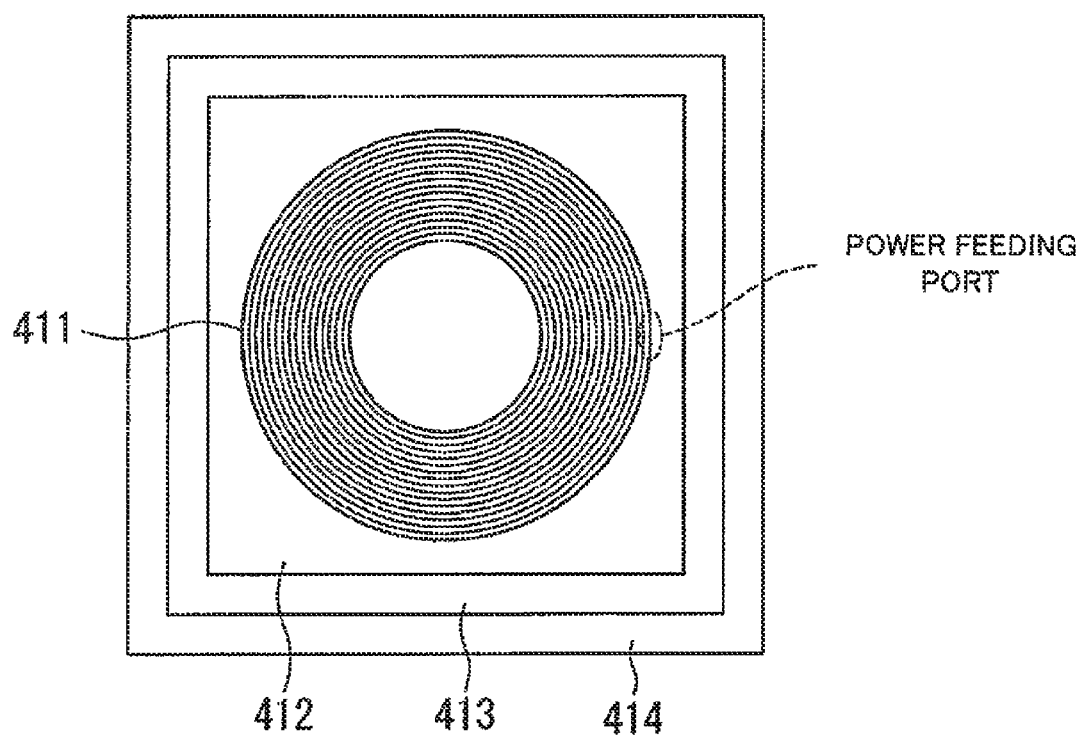
FIG. 15 is a schematic top view of a power transmitting unit in a first example of a third exemplary embodiment of the present invention.

FIG. 15 is a schematic top view of the power transmitting unit 41 of this example. The helical coil 411 shown in FIG. 15 has a structure in which two single layer coils, each of which is formed by winding 29 turns of a conductive wire having a diameter of 2 mm, has an outer diameter of 220 mm, and has an inner diameter of 100 mm, are arranged so as to face to each other and be separated by 3 mm. The alternating current electric power is applied to the helical coils that are faced to each other through a power feeding port. The inner dielectric material 412 is made of fluoroplastic and the covering dielectric material 414 is made of acrylic. The covering dielectric material 414 has dimensions of 255 mm height, 255 mm width, and 19 mm thickness. The resonance frequency of the electric power transmission device 4 is approx. 1 MHz. Here, in this example, even when a ratio of d1/d2 is equal to 1.16 that is greater than 1, wherein d1 is a size of the covering dielectric material and d2 is the outer diameter of the helical coil, the sufficiently high electric power transmission efficiency can be obtained. When the ratio of d1/d2 is set so as to be larger than 1.16, the higher electric power transmission efficiency can be obtained.

The structure of the power receiving unit 42 is the same as that of the power transmitting unit 41. However, this structure is shown as an example. Therefore, even when the power receiving unit 42 and the power transmitting unit 41 have a different structure from each other, a similar effect can be obtained.

Figure 16:
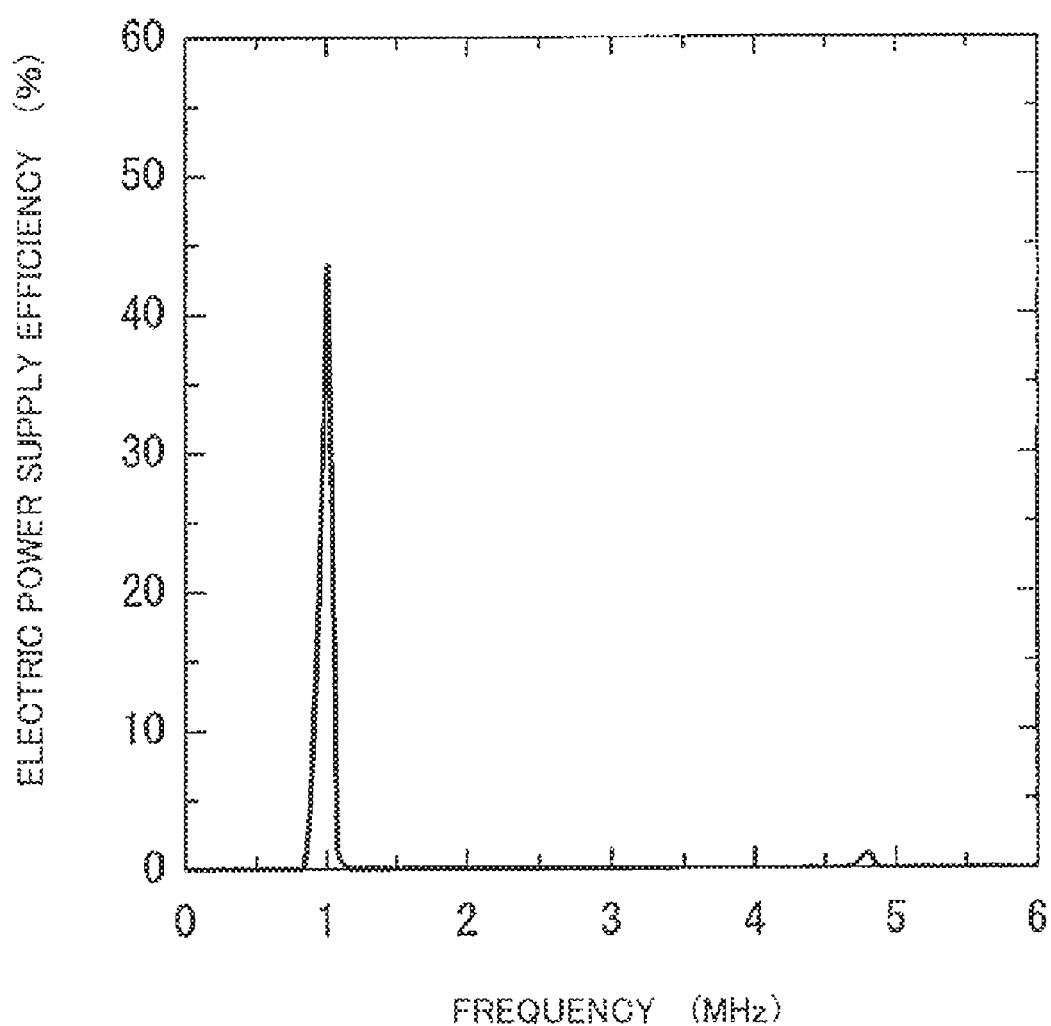
FIG. 16 is a figure showing a result obtained by simulating an electric power transmission efficiency in a first example of a third exemplary embodiment of the present invention.

FIG. 16 is a figure showing a result obtained by simulating the electric power transmission efficiency in this example. The electric power transmission efficiency is simulated on the condition on which the distance d between the power transmitting unit 41 and the power receiving unit 42 is 10 cm and the electric power transmission is performed in seawater. FIG. 16 shows a simulation result. From this result, it is apparent that when the frequency f of the transmitted electric power is around 1 MHz, the electric power transmission efficiency is 40% or more.

Figure 18B:
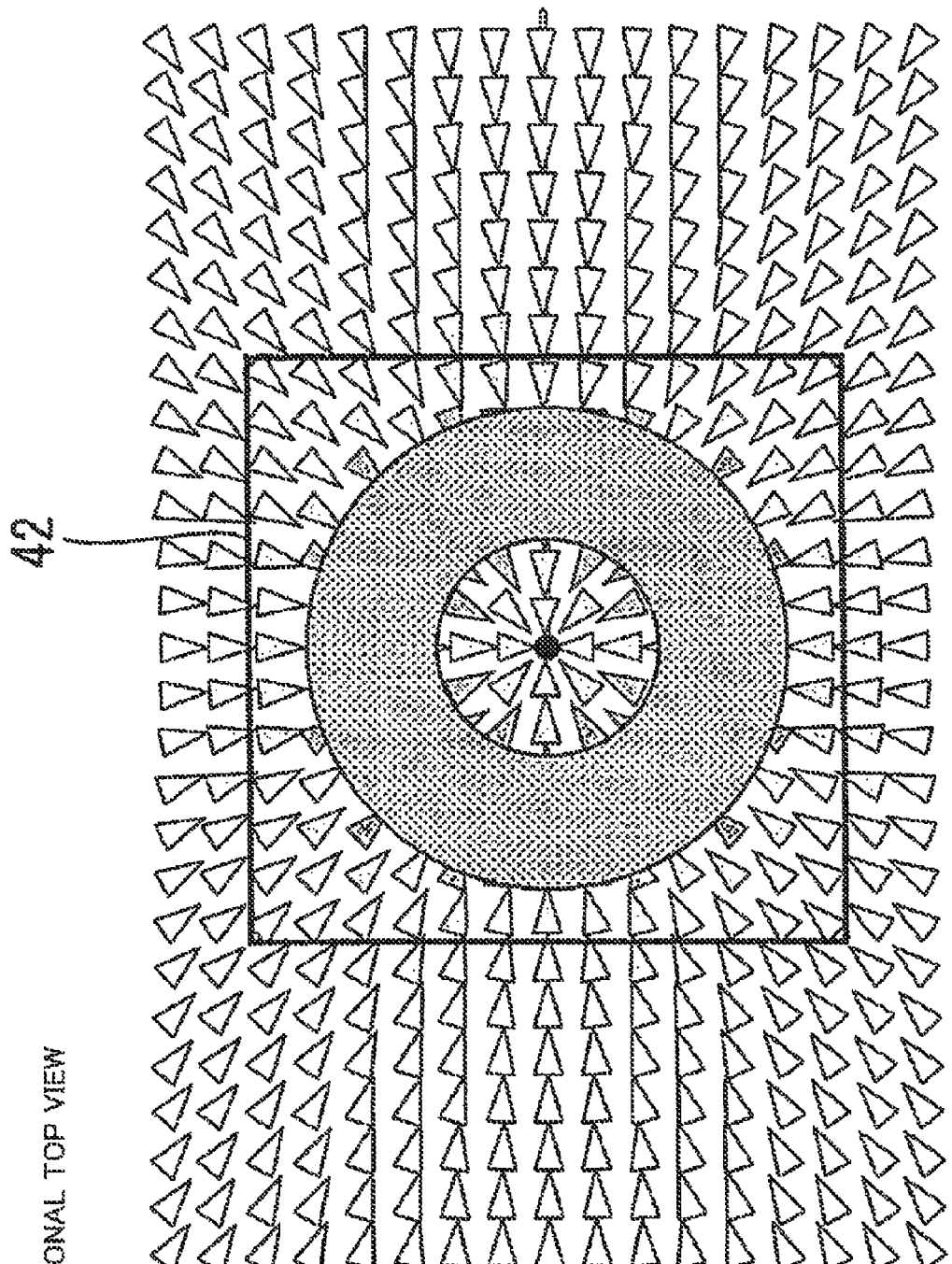
FIG. 18B is a figure showing a magnetic field vector in a neighborhood of a power transmitting unit and a power receiving unit in a first example of a third exemplary embodiment of the present invention.
Figure 19A:
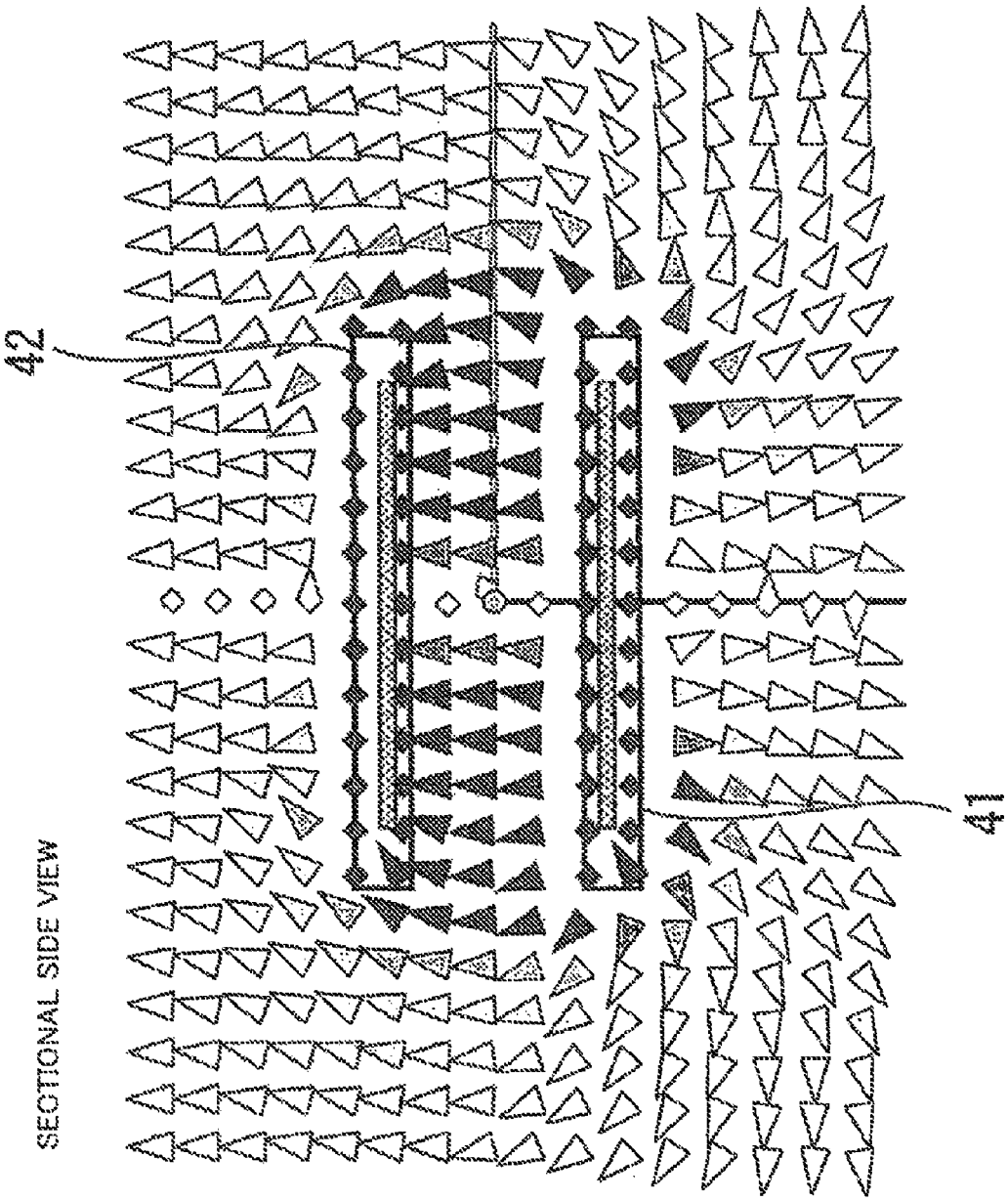
FIG. 19A is a figure showing the Poynting vector in a neighborhood of a power transmitting unit and a power receiving unit in a first example of a third exemplary embodiment of the present invention.
Figure 19B:
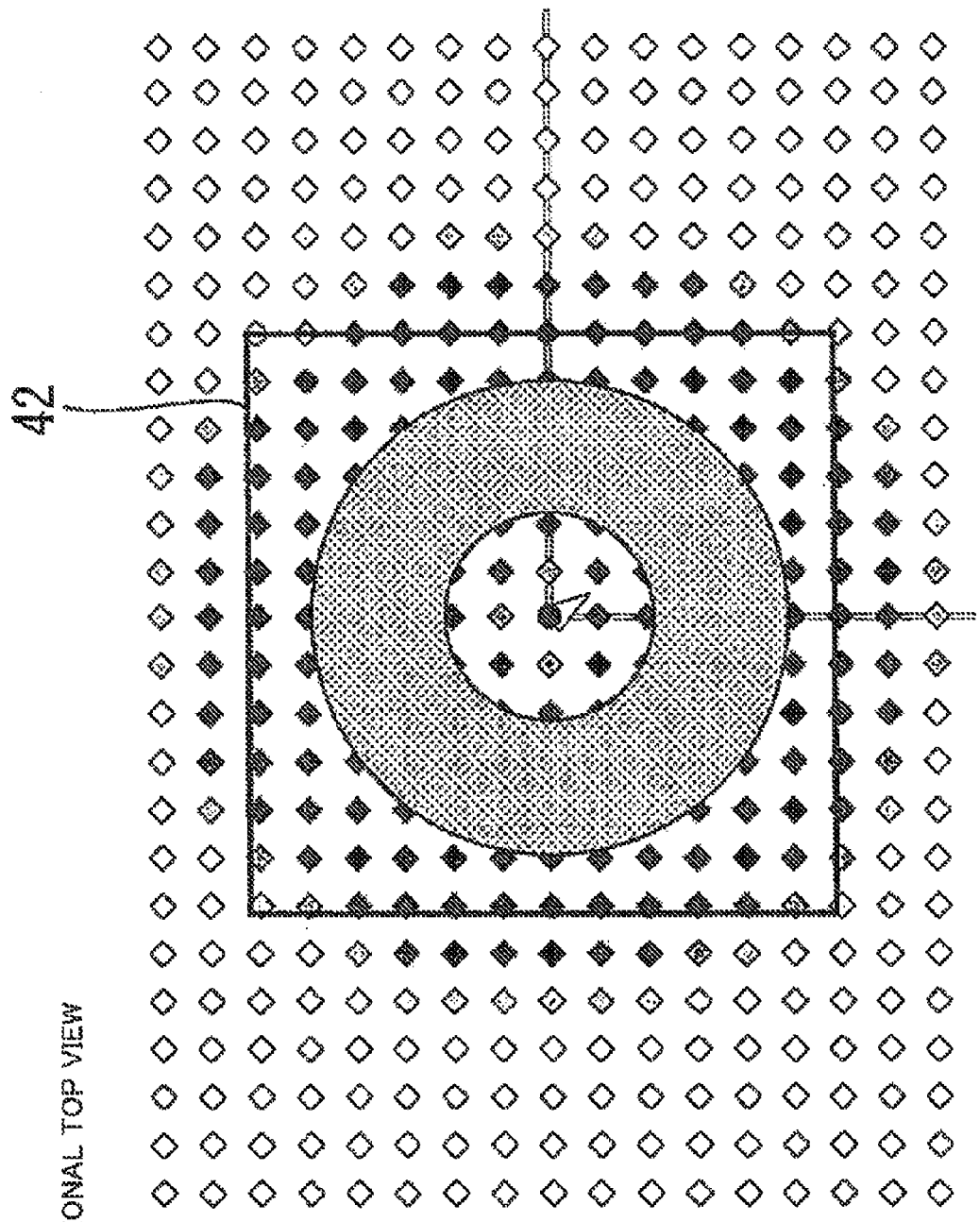
FIG. 19B is a figure showing the Poynting vector in a neighborhood of a power transmitting unit and a power receiving unit in a first example of a third exemplary embodiment of the present invention.

FIGS. 17A and 17B are figures showing the electric field vector in a neighborhood of the power transmitting unit 41 and the power receiving unit 42 in this example. FIGS. 18A and 18B are figures showing the magnetic field vector in a neighborhood of the power transmitting unit 41 and the power receiving unit 42 in this example. FIGS. 19A and 19B are figures showing the Poynting vector in a neighborhood of the power transmitting unit 41 and the power receiving unit 42 in this example. A three-dimensional electromagnetic field simulation is performed in detail with respect to the electric field, the magnetic field, and the Poynting vector in the electric power transmission device 4 in the above-mentioned example. A result of simulation will be described with reference to FIGS. 17 to 19.

In this example, as shown in FIGS. 17A and 17B, a flow of electric field rotates in a plane parallel to the coil surface and as shown in FIGS. 18A and 18B, a flow of magnetic field is radially generated in a plane parallel to the coil surface. The Poynting vector (the flow of energy) is generated in a direction approximately perpendicular to the coil surface on the basis of the flow of electric field and the flow of magnetic field (FIGS. 19A and 19B). As a result, even when the electric power transmission is performed in a state in which the distance between the power transmitting unit 41 and the power receiving unit 42 that exist in seawater is approx. 10 cm, the flow of energy is formed in a direction approximately perpendicular to the coil surface and the electric power transmission can be performed over a long distance in seawater.

Figure 20B:
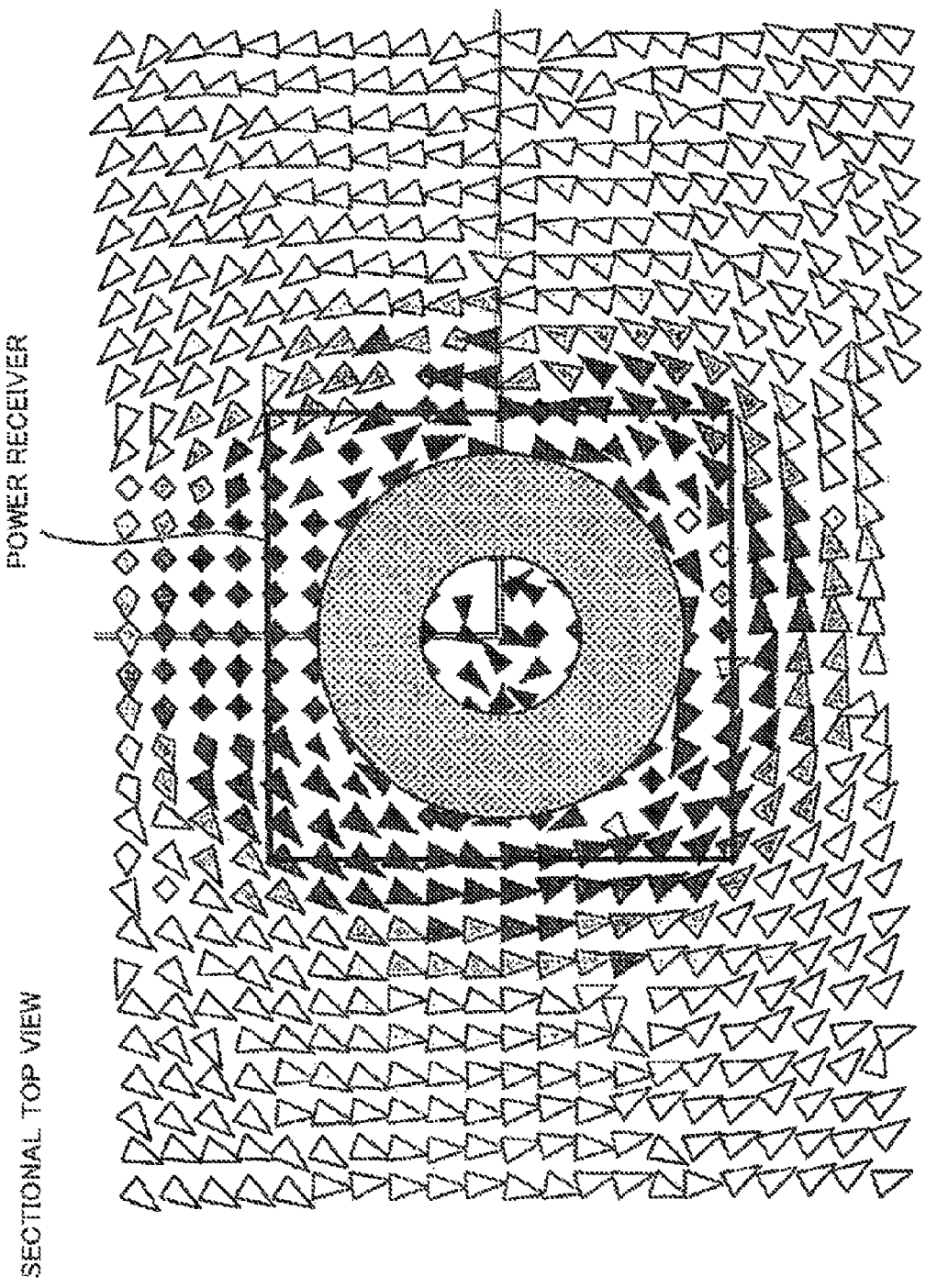
FIG. 20B is a figure showing the Poynting vector in the atmosphere in a first example of a third exemplary embodiment of the present invention.

FIGS. 20A and 20B are figures showing the Poynting vector in the atmosphere of the electric power transmission device 4 in this example. The electric power transmission is simulated on the condition on which the distance between the power transmitting unit 41 and the power receiving unit 42 of the electric power transmission device 4 in this example is 10 cm in the atmosphere. A result of simulation will be described with reference to FIGS. 20A and 20B.

As shown in FIGS. 20A and 20B, the flow of energy perpendicular to the surface of the power transmitting unit and the power receiving unit is not generated and the energy flows spirally. Namely, a phenomenon in which the flow of energy is formed in a direction approximately perpendicular to the coil surface is a phenomenon that occurs only when the energy propagates through the conducting medium and does not occur when the energy propagates through the atmosphere. Namely, the present invention uses a unique phenomenon in which the flow of energy approximately perpendicular to the coil surface is generated.

Figure 21A:
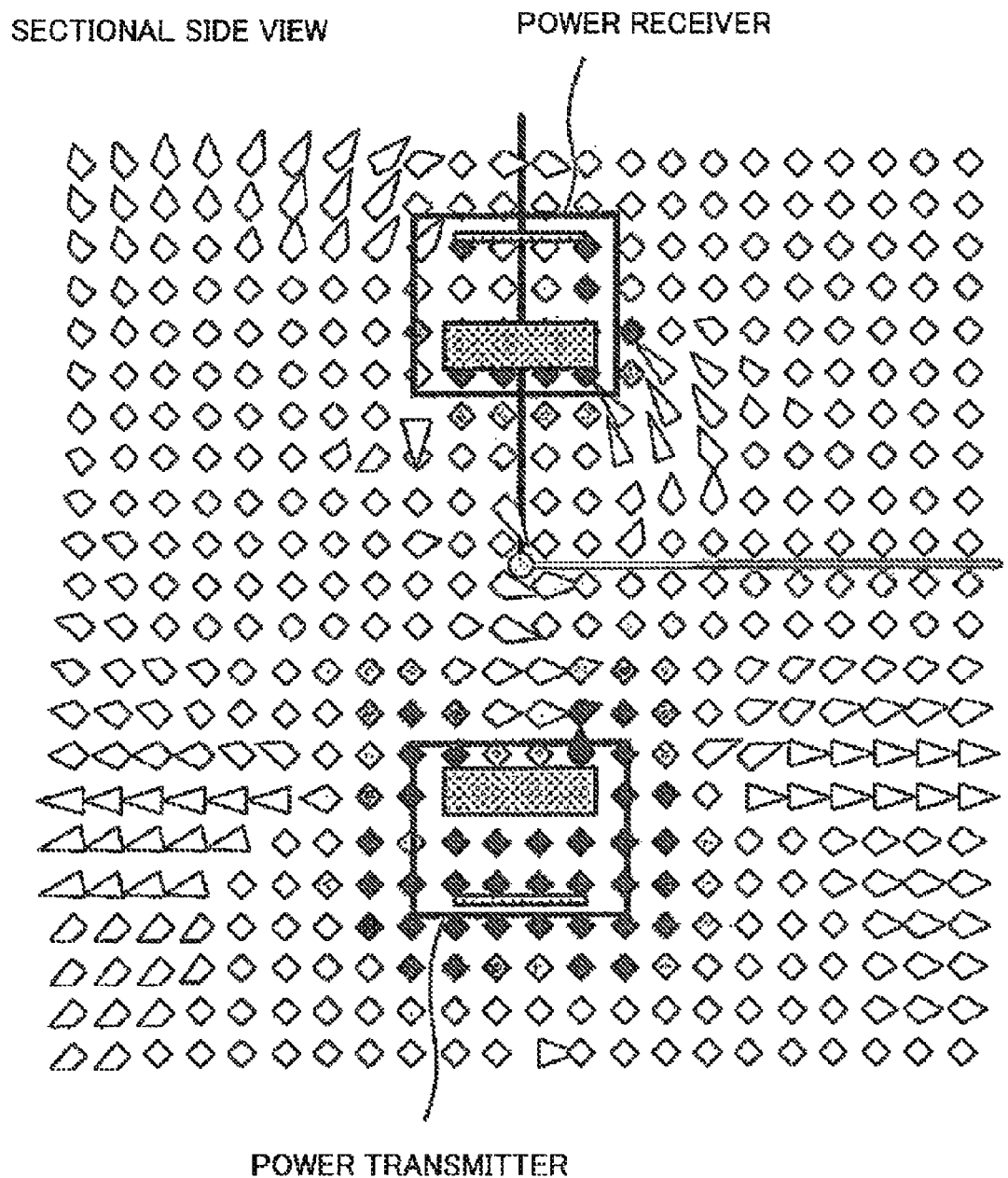
FIG. 21A is a figure showing the Poynting vector in the atmosphere when a publicly known magnetic field resonance technology is used.
Figure 21B:
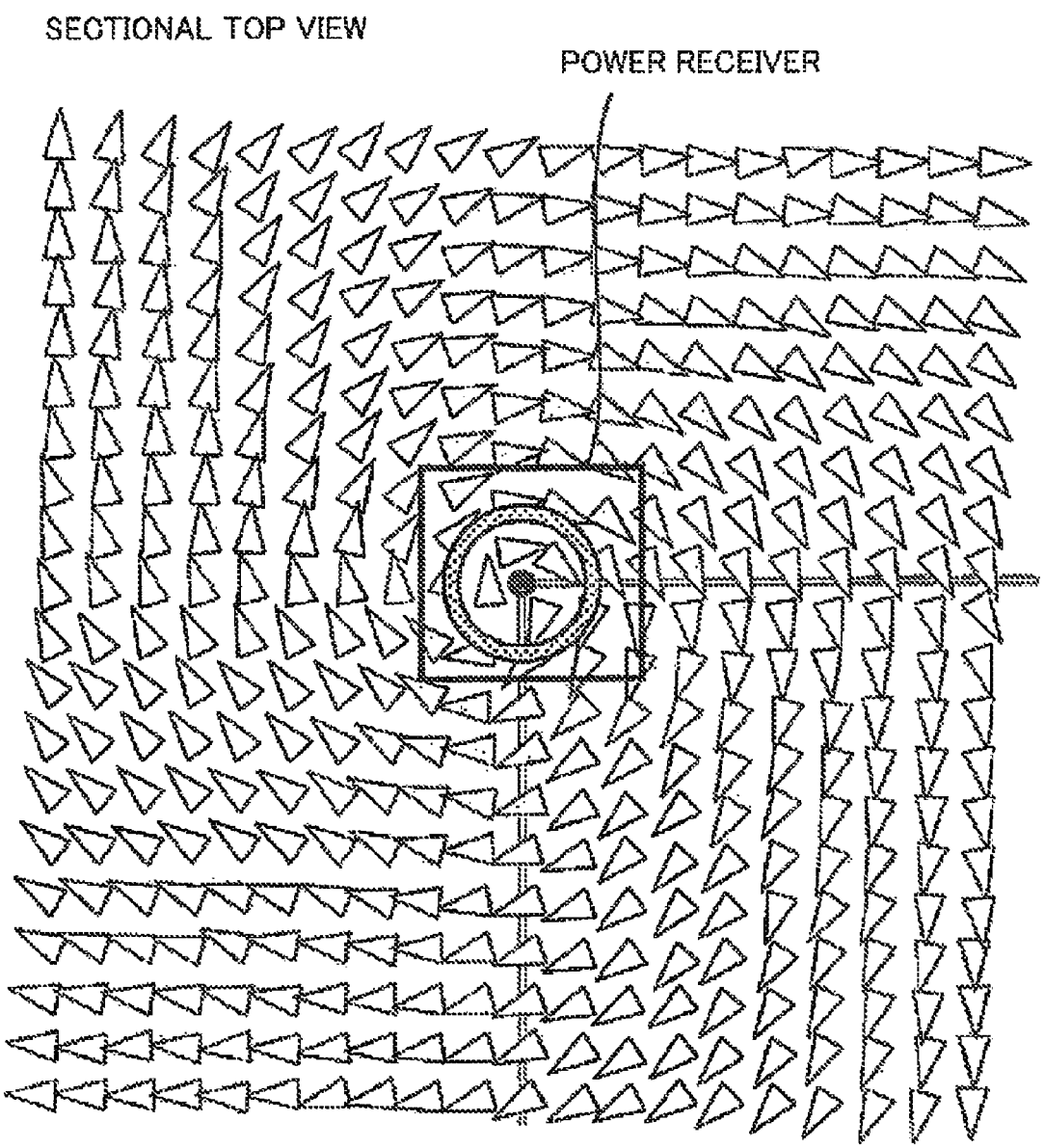
FIG. 21B is a figure showing the Poynting vector in the atmosphere when a publicly known magnetic field resonance technology is used.

FIGS. 21A and 21B are figures showing the Poynting vector in the atmosphere when a conventional magnetic field resonance technology is used. Next, the electric power transmission in the atmosphere using the magnetic field resonance technology is simulated. A result of simulation will be described with reference to FIGS. 21A and 21B.

As shown in FIGS. 21A and 21B, in this case, the flow of energy perpendicular to the coil surface is not generated and the energy flows spirally like the flow shown in FIGS. 20A and 20B. In this case, the electric power transmission efficiency is 90%. Further, as described above, when the wireless electric power transmission in seawater is performed by the electric power transmission device using a conventional technology, the high electric power transmission efficiency cannot be obtained. A result of simulation shows that when the distance between the power transmitting unit and the power receiving unit is 10 cm, the electric power transmission efficiency is approx. 10%.

FIGS. 18A and 18B show the magnetic field in a phase condition in which the magnitude of interlinkage magnetic flux which penetrates the helical coil 411 and the helical coil 421 of the power transmitting unit 41 and the power receiving unit 42 shown in FIG. 14 and FIG. 15 is maximum. A physical difference between the conventional magnetic field resonance technology and the electric power transmission device 4 in this example will be described with reference to FIGS. 18A and 18B. As shown in FIGS. 18A and 18B, the direction of the interlinkage magnetic flux which penetrates the helical coil 411 of the power transmitting unit 41 is opposite to the direction of the interlinkage magnetic flux which penetrates the helical coil 421 of the power receiving unit 42 and whereby, the magnitude of the magnetic field becomes maximum and the magnetic field that is parallel to the coil surface is generated.

On the other hand, in the wireless electric power transmission technology using the magnetic field resonance, it is generally known that when a tight coupling is used, two resonance frequencies are generated and at the resonance frequency of a high side, the phase of the interlinkage magnetic flux which penetrates the coil of the power transmitting unit is opposite to the phase of the interlinkage magnetic flux which penetrates the coil of the power receiving unit. Further, in this technology, it is known that when a loose coupling in which two resonance frequencies are not generated is used, the phase of the interlinkage magnetic flux which penetrates the coil of the power transmitting unit is the same as the phase of the interlinkage magnetic flux which penetrates the coil of the power receiving unit.

In the present invention, when the loose coupling is used and the tight coupling is not used, the phase of the interlinkage magnetic flux which penetrates the coil of the power transmitting unit is opposite to the phase of the interlinkage magnetic flux which penetrates the coil of the power receiving unit. This is an essential difference from the conventional magnetic field resonance technology.

Example 5

Figure 22:
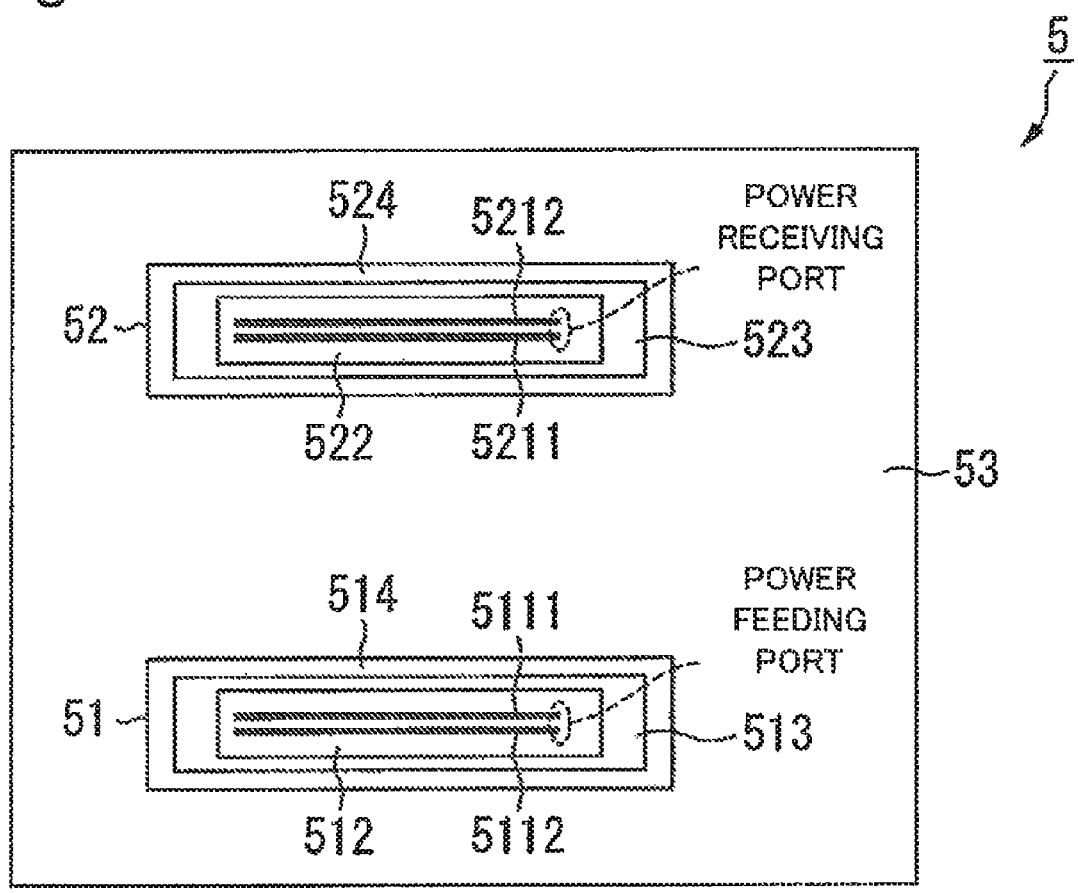
FIG. 22 is a figure showing a simulation model for verifying an effect of an electric power transmission device as a second example of a third exemplary embodiment of the present invention.

FIG. 22 is a figure showing a simulation model for verifying an effect of an electric power transmission device 5 according to the third exemplary embodiment. Next, as a second example of the third exemplary embodiment of the present invention, a result of a specific simulation for verifying the effect will be described with reference to FIG. 22.

In FIG. 22, the electric power transmission device 5 includes a power transmitting unit 51 and a power receiving unit 52. Further, the power transmitting unit 51 and the power receiving unit 52 are covered with seawater 53 that is a conducting medium. The power transmitting unit 51 is equipped with a spiral coil 5111, a loop coil 5112, an inner dielectric material (first power transmitting side inclusion unit) 512, an outer dielectric material (second power transmitting side inclusion unit) 513, and a covering dielectric material (third power transmitting side inclusion unit) 514. The power receiving unit 52 is equipped with a spiral coil 5211, a loop coil 5212, an inner dielectric material (first power receiving side inclusion unit) 522, an outer dielectric material (second power receiving side inclusion unit) 523, and a covering dielectric material (third power receiving side inclusion unit) 524.

Figure 23:
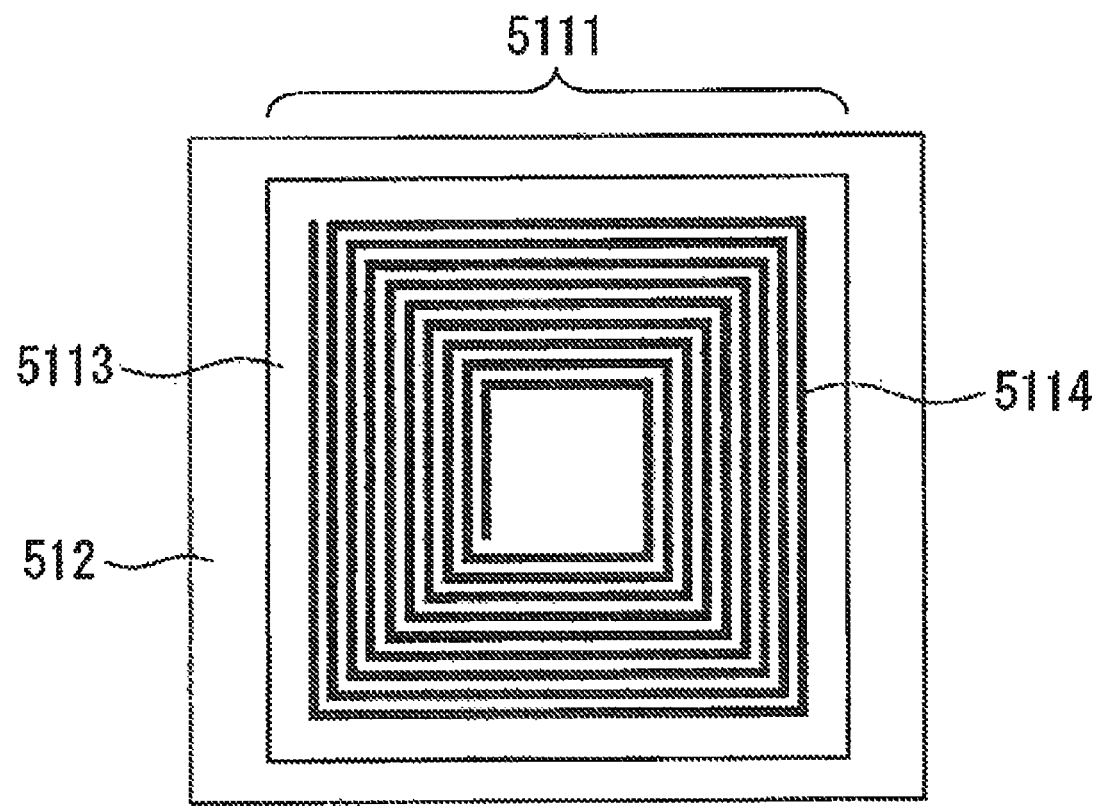
FIG. 23 is a top view showing a model of a spiral coil in a second example of a third exemplary embodiment of the present invention.
Figure 24:
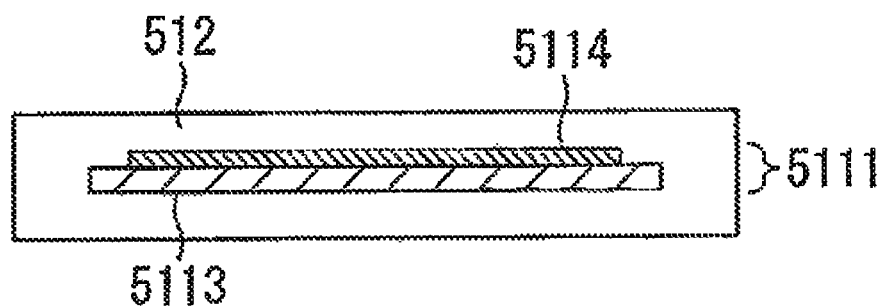
FIG. 24 is a side view showing a model of a spiral coil in a second example of a third exemplary embodiment of the present invention.

FIG. 23 is a top view showing a model of the spiral coil 5111 (the spiral coil 5211) in this example. FIG. 24 is a side view showing a model of the spiral coil 5111 (the spiral coil 5211) in this example. The spiral coil 5111 is composed of a dielectric substrate 5113 made of fluoroplastic and a spiral wiring 5114 made of metal. The dielectric substrate 5113 has dimensions of 270 mm height, 270 mm width, and 1 mm thickness. The spiral wiring 5114 has dimensions of 260 mm height, 260 mm width, 6 mm wire width, and 50 μm wire thickness and the spiral coil is formed by 10 turns of a wire.

Figure 25:
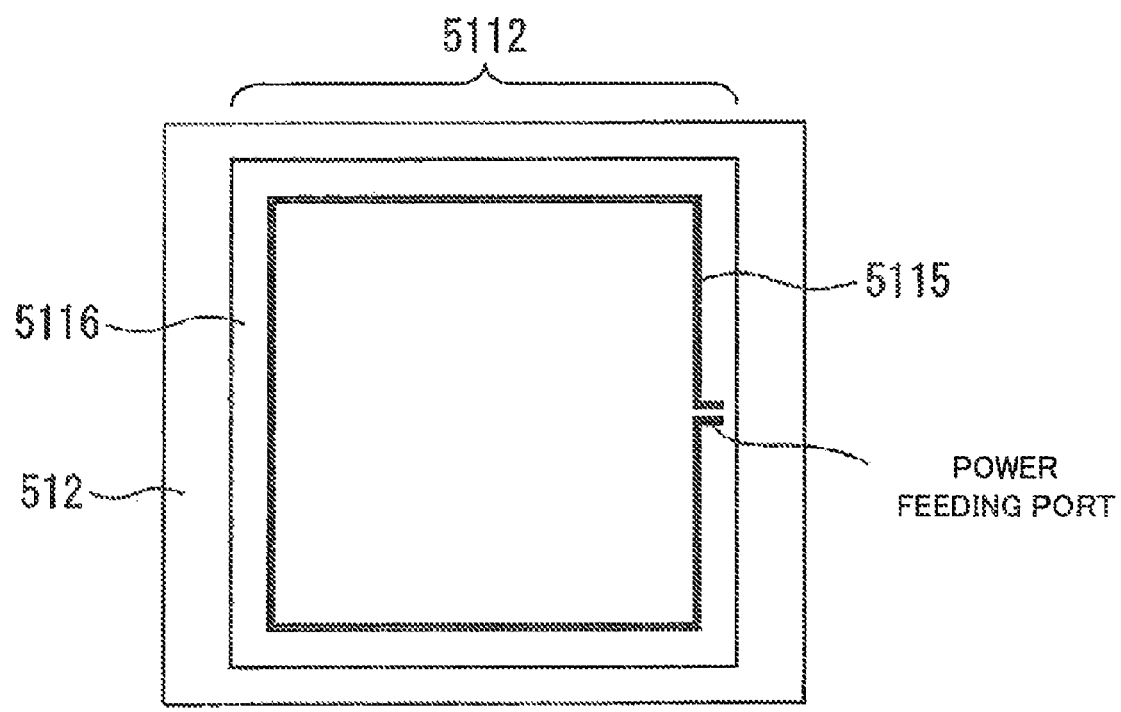
FIG. 25 is a top view showing a model of a loop coil in a second example of a third exemplary embodiment of the present invention.
Figure 26:
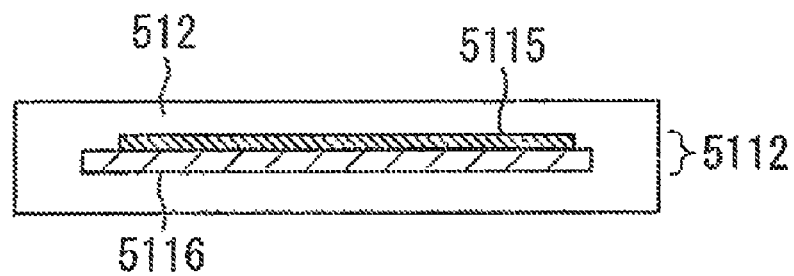
FIG. 26 is a side view showing a model of a loop coil in a second example of a third exemplary embodiment of the present invention.

FIG. 25 is a top view showing a model of the loop coil 5112 (the loop coil 5212) in this example. FIG. 26 is a side view showing a model of the loop coil 5112 (the loop coil 5212) in this example. The loop coil 5112 is composed of a dielectric substrate 5115 made of fluoroplastic and a loop wiring 5116 made of metal. The dielectric substrate 5115 has dimensions of 270 mm height, 270 mm width, and 1 mm thickness. The loop wiring 5116 has dimensions of 260 mm height, 260 mm width, 6 mm wire width, and 50 μm wire thickness.

The spiral coil 5111 is separated by 3 mm from the loop coil 5112 in the inner dielectric material 512. The electric power transmission in seawater is simulated on the condition on which the power transmitting unit 51 is separated by 10 cm from the power receiving unit 52. A result of simulation shows that the electric power transmission efficiency is 55% or more. Further, the resonance frequency is approx. 1 MHz. In this example, the structure of the power receiving unit 52 is the same as that of the power transmitting unit 51. However, this structure is shown as an example. Therefore, even when the power transmitting unit 51 and the power receiving unit 52 have a different structure from each other, a similar effect can be obtained.

When the coil is formed on the dielectric substrate as shown in this example, the coil can be mass-produced and because the manufacturing accuracy increases, characteristic variation of the coil can be reduced. Accordingly, the resonance frequency of the power transmitting unit and the resonance frequency of the power receiving unit can be made identical and the higher electric power transmission efficiency can be obtained.

Example 6

Figure 28:
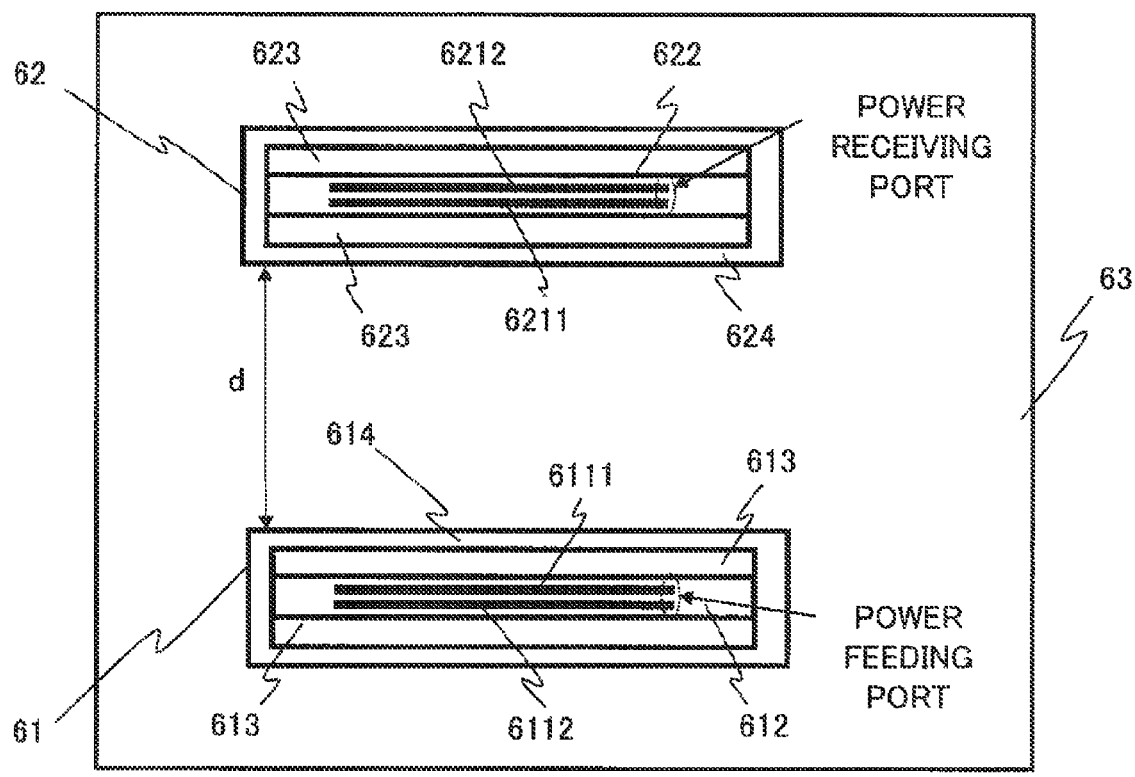
FIG. 28 is a figure showing a simulation model for verifying an effect of an electric power transmission device in a third example of a third exemplary embodiment of the present invention.

FIG. 28 is a figure showing a simulation model for verifying an effect of an electric power transmission device 6 according to the third exemplary embodiment of the present invention. Next, as a third example of the third exemplary embodiment of the present invention, a result of a specific simulation for verifying the effect will be described with reference to FIG. 28.

In FIG. 28, the electric power transmission device 6 includes a power transmitting unit 61 and a power receiving unit 62. Further, the power transmitting unit 61 and the power receiving unit 62 are covered with seawater 63. The power transmitting unit 61 is equipped with a power transmission coil composed of a spiral coil 6111 and a spiral coil 6112, a first power transmitting side inclusion units 612 formed of a first dielectric material covering the power transmission coil, a second power transmitting side inclusion unit 613 formed of the second dielectric material covering the first power transmitting side inclusion unit 612, and a third power transmitting side inclusion unit 614 formed of the third dielectric material covering the second power transmitting side inclusion unit 613. The power receiving unit 62 is equipped with a power reception coil composed of a spiral coil 6211 and a spiral coil 6212, a first power receiving side inclusion unit 622, a second power receiving side inclusion unit 623, and a third power receiving side inclusion unit 624 like the power transmitting unit 61.

Here, as shown in FIG. 28, the simulation model in this example has a structure in which the second power transmitting side inclusion unit 613 (the second power receiving side inclusion unit 623) covers only the upper surface and the lower surface (the surfaces parallel to the coil surface) of the first power transmitting side inclusion unit 612 (the first power receiving side inclusion unit 622). Namely, a structure in which the first power transmitting side inclusion unit 612 (the first power receiving side inclusion unit 622) is sandwiched between the second power transmitting side inclusion units 613 (the second power receiving side inclusion units 623) is used. On the other hand, the side surface (the surface perpendicular to the coil surface) of the first power transmitting side inclusion unit 612 (the first power receiving side inclusion unit 622) is directly covered by the third power transmitting side inclusion unit 614 (the third power receiving side inclusion unit 624).

Figure 29:
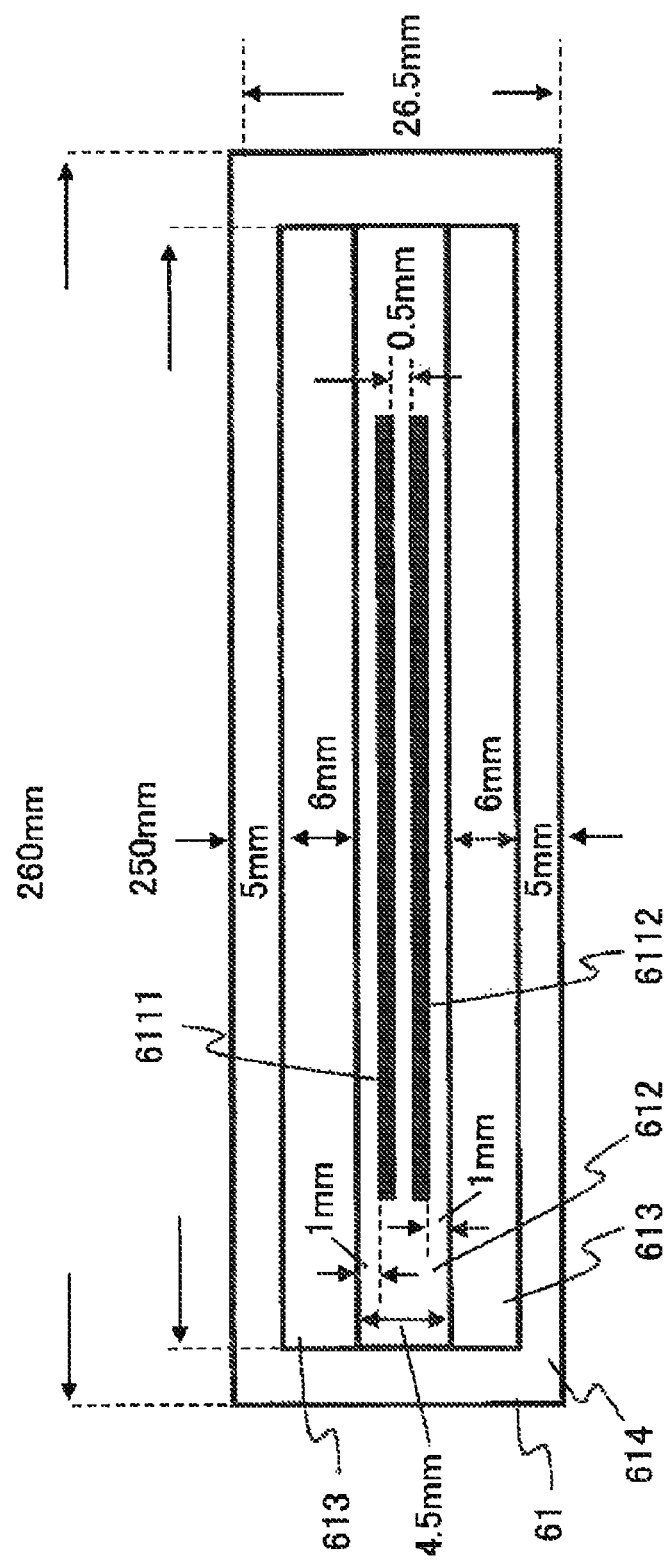
FIG. 29 is a side view of a power transmitting unit in a third example of a third exemplary embodiment of the present invention.

FIG. 29 is a side view showing a model of the power transmitting unit 61 in this example. The first power transmitting side inclusion unit 612 has dimensions of 250 mm height, 250 mm width, and 4.5 mm thickness and is made of fluoroplastic. The relative permittivity of the first power transmitting side inclusion unit 612 is 10.2 and the dielectric loss tangent thereof is 0.0023. The second power transmitting side inclusion unit 613 is composed of two fluoroplastic films, each of which has dimensions of 250 mm height, 250 mm width, and 6 mm thickness. The relative permittivity of the second power transmitting side inclusion unit 613 is 6.2 and the dielectric loss tangent thereof is 0.0019. The third power transmitting side inclusion unit 614 has dimensions of 260 mm height, 260 mm width, and 26.5 mm thickness and is formed of an acrylic plate with 5 mm thickness. The relative permittivity of acrylic is 3.3 and the dielectric loss tangent thereof is 0.04. Further, in this example, the structure of the power receiving unit 62 is the same as that of the power transmitting unit 61 and the simulation is performed under this condition.

Figure 30:
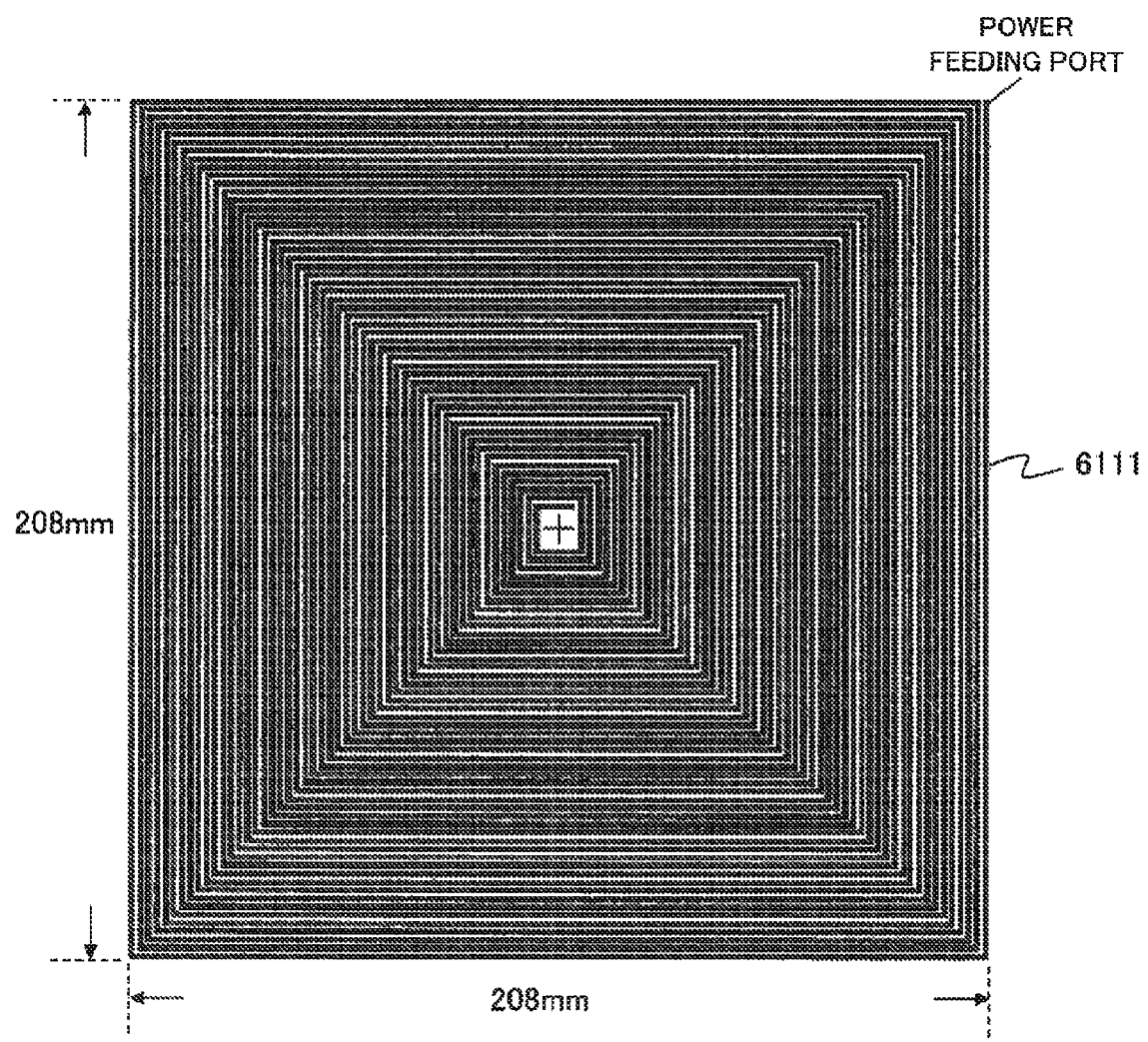
FIG. 30 is a figure showing a model of a spiral coil in a third example of a third exemplary embodiment of the present invention when it is viewed from a power receiving unit side.
Figure 31:
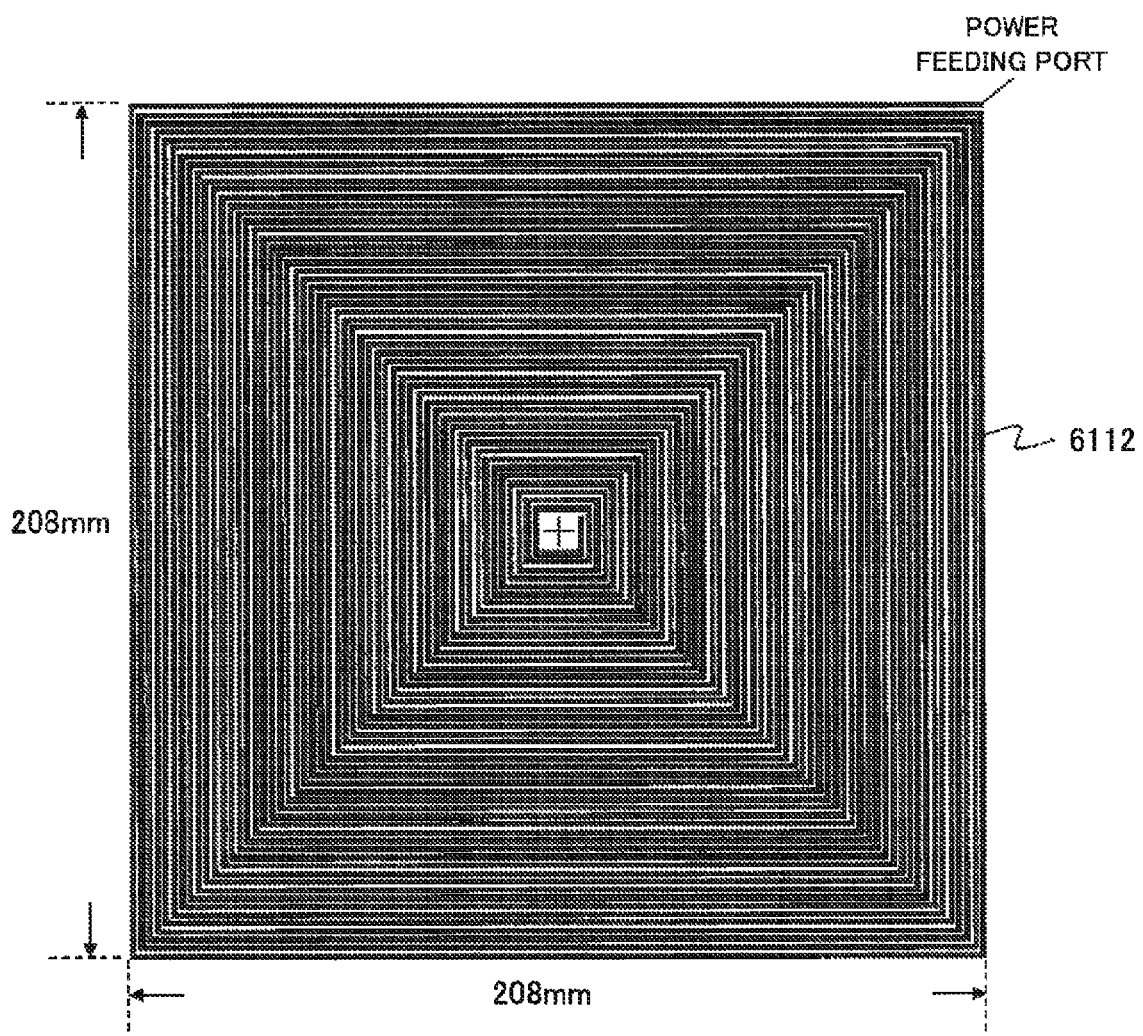
FIG. 31 is a figure showing a model of a spiral coil in a third example of a third exemplary embodiment of the present invention when it is viewed from a power receiving unit side.

FIG. 30 is a figure showing a model of the spiral coil 6111 of the power transmitting unit 61 in this example when viewed from the power receiving unit side and FIG. 31 is a figure showing a model of the spiral coil 6112 of the power transmitting unit 61 in this example when viewed from the power receiving unit side. The spiral coil 6111 is formed by winding 50 turns of a conductive wire and the size of the spiral coil 6111 is 208 mm square. The diameter of the wire is 1 mm and a spacing between adjacent wires is 1 mm. The size of the spiral coil 6112 is the same as that of the spiral coil 6111. The spiral coil 6111 is separated by 0.5 mm from the spiral coil 6112. The outermost end part of the spiral coil 6111 and the outermost end part of the spiral coil 6112 are used for the power feeding port for feeding a high frequency electric power. The winding direction of the spiral coil 6111 and the winding direction of the spiral coil 6112 are determined so that the directions of the magnetic fields generated by the spiral coils 6111 and 6112 are the same as each other when the high frequency electric power is fed through the power feeding port.

Figure 32:
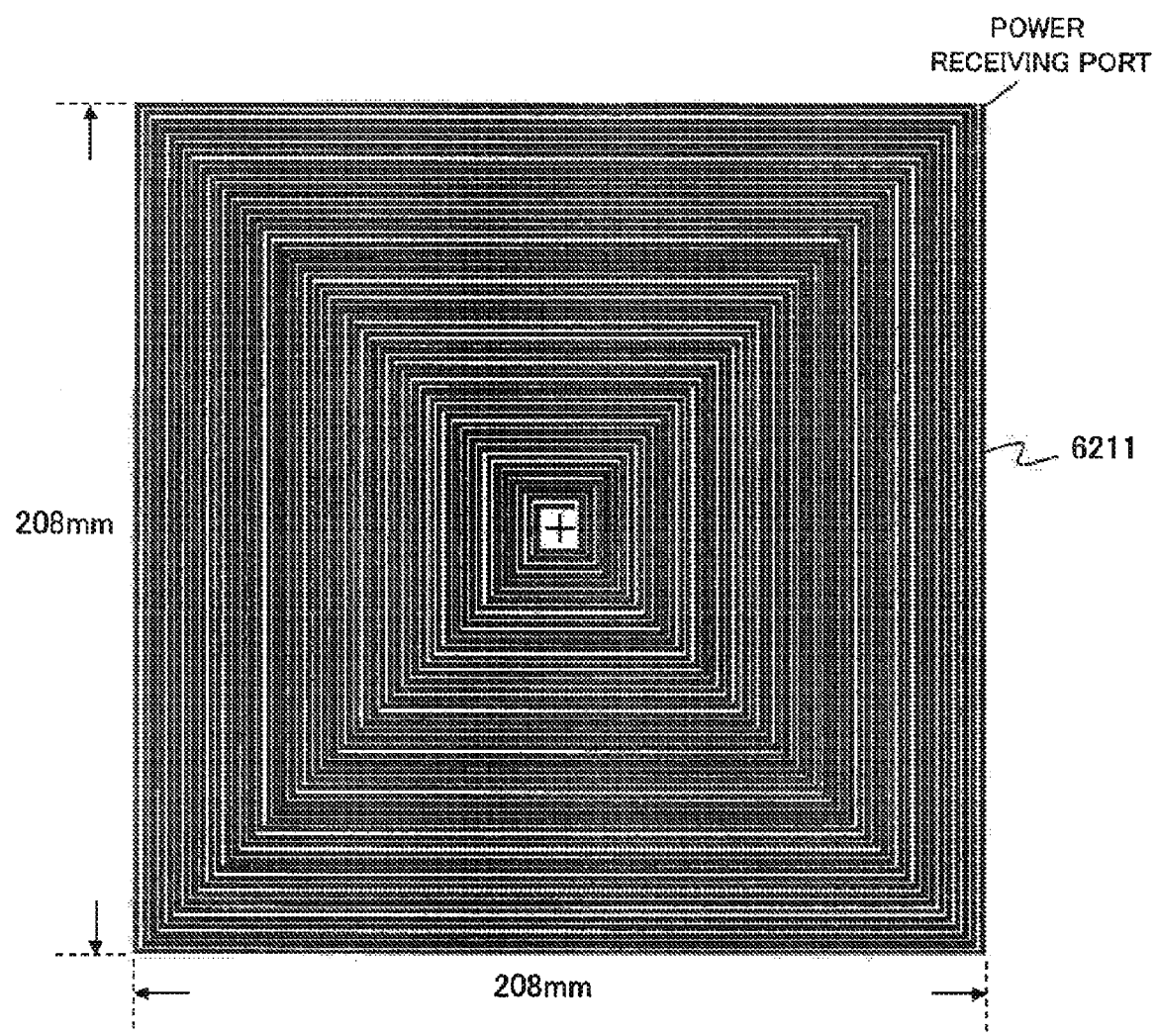
FIG. 32 is a figure showing a model of a spiral coil in a third example of a third exemplary embodiment of the present invention when it is viewed from a power transmitting unit side.
Figure 33:
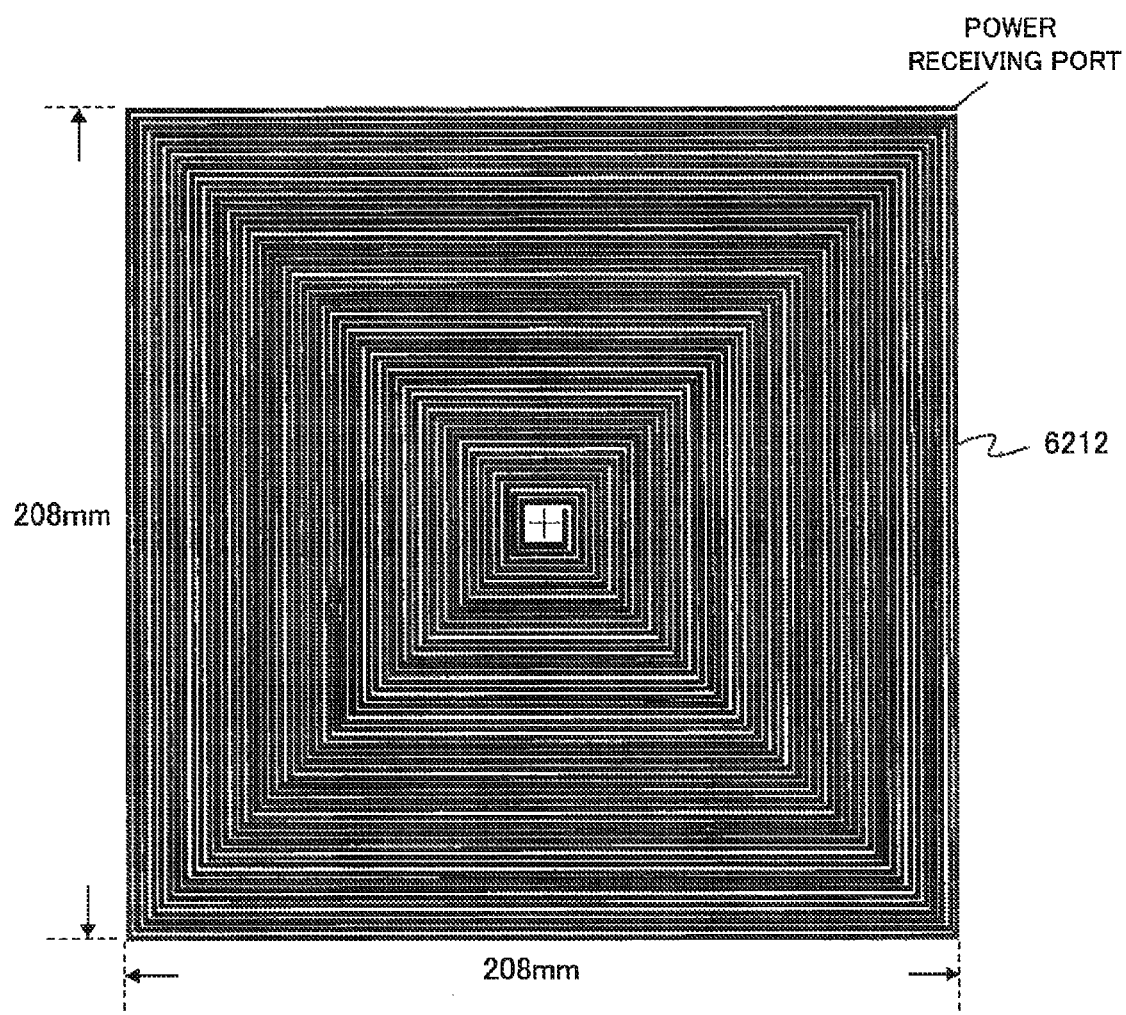
FIG. 33 is a figure showing a model of a spiral coil in a third example of a third exemplary embodiment of the present invention when it is viewed from a power transmitting unit side.

FIG. 32 is a figure showing a model of the spiral coil 6211 of the power receiving unit 62 in this example when viewed from the power transmitting unit side and FIG. 33 is a figure showing a model of the spiral coil 6212 of the power receiving unit 62 in this example when viewed from the power transmitting unit side. The spiral coil 62111 is formed by winding 50 turns of a conductive wire and the size of the spiral coil 6211 is 208 mm square. The diameter of the wire is 1 mm and a spacing between adjacent wires is 1 mm. The size of the spiral coil 6212 is the same as that of the spiral coil 6211. The spiral coil 62111 is separated by 0.5 mm from the spiral coil 6212. The outermost end part of the spiral coil 6211 and the outermost end part of the spiral coil 6212 are used for the power receiving port for feeding a high frequency electric power. The winding direction of the spiral coil 6211 and the winding direction of the spiral coil 6212 are determined so that the directions of the magnetic fields generated by the spiral coils 6211 and 6212 are the same as each other when the high frequency electric power is fed through the power receiving port.

Figure 34:
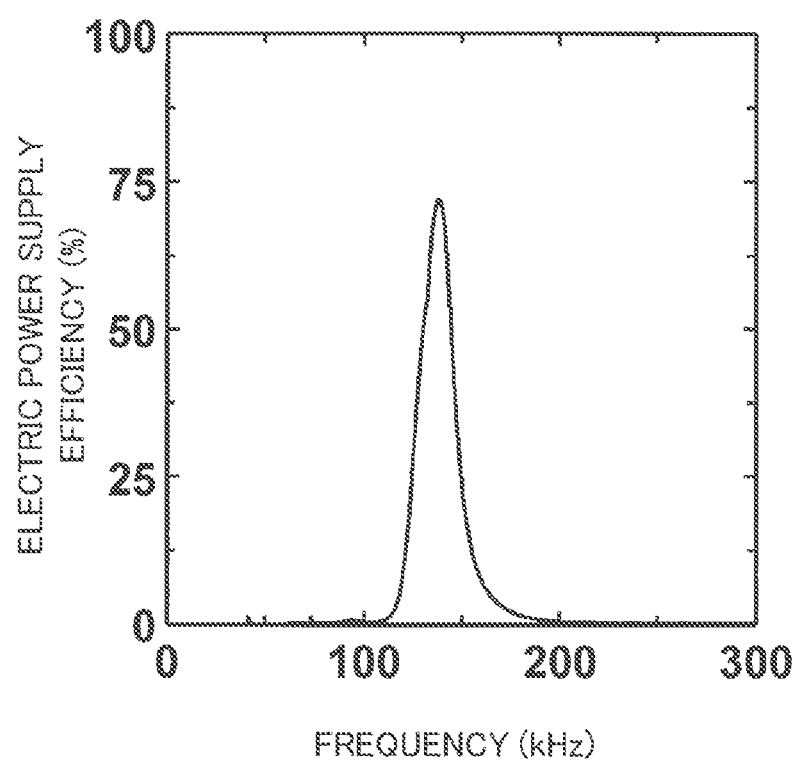
FIG. 34 is a figure showing a result obtained by simulating an electric power transmission efficiency in a third example of a third exemplary embodiment of the present invention.

The electric power transmission in seawater is simulated on the condition on which the power transmitting unit 61 is separated by 10 cm from the power receiving unit 62. A result of simulation shows that the electric power transmission efficiency is 72% or more as shown in FIG. 34. Further, the resonance frequency is approx. 140 kHz. In this example, the structure of the power receiving unit 62 is the same as that of the power transmitting unit 61. However, this structure is shown as an example. Therefore, even when the power transmitting unit 61 and the power receiving unit 62 have a different structure from each other, a similar effect can be obtained.

As shown by simulation in this example, by covering the coil with a plurality of dielectric materials, the high electric power transmission efficiency can be obtained without increasing a loss in the dielectric material.

In the above explanation, it is assumed that the electric power transmission is performed in an ideal state in which the power transceiver is fixed in the sea and the relative position between the power transceivers does not change. However, as described above, the relative position between the power transceivers changes by influence of tidal current and buoyancy in the sea. Accordingly, the resonance frequency changes or the impedance mismatching occurs and whereby, the electric power transmission efficiency is reduced. In order to solve this problem, in the present invention, the impedance adjustment unit compensates the impedance mismatching and whereby, the high electric power transmission efficiency can be realized. The structure, the operation, and the effect of this impedance adjustment unit will be described in detail below.

Figure 35:
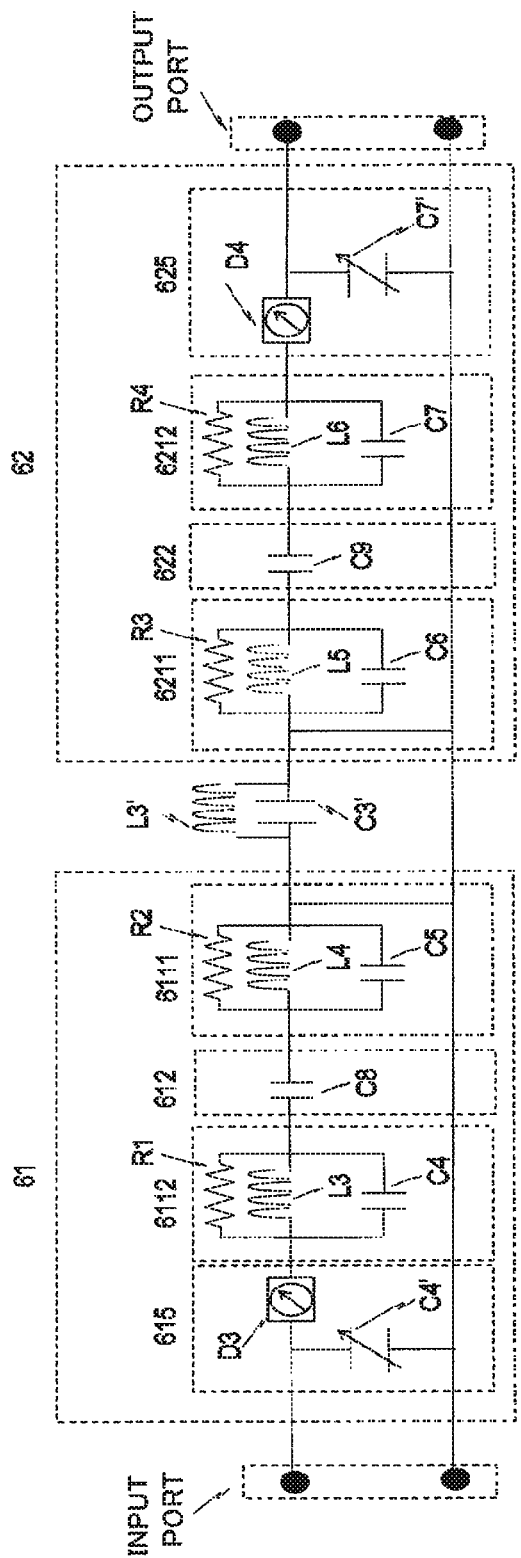
FIG. 35 is an equivalent circuit diagram of a third example of a third exemplary embodiment of the present invention.

FIG. 35 is an equivalent circuit diagram of this example. The structure, the operation, and the effect of the impedance adjustment unit in this example will be described by using this figure.

First, the configuration of this example will be described. In this example, as shown in FIG. 35, the power transmitting unit 61 and the power receiving unit 62 of which the electric power transmission device 6 is composed include a power transmitting side impedance adjustment unit 615 and a power receiving side impedance adjustment unit 625, respectively. The alternating current power supply (not shown) which inputs the alternating current electric power to the power transmitting unit 61, the power transmitting side impedance adjustment unit 615, and the spiral coil 6112 are connected in series in this order. The spiral coil 6212, the power receiving side impedance adjustment unit 625, and a load (not shown) which consumes the received electric power are connected in series in this order.

The power transmitting side impedance adjustment unit 615 is composed of a phase shifter D3 connected to the circuit in series and a variable capacitor C4' connected to the circuit in parallel and the power receiving side impedance adjustment unit 625 is composed of a phase shifter D4 connected to the circuit in series and a variable capacitor C7' connected to the circuit in parallel.

Figure 39A:
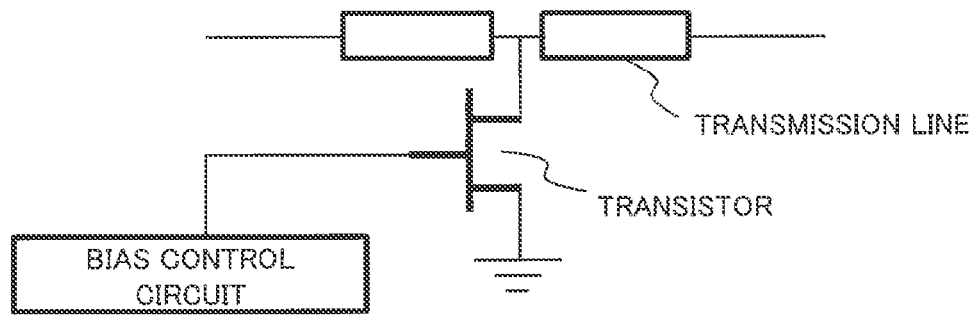
FIG. 39A is a figure schematically showing an example of a configuration of a phase shifter D3 and a phase shifter D4 in a third example of a third exemplary embodiment of the present invention.
Figure 39B:
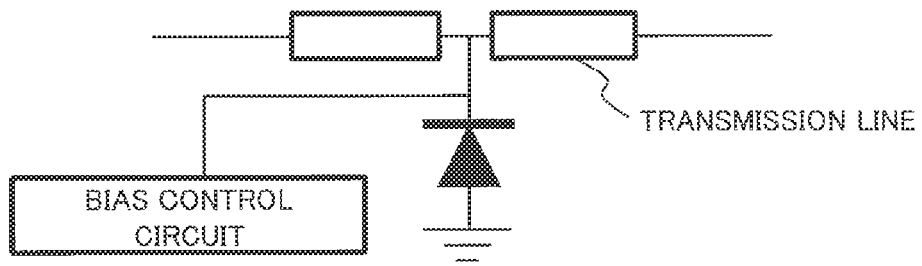
FIG. 39B is a figure schematically showing an example of a configuration of a phase shifter D3 and a phase shifter D4 in a third example of a third exemplary embodiment of the present invention.
Figure 39C:
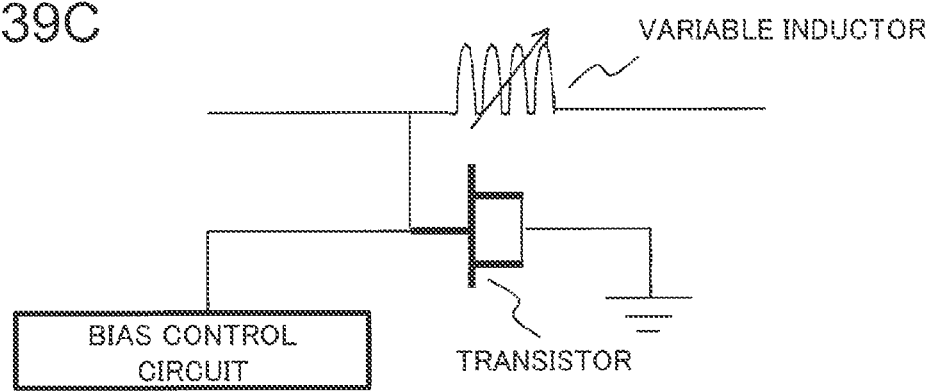
FIG. 39C is a figure schematically showing an example of a configuration of a phase shifter D3 and a phase shifter D4 in a third example of a third exemplary embodiment of the present invention.
Figure 40A:
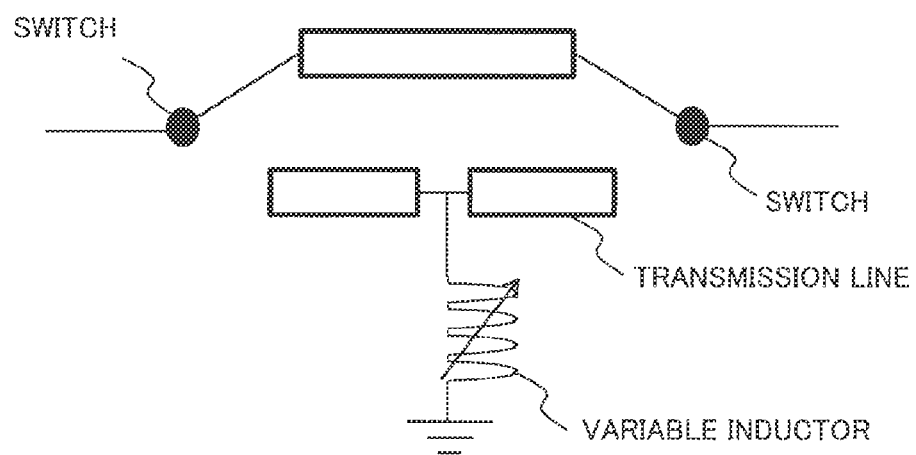
FIG. 40A is a figure schematically showing an example of a configuration of a phase shifter D3 and a phase shifter D4 in a third example of a third exemplary embodiment of the present invention.
Figure 40B:
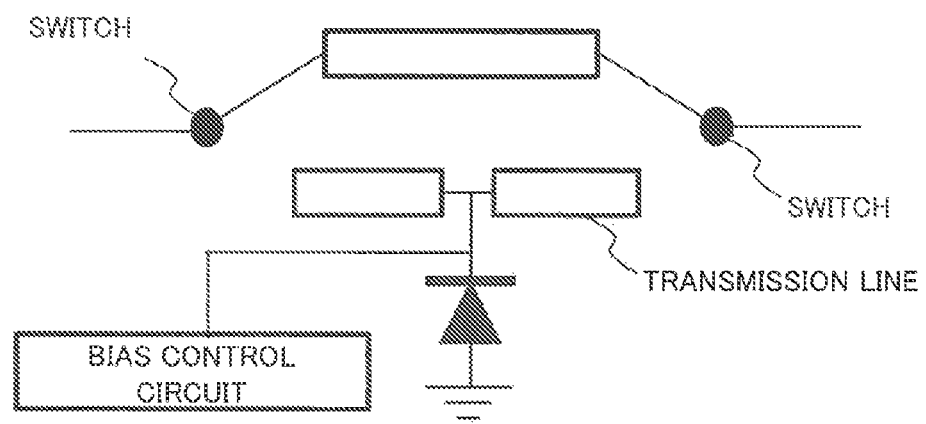
FIG. 40B is a figure schematically showing an example of a configuration of a phase shifter D3 and a phase shifter D4 in a third example of a third exemplary embodiment of the present invention.

For example, as shown in FIGS. 39A to 39C, 40A, and 40B, the phase shifters D3 and D4 can be realized by using a transmission line, a transistor, a diode, a variable capacitor, a variable inductor, or a circuit composed of these parts. A circuit shown in FIG. 39A is composed of two transmission lines connected in series and a transistor connected to a connection point of two transmission lines in parallel. The phase at the operation frequency is rotated according to an electrical length of the transmission line. An input capacity of the transistor changes according to a bias voltage applied to the transistor, reflection occurs according to the input capacity, and whereby, the phase is rotated. The desired phase rotation amount can be realized by selecting the appropriate transmission line length and the bias voltage applied to the transistor. A circuit shown in FIG. 39B is composed of two transmission lines connected in series and a diode connected to a connection point of two transmission lines in parallel. By using this circuit, the phase rotation can be achieved according to the electrical length of the transmission line and the bias voltage applied to the diode like the circuit shown in FIG. 39A. A circuit shown in FIG. 39C is composed of a variable inductor and a transistor that is connected to the variable inductor in parallel and connected to the ground. By using this circuit, the phase rotation can be achieved according to the inductance of the variable inductor and a bias voltage applied to the transistor. Thus, even when the transmission line is not used, the phase rotation can be achieved. Further, a mechanism for mechanically changing the length of the transmission line may be used as shown in FIG. 40A and FIG. 40B. Further, the phase rotation may be achieved by using a plurality of the circuits shown in FIGS. 39A to 39C, FIG. 40A, and FIG. 40B.

Figure 38:
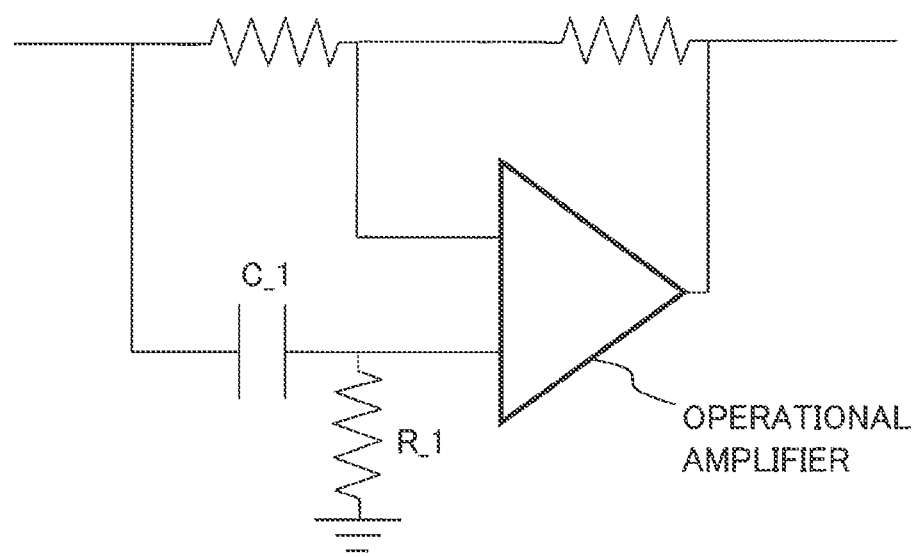
FIG. 38 is a figure schematically showing an example of a configuration of a phase shifter D3 and a phase shifter D4 in a third example of a third exemplary embodiment of the present invention.

By using an operational amplifier as shown in FIG. 38, the size of the phase shifters D3 and D4 which operate in a frequency band lower than the MHz band can be reduced. By using the circuit shown in FIG. 38, the phase can be shifted from 0 to 180 degrees in a frequency range from DC to an arbitrary frequency whose center frequency fc (the phase shift amount is 90 degrees at fc) is determined by the following equation with parameters $C\_1$ and $R\_1$.

$$fc = 1/(2\pi \times C\_1 \times R\_1) \quad \text{(Equation 2)}$$

Namely, by selecting the values of $C\_1$ and $R\_1$, the arbitrary phase rotation amount can be obtained at the arbitrary frequency. This circuit does not use the transmission line, the variable inductor, the variable capacitor, or the like mentioned above whose size increases in a low frequency band. Therefore, the size of this circuit can be made smaller than the size of the circuit using the transmission line.

Further, as shown in FIG. 35, an equivalent circuit of the spiral coils 6111, 6112, 6211, and 6212 is composed of an inductive component, a capacitive component, and the resistive component that are connected in parallel. C8 is the capacitive component formed by the first power transmitting side inclusion unit 612 between the spiral coil 6111 and the spiral coil 6112 and C9 is the capacitive component formed by the first power receiving side inclusion unit 622 between the spiral coil 6211 and the spiral coil 6212. L3' is a mutual inductance component between the power transmission coil 6112 and the power reception coil 6211. C3' is a capacitive component formed by the power transmitting unit 61, the power receiving unit 62, and the seawater 63 that is the conducting medium.

Next, operation of the impedance adjustment unit in this example will be described in turn below. As described above, the spiral coils 6111 and 6112 of which the power transmitting unit 61 is composed and the spiral coils 6211 and 6212 of which the power receiving unit 62 is composed perform the electric power transmission through seawater 63. Next, the phase shifter D3 of which the power transmitting side impedance adjustment unit 615 is composed and the phase shifter D4 of which the power receiving side impedance adjustment unit 625 is composed rotate the phase of the electric power transmitted and received by the electric power transmission device 6. Next, the capacitance of the variable capacitor C4' of which the power transmitting side impedance adjustment unit 615 is composed and the capacitance of the variable capacitor C7' of which the power receiving side impedance adjustment unit 625 is composed are changed. Here, the phase shift amount of the phase shifters D3 and D4 and the capacitance of the variable capacitors C4' and CT are changed so as to compensate a reflection condition of the electric power, that is a resonance frequency condition or an impedance matching condition.

Figure 36:
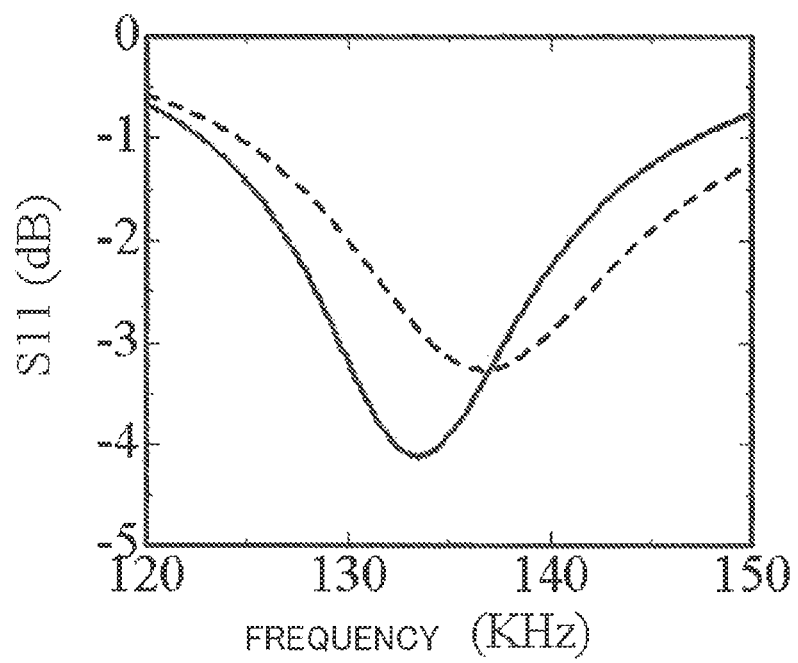
FIG. 36 is a figure showing an effect of an impedance adjustment unit in a third example of a third exemplary embodiment of the present invention.
Figure 37:
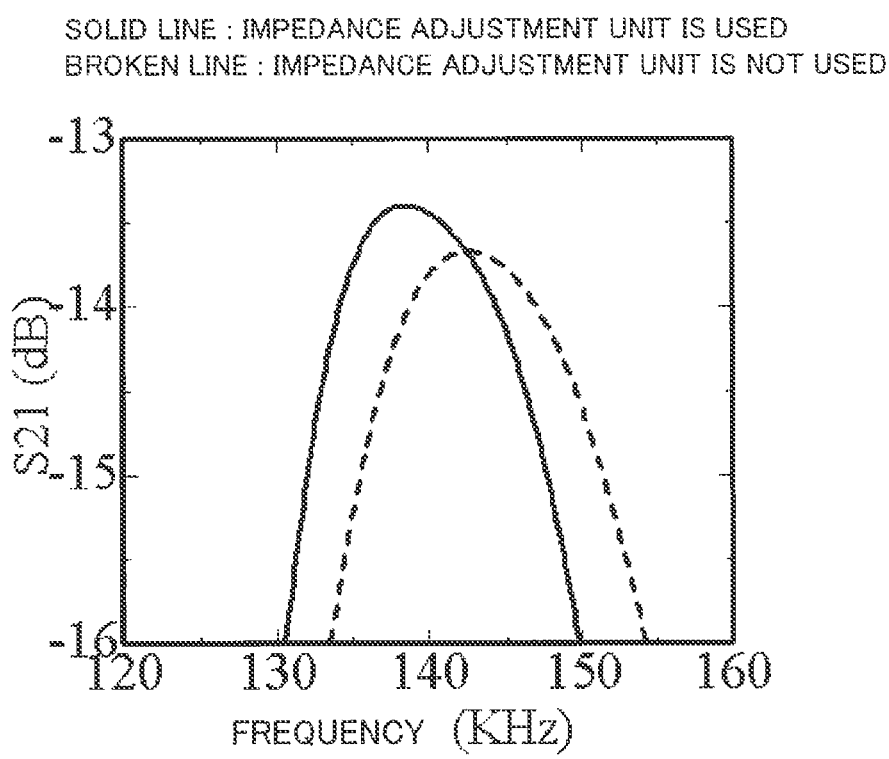
FIG. 37 is a figure showing an effect of an impedance adjustment unit in a third example of a third exemplary embodiment of the present invention.

Next, an effect of this example will be described. FIG. 36 is a figure showing a result obtained by simulating S11 when viewed from an input terminal of the power transmitting unit 61 for two cases: a case in which the impedance adjustment unit is added and a case in which it not added. FIG. 37 is a figure showing a result obtained by simulating the electric power transmission efficiency (S21) for two cases: a case in which the impedance adjustment unit is added and a case in which it not added. In the simulation, it is assumed that the distance between the spiral coils is 20 cm. Further, it is assumed that the phase rotation amount of the phase shifter D3 is 130 degrees and the phase rotation amount of the phase shifter D4 is 130 degrees at an operation frequency of approx. 140 kHz, the capacitance of the variable capacitor C4' is 4 nF and the capacitance of the variable capacitor C7' is 4 nF, and a port impedance (normalized impedance) used for calculating S11 and S21 is 50 Ohm.

As shown in FIG. 36, it is apparent that when the impedance adjustment unit is added, S11 that represents a reflection amount of the electric power is improved. As shown in FIG. 37, it is apparent that when the impedance adjustment unit is added, the electric power transmission efficiency is improved at a frequency near 140 kHz of the operation frequency.

Figure 42:
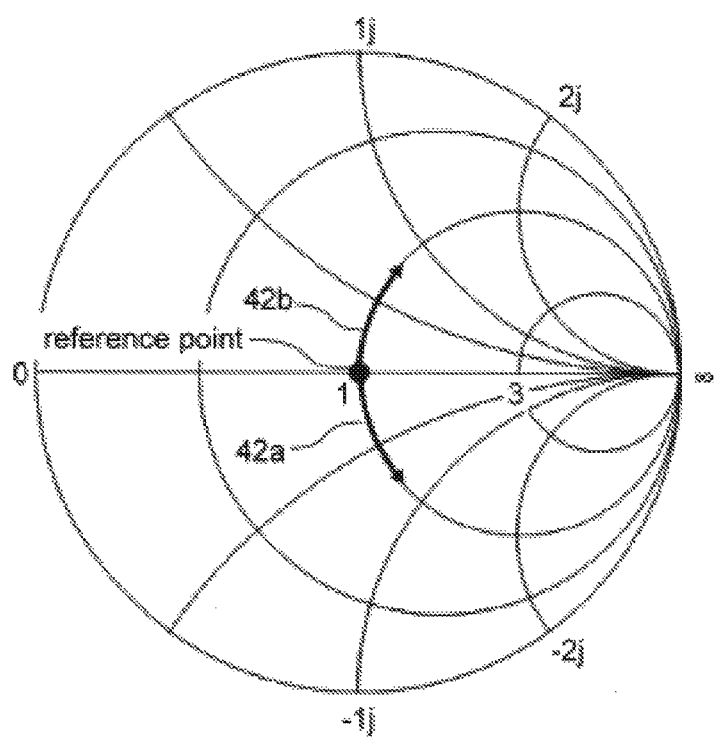
FIG. 42 is a figure for explaining a change of input impedance of an electric power feeder that occurs when a relative position relation between power transceivers is deviated in seawater.

FIG. 42 shows a change in input impedance of the input port due to a change in capacitance of the capacitive component C3' which occurs when the distance between the power transmitting coil and the power receiving coil changes by influence of tidal current and buoyancy in the sea. When the distance between the power transmitting coil and the power receiving coil is small, the input impedance of the input port changes in a negative direction 42a from a reference point (it is indicated by a black circle in FIG. 42) and when the distance between the power transmitting coil and the power receiving coil is large, the input impedance of the input port changes in a positive direction 42b from the reference point.

Figure 43A:
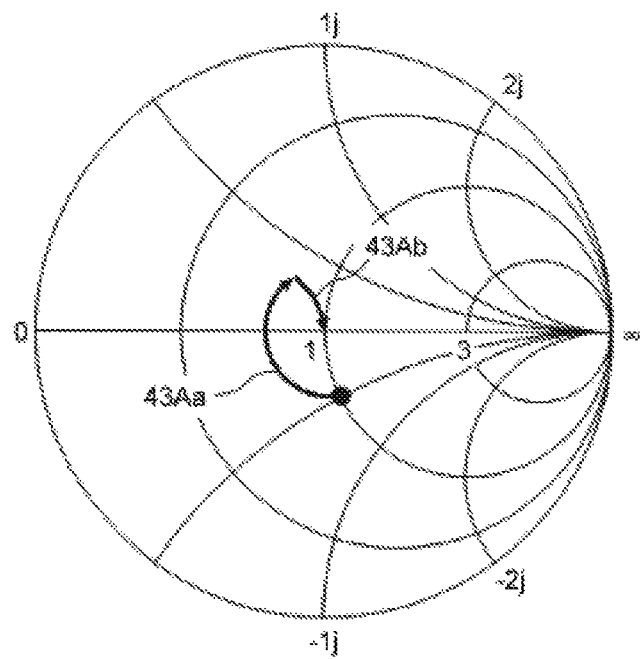
FIG. 43A is a figure for explaining operation of an impedance compensation unit in a third example of a third exemplary embodiment of the present invention.
Figure 43B:
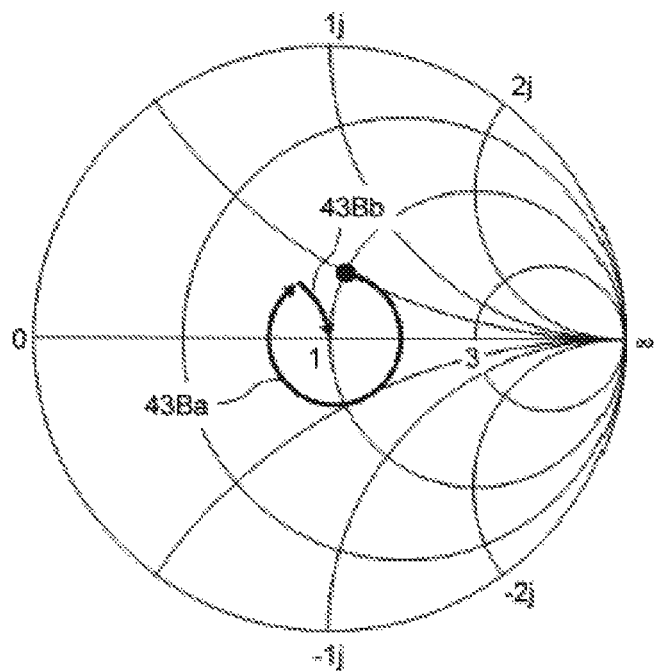
FIG. 43B is a figure for explaining operation of an impedance compensation unit in a third example of a third exemplary embodiment of the present invention.

When this technology is used, as shown in FIGS. 43A and 43B, compensation can be performed when the capacitance of the capacitive component C3' increases or decreases. Namely, in an example shown in the figure, when the impedance of the input port becomes negative, the phase is shifted by approx. 150 degrees by the phase shifter to perform impedance compensation 43Aa, the variable capacitor connected in parallel is adjusted to perform impedance compensation 43Ab, and whereby the impedance matching can be achieved. When the impedance of the input port becomes positive, the phase is shifted by approx. 330 degrees by the phase shifter to perform impedance compensation 43Ba, the variable capacitor connected in parallel is adjusted to perform impedance compensation 43Bb, and whereby the impedance matching can be achieved.

The effect of the impedance compensation performed by this impedance adjustment unit becomes large when the frequency f of the electric power that is wirelessly transmitted and received becomes high. This is because as shown in FIG. 35, the power transmitting unit 61 is coupled to the power receiving unit 62 through the mutual inductance component L3' and the capacitive component C3' and the influence on the frequency f by the capacitive component C3' becomes large when the frequency becomes high. An impedance Z can be determined by the following equation with parameters L3' and C3'.

$$Z = j\omega \times L3'/(-\omega^2 \times L3' \times C3' + 1) \quad \text{(Equation 3)}$$

Because a value of $\omega^2 \times L3' \times C3'$ is smaller than 1 when the frequency f is low, the influence of the capacitive component C3' is small and the value of the impedance Z becomes close to the value of $\omega \times L3'$. On the other hand, when the frequency f is high, the value of $\omega^2 \times L3' \times C3'$ is greater than 1 and has an influence on the value of the impedance Z. Namely, the influence of the capacitive component C3' becomes large. This compensation circuit compensates the change in the capacitive component C3'. Therefore, in particular, when the value of $\omega^2 \times L3' \times C3'$ is greater than 1, the effect becomes large. The verification simulation is performed by the inventors. A result of simulation shows that when the distance d is changed from 10 cm to 5 cm, an amount of improvement of S21 is 1 dB at the operation frequency of 130 KHz but it is 3 dB at the operation frequency of 1 MHz. Namely, the impedance adjustment unit has a large effect.

Figure 41A:
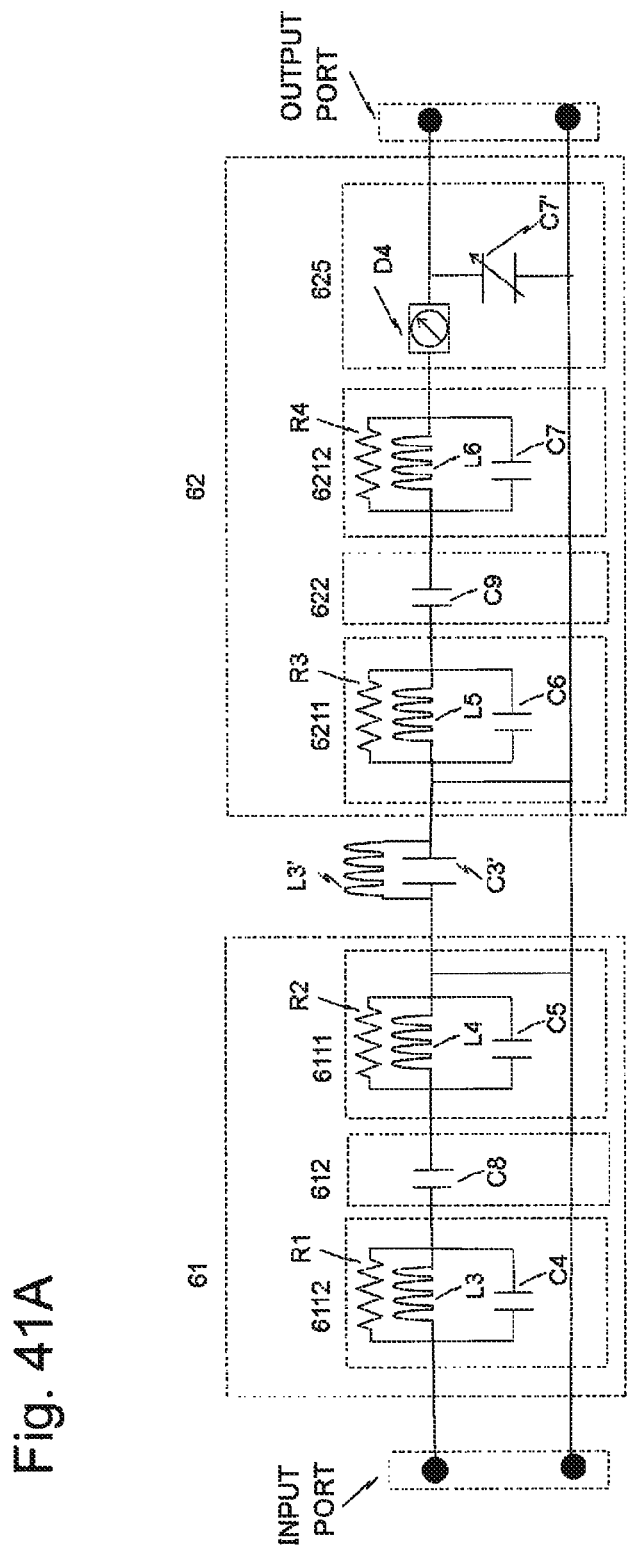
FIG. 41A is an equivalent circuit diagram for explaining a modification example of a third example of a third exemplary embodiment of the present invention.
Figure 41B:
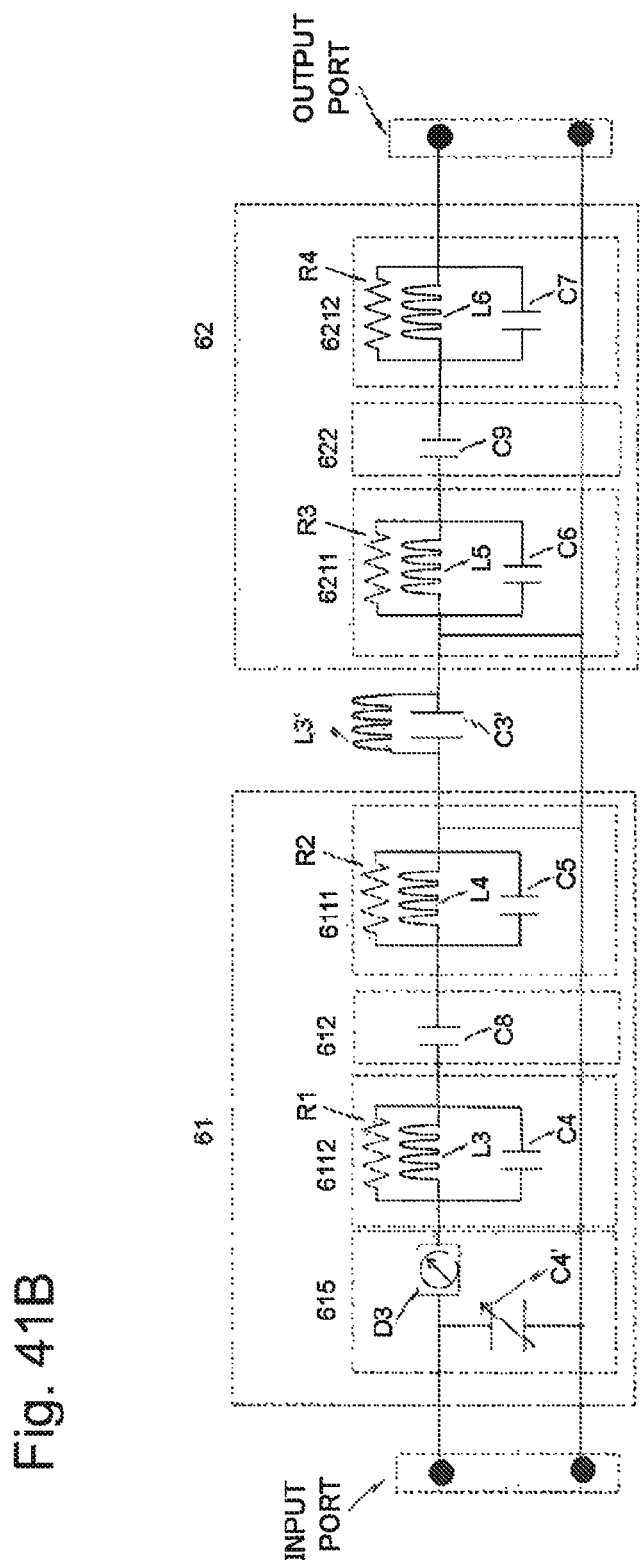
FIG. 41B is an equivalent circuit diagram for explaining a modification example of a third example of a third exemplary embodiment of the present invention.

Further, in this example, each of the power transmitting unit and the power receiving unit includes the impedance adjustment unit. However, as shown in FIG. 41, even when one of the power transmitting unit and the power receiving unit includes the impedance adjustment unit, the effect of the impedance compensation can be obtained similarly.

Namely, as indicated by the simulation in this example, by the operation of the impedance adjustment unit, the impedance matching condition can be improved and the high electric power transmission efficiency can be obtained even in a medium such as seawater or the like that is conductive and high-dielectric.

The invention of the present application is not limited to the above mentioned exemplary embodiment. Various changes in the configuration or details of the invention of the present application that can be understood by those skilled in the art can be made without departing from the scope of the invention of the present application. The present invention of course includes various variations and modifications that could be made by those skilled in the art according to the overall disclosure including the claims and the technical concept.

A part of or all of the above-mentioned exemplary embodiment can be described as the following supplementary note. However, the present invention is not limited to the following supplementary note.

(Supplementary Note)
(Supplementary Note 1)

An electric power transmission device which wirelessly transmits an electric power in a conducting medium characterized in that the electric power transmission device includes a power transmitting unit which wirelessly transmits an electric power and a power receiving unit which receives the electric power transmitted from the power transmitting unit, the power transmitting unit and the power receiving unit include an inclusion unit which includes a coil for electric power transmission and a dielectric material covering the coil for electric power transmission, at least one of the power transmitting unit and the power receiving unit includes an impedance adjustment unit which varies the impedance thereof, and the electric power is transmitted at a resonance frequency determined by an impedance of the power transmitting unit, an impedance of the power receiving unit, and an impedance of the conducting medium.

(Supplementary Note 2)

The electric power transmission device described in supplementary note 1 characterized in that a relation of 30>C3*d/(C1+C2)>0.5 is satisfied wherein C1 is a capacitive component (C1 [pF]) of which the impedance of the power transmitting unit is composed, C2 is a capacitive component (C2 [pF]) of which the impedance of the power receiving unit is composed, C3 is a capacitive component (C3 [pF]) formed by the power transmitting unit, the power receiving unit, and the conducting medium, and d is a distance (d [cm]) between the power transmitting unit and the power receiving unit.

(Supplementary Note 3)

The electric power transmission device described in supplementary note 1 or supplementary note 2 characterized in that a relation of d1/d2>1.2 is satisfied wherein d1 is an outer diameter (d1 [cm]) of the inclusion unit in a direction along a coil surface of the coil for electric power transmission and d2 is an outer diameter (d2 [cm]) of the coil for electric power transmission.

(Supplementary Note 4)

The electric power transmission device described in any one of supplementary notes 1 to 3 characterized in that the inclusion unit includes a first inclusion unit including a first dielectric material covering the coil for electric power transmission and a second inclusion unit including a second dielectric material covering the first inclusion unit.

(Supplementary Note 5)

The electric power transmission device described in supplementary note 4 characterized in that the inclusion unit includes a covering unit including a third dielectric material covering the second inclusion unit.

(Supplementary Note 6)

The electric power transmission device described in supplementary note 4 or supplementary note 5 characterized in that the second dielectric material is made of a dielectric material whose specific gravity is equal to that of the conducting medium.

(Supplementary Note 7)

The electric power transmission device described in any one of supplementary notes 4 to 6 characterized in that dielectric loss tangent of the first dielectric material is lower than or equal to dielectric loss tangent of the second dielectric material.

(Supplementary Note 8)
The electric power transmission device described in any one of supplementary notes 4 to 7 characterized in that relative permittivity of the first dielectric material is lower than or equal to relative permittivity of the second dielectric material.

(Supplementary Note 9)
The electric power transmission device described in any one of supplementary notes 1 to 8 characterized in that the electrical conductivity of the conducting medium is higher than $1 \times 10^{-4}$ and the relative permittivity thereof is higher than 1.

(Supplementary Note 10)
The electric power transmission device described in any one of supplementary notes 1 to 9 characterized in that the phase shifter is composed of an operational amplifier.

(Supplementary Note 11)
The electric power transmission device described in any one of supplementary notes 1 to 10 characterized in that the conducting medium is one of seawater, a river, fresh water, tap water, soil, and concrete.

(Supplementary Note 12)
The electric power transmission device described in any one of supplementary notes 1 to 11 characterized in that a part of or the whole of an electric field generated in the conducting medium rotates in approximately parallel to the coil surface of the coil for electric power transmission of the power transmitting unit or the power receiving unit and a part of or the whole of a magnetic field generated in the conducting medium is approximately parallel to the coil surface of the coil for electric power transmission of the power transmitting unit or the power receiving unit.

(Supplementary Note 13)
The electric power transmission device described in supplementary note 12 characterized in that the magnetic field parallel to the coil surface of the coil for electric power transmission is generated by arranging a direction of a magnetic flux so that the direction of the magnetic flux which penetrates the coil for electric power transmission of the power transmitting unit is opposite to the direction of the magnetic flux which penetrates the coil for electric power transmission of the power receiving unit.

(Supplementary Note 14)
The electric power transmission device described in any one of supplementary notes 1 to 13 characterized in that the power transmitting unit is installed in an electric power supply source provided in seawater, a marine vessel, or a submersible vessel and the power receiving unit is installed in a sensor provided in seawater, a marine vessel, or a submersible vessel.

(Supplementary Note 15)
The electric power transmission device described in any one of supplementary notes 1 to 13 characterized in that the power transmitting unit and the power receiving unit are installed in a connection section of a power supply cable laid on a sea bottom.

(Supplementary Note 16)
The electric power transmission device described in any one of supplementary notes 1 to 15 characterized in that electric power transmission and wireless communication are simultaneously performed by using the power transmitting unit as a transmitter for transmitting information and the power receiving unit as a receiver for receiving information.

(Supplementary Note 17)
An electric power transmission method in which an electric power is wirelessly transmitted in a conducting medium by a power transmitting unit and a power receiving unit, each of which includes a coil for electric power transmission that is covered by a dielectric material, characterized in that the power transmitting unit wirelessly transmits the electric power, the power receiving unit receives the transmitted electric power, at least one of the impedance of the power transmitting unit and the impedance of the power receiving unit is compensated, and the electric power is transmitted at a resonance frequency determined by the impedance of the power transmitting unit, the impedance of the power receiving unit, and the impedance of the conducting medium.

(Supplementary Note 18)
The electric power transmission method described in supplementary note 17 characterized in that a relation of $30 > C3*d/(C1+C2) > 0.5$ is satisfied wherein C1 is a capacitive component (C1 [pF]) of which the impedance of the power transmitting unit is composed, C2 is a capacitive component (C2 [pF]) of which the impedance of the power receiving unit is composed, C3 is a capacitive component (C3 [pF]) formed by the power transmitting unit, the power receiving unit, and the conducting medium, and d is a distance (d [cm]) between the power transmitting unit and the power receiving unit.

This application claims priority from Japanese Patent Application No. 2012-245907, filed on Nov. 8, 2012, the disclosure of which is hereby incorporated by reference in its entirety.

INDUSTRIAL APPLICABILITY

The present invention relates to an electric power transmission device in a conductive medium such as seawater or the like and an electric power transmission method and can be used as means for supplying an electric power to a device for sea resources exploration or a device in an ocean-bottom earthquake sensor network for early detection of earthquake.

REFERENCE SIGNS LIST 1 electric power transmission device
11 power transmitting unit
111 power transmission coil
112 power transmitting side inclusion unit
113 power transmitting side impedance adjustment unit
12 power receiving unit
121 power reception coil
122 power receiving side inclusion unit
123 power receiving side impedance adjustment unit
13 conducting medium
14 electric power supply source
15, 16, 17 submersible vessel
18, 19 power supply cable
2 electric power transmission device
21 power transmitting unit
211 power transmission coil
212 first power transmitting side inclusion unit
213 second power transmitting side inclusion unit
22 power receiving unit
221 power reception coil
222 first power receiving side inclusion unit
223 second power receiving side inclusion unit
23 conducting medium
3 electric power transmission device
31 power transmitting unit
311 power transmission coil
312 first power transmitting side inclusion unit
313 second power transmitting side inclusion unit 314 third power transmitting side inclusion unit
32 power receiving unit
321 power reception coil
322 first power receiving side inclusion unit
323 second power receiving side inclusion unit
324 third power receiving side inclusion unit
33 conducting medium
4 electric power transmission device
41 power transmitting unit
411, 421 helical coil
412, 422 inner dielectric material
413, 423 outer dielectric material
414, 424 covering dielectric material
42 power receiving unit
43 seawater
5 electric power transmission device
51 power transmitting unit
5111, 5211 spiral coil
5112, 5212 loop coil
5113 dielectric substrate
5114 spiral wiring
5115 dielectric substrate
5116 loop wiring
512, 522 inner dielectric material
513, 523 outer dielectric material
514, 524 covering dielectric material
52 power receiving unit
53 seawater
6 electric power transmission device
61 power transmitting unit
6111, 6112, 6211, 6212 spiral coil
612 first power transmitting side inclusion unit
613 second power transmitting side inclusion unit
614 third power transmitting side inclusion unit
615 power transmitting side impedance adjustment unit
62 power receiving unit
622 first power receiving side inclusion unit
623 second power receiving side inclusion unit
624 third power receiving side inclusion unit
625 power receiving side impedance adjustment unit
63 seawater

The invention claimed is:

1. An electric power transmission device which wirelessly transmits an electric power in a conducting medium characterized in that
the electric power transmission device includes a power transmitting unit which wirelessly transmits an electric power and a power receiving unit which receives the electric power transmitted from the power transmitting unit,
the power transmitting unit and the power receiving unit include an inclusion unit which includes a coil for electric power transmission and a dielectric material covering the coil for electric power transmission,
at least one of the power transmitting unit and the power receiving unit includes an impedance adjustment unit which varies the impedance thereof, and
the electric power is transmitted at a resonance frequency determined by an impedance of the power transmitting unit, an impedance of the power receiving unit, and an impedance of the conducting medium,
wherein a relation of $30 > C3*d/(C1+C2) > 0.5$ is satisfied wherein C1 is a capacitive component (C1 [pF]) of which the impedance of the power transmitting unit is composed, C2 is a capacitive component (C2 [pF]) of which the impedance of the power receiving unit is composed, C3 is a capacitive component (C3 [pF]) formed by the power transmitting unit, the power receiving unit, and the conducting medium, and d is a distance (d [cm]) between the power transmitting unit and the power receiving unit.

2. The electric power transmission device described in claim 1 characterized in that a relation of $d1/d2 > 1.2$ is satisfied wherein d1 is an outer diameter (d1 [cm]) of the inclusion unit in a direction along a coil surface of the coil for electric power transmission and d2 is an outer diameter (d2 [cm]) of the coil for electric power transmission.

3. The electric power transmission device described in claim 1 characterized in that the inclusion unit includes a first inclusion unit including a first dielectric material covering the coil for electric power transmission and a second inclusion unit including a second dielectric material covering the first inclusion unit.

4. The electric power transmission device described in claim 3 characterized in that the inclusion unit includes a covering unit including a third dielectric material covering the second inclusion unit.

5. The electric power transmission device described in claim 3 characterized in that the second dielectric material is made of a dielectric material whose specific gravity is equal to that of the conducting medium.

6. The electric power transmission device described in claim 3 characterized in that dielectric loss tangent of the first dielectric material is lower than or equal to dielectric loss tangent of the second dielectric material.

7. The electric power transmission device described in claim 3 characterized in that the relative permittivity of the first dielectric material is lower than or equal to the relative permittivity of the second dielectric material.

8. An electric power transmission method in which an electric power is wirelessly transmitted in a conducting medium by a power transmitting unit and a power receiving unit, each of which includes a coil for electric power transmission that is covered by a dielectric material, characterized in that
the power transmitting unit wirelessly transmits the electric power,
the power receiving unit receives the transmitted electric power,
at least one of the impedance of the power transmitting unit and the impedance of the power receiving unit is compensated, and
the electric power is transmitted at a resonance frequency determined by the impedance of the power transmitting unit, the impedance of the power receiving unit, and the impedance of the conducting medium,
wherein a relation of $30 > C3*d/(C1+C2) > 0.5$ is satisfied wherein C1 is a capacitive component (C1 [pF]) of which the impedance of the power transmitting unit is composed, C2 is a capacitive component (C2 [pF]) of which the impedance of the power receiving unit is composed, C3 is a capacitive component (C3 [pF]) formed by the power transmitting unit, the power receiving unit, and the conducting medium, and d is a distance (d [cm]) between the power transmitting unit and the power receiving unit.

* * * * *